United States Patent
Watanabe et al.

(10) Patent No.: US 10,761,431 B2
(45) Date of Patent: *Sep. 1, 2020

(54) SPATIAL LIGHT MODULATOR, METHOD OF DRIVING SAME, AND EXPOSURE METHOD AND APPARATUS

(71) Applicant: NIKON CORPORATION, Tokyo (JP)

(72) Inventors: Yoji Watanabe, Tokyo (JP); Soichi Owa, Kumagaya (JP); Tomoharu Fujiwara, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/410,693

(22) Filed: May 13, 2019

(65) Prior Publication Data

US 2019/0271917 A1 Sep. 5, 2019

Related U.S. Application Data

(63) Continuation of application No. 16/032,829, filed on Jul. 11, 2018, now Pat. No. 10,338,479, which is a continuation of application No. 13/993,145, filed as application No. PCT/JP2011/071575 on Sep. 22, 2011, now Pat. No. 10,054,858.

(30) Foreign Application Priority Data

Dec. 13, 2010 (JP) ................. 2010-277530

(51) Int. Cl.
   *G03F 7/20* (2006.01)
   *G02B 26/08* (2006.01)
   *G02B 26/06* (2006.01)

(52) U.S. Cl.
   CPC ......... *G03F 7/70425* (2013.01); *G02B 26/06* (2013.01); *G02B 26/0841* (2013.01);
   (Continued)

(58) Field of Classification Search
   None
   See application file for complete search history.

(56) References Cited

U.S. PATENT DOCUMENTS 6,312,134 B1   11/2001   Jain et al.
7,512,926 B2   3/2009    Hu et al.
                         (Continued)

FOREIGN PATENT DOCUMENTS

EP    1 600 817 A1    11/2005
JP    2002-506236     2/2002
                      (Continued)

OTHER PUBLICATIONS

Office Action dated Nov. 18, 2016 in U.S. Appl. No. 13/993,145.
(Continued)

*Primary Examiner* — Michelle M Iacoletti

(57) ABSTRACT

A mirror array device, and related exposure apparatus and manufacturing method, for driving a spatial light modulator that includes: setting, in an array of mirror elements, mirror elements in a first state for turning incident light into reflected light with the same phase as that of the incident light or with a phase different by a first phase from that of the incident light and mirror elements in a second state for turning incident light into reflected light with a phase different approximately 180° from the first phase to an arrangement with a first phase distribution; and setting, in the array of mirror elements, the first mirror elements and the second mirror elements to an arrangement with a second phase distribution which is an inversion of the first phase distribution.

12 Claims, 45 Drawing Sheets

(52) U.S. Cl.
CPC ...... *G03F 7/70116* (2013.01); *G03F 7/70291* (2013.01); *G03F 7/70508* (2013.01)

(56) References Cited

U.S. PATENT DOCUMENTS

| | | | |
|---|---|---|---|
| 10,054,858 B2* | 8/2018 | Watanabe | G03F 7/70291 |
| 2004/0157164 A1 | 8/2004 | Hasegawa et al. | |
| 2005/0237508 A1 | 10/2005 | Eib et al. | |
| 2005/0270515 A1 | 12/2005 | Troost et al. | |
| 2006/0019030 A1 | 1/2006 | Lipson et al. | |
| 2007/0018071 A1 | 1/2007 | Kruijswijk et al. | |
| 2011/0267679 A1* | 11/2011 | Ito | G02B 5/285 |
| | | | 359/291 |

FOREIGN PATENT DOCUMENTS

| | | |
|---|---|---|
| JP | 2007-27758 | 2/2007 |
| JP | 2007-522671 | 8/2007 |
| JP | 2007-329386 | 12/2007 |
| JP | WO2009/060745 | 5/2009 |
| KR | 2001-0052197 | 6/2001 |
| KR | 10-2001-0082652 | 8/2001 |
| WO | WO 99/45439 | 9/1999 |
| WO | WO 2010/006687 A1 | 1/2010 |

OTHER PUBLICATIONS

U.S. Notice of Allowance dated Jun. 21, 2016 in U.S. Appl. No. 13/993,145.
U.S. Notice of Allowance dated Mar. 21, 2017 in U.S. Appl. No. 13/993,145.
Office Action issued by the Korean Patent Office dated Nov. 27, 2017 in corresponding Korean patent application No. 10-2013-7017920.
Japanese Office Action dated Oct. 6, 2015 in Japanese Patent Application No. 2012-548689.
Japanese Office Action dated Jun. 30, 2015 in Japanese Patent Application No. 2012-548689.
Yijian Chen et al., "Design and fabrication of tilting and piston micromirrors for maskless lithography", Proc. of SPIE vol. 5751, 2005, pp. 1023-1037.
Office Action dated Sep. 30, 2015 in U.S. Appl. No. 13/993,145.
Notice of Allowance dated Feb. 22, 2016 in U.S. Appl. No. 13/993,145.
Office Action dated Nov. 11, 2016 in U.S. Appl. No. 13/993,145.
Office Action dated Jul. 28, 2017 in U.S. Appl. No. 13/993,145.
Notice of Allowance dated Apr. 25, 2018 in U.S. Appl. No. 13/993,145.
Corrected Notice of Allowability dated Mar. 20, 2019 in U.S. Appl. No. 16/032,829.
Notice of Allowance dated Feb. 11, 2019 in U.S. Appl. No. 16/032,829.
Korean Office Action dated Dec. 20, 2018 in Korean Patent Application No. 10-2018-7035615.
U.S. Appl. No. 13/993,145 (Now U.S. Pat. No. 10,054,858), filed Aug. 7, 2013, Yoji Watanabe et al., Nikon Corporation.
U.S. Appl. No. 16/032,829, filed Jul. 11, 2018, Yoji Watanabe et al., Nikon Corporation.

* cited by examiner

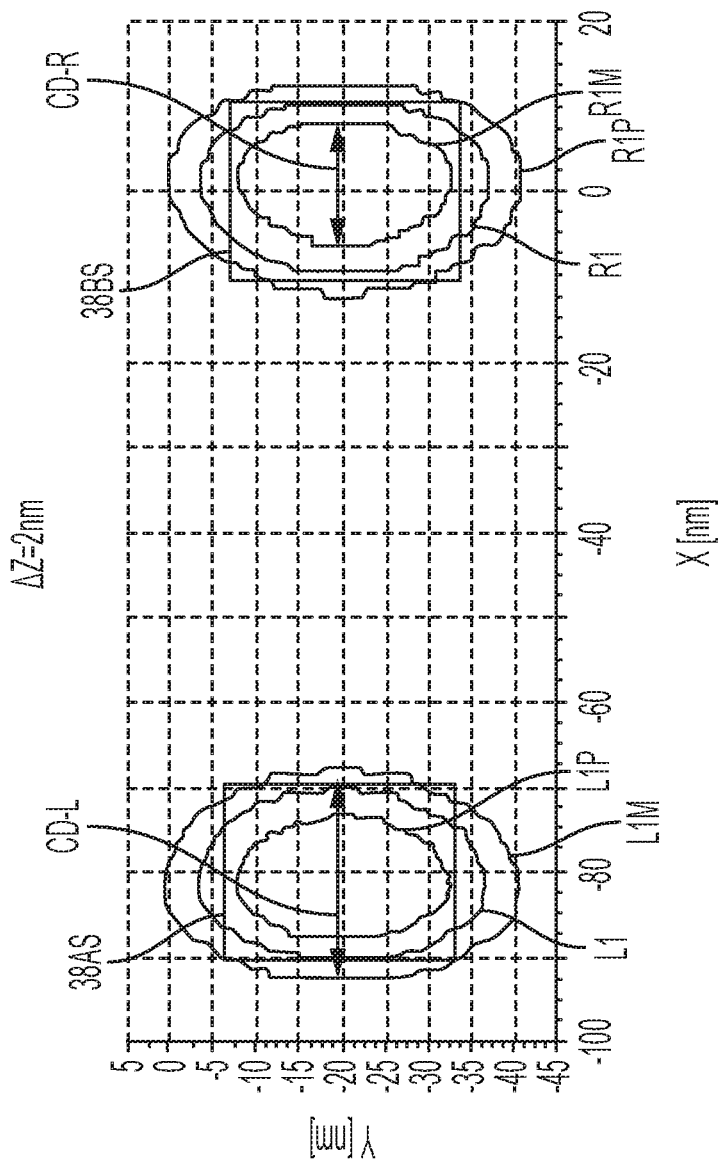

(CD-L)

(CD-R)

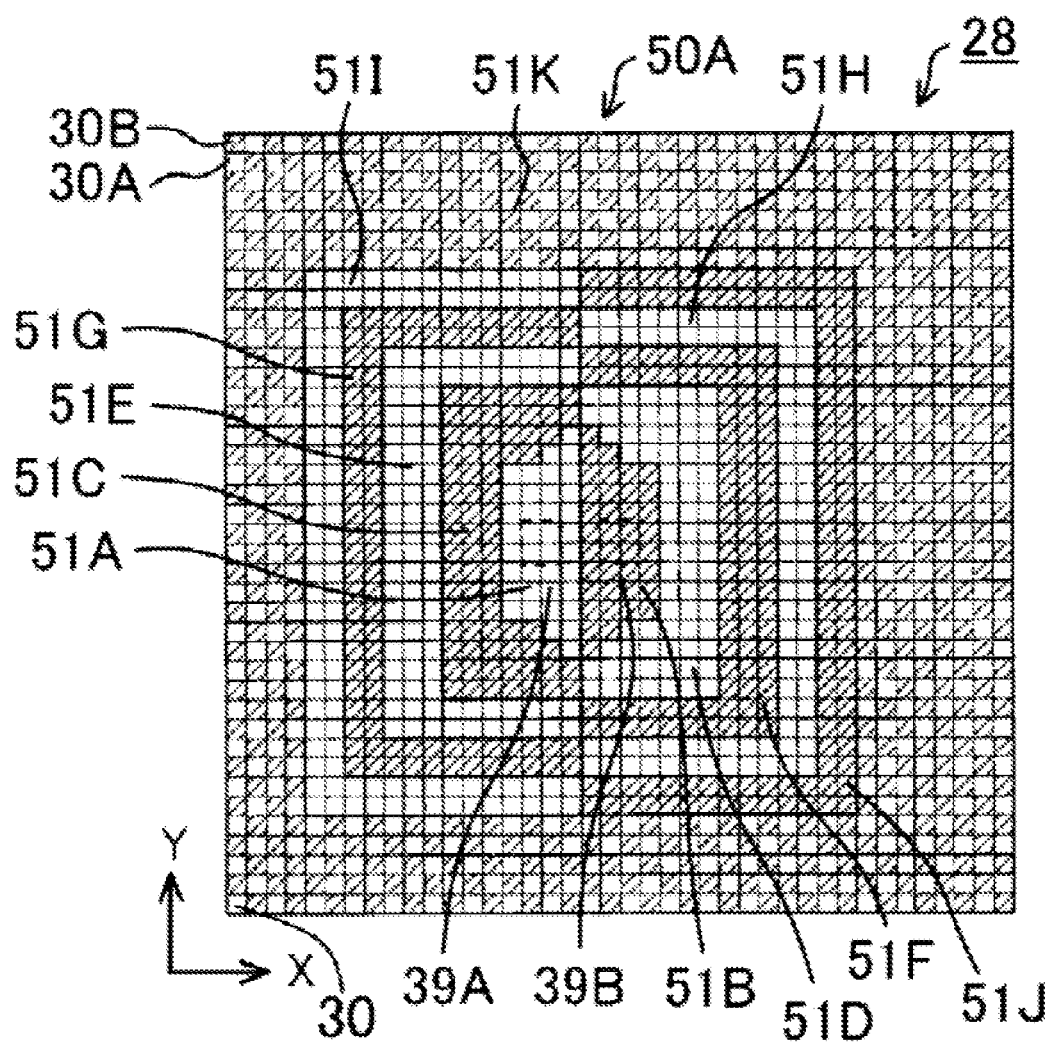

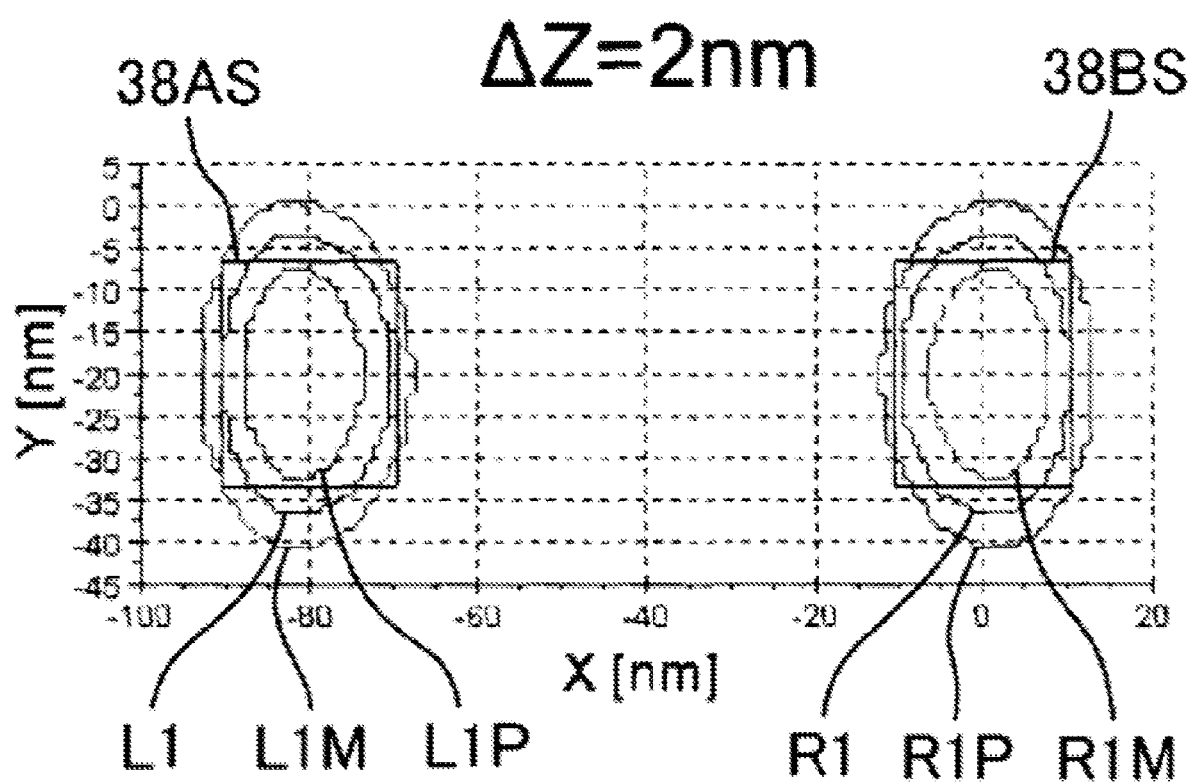

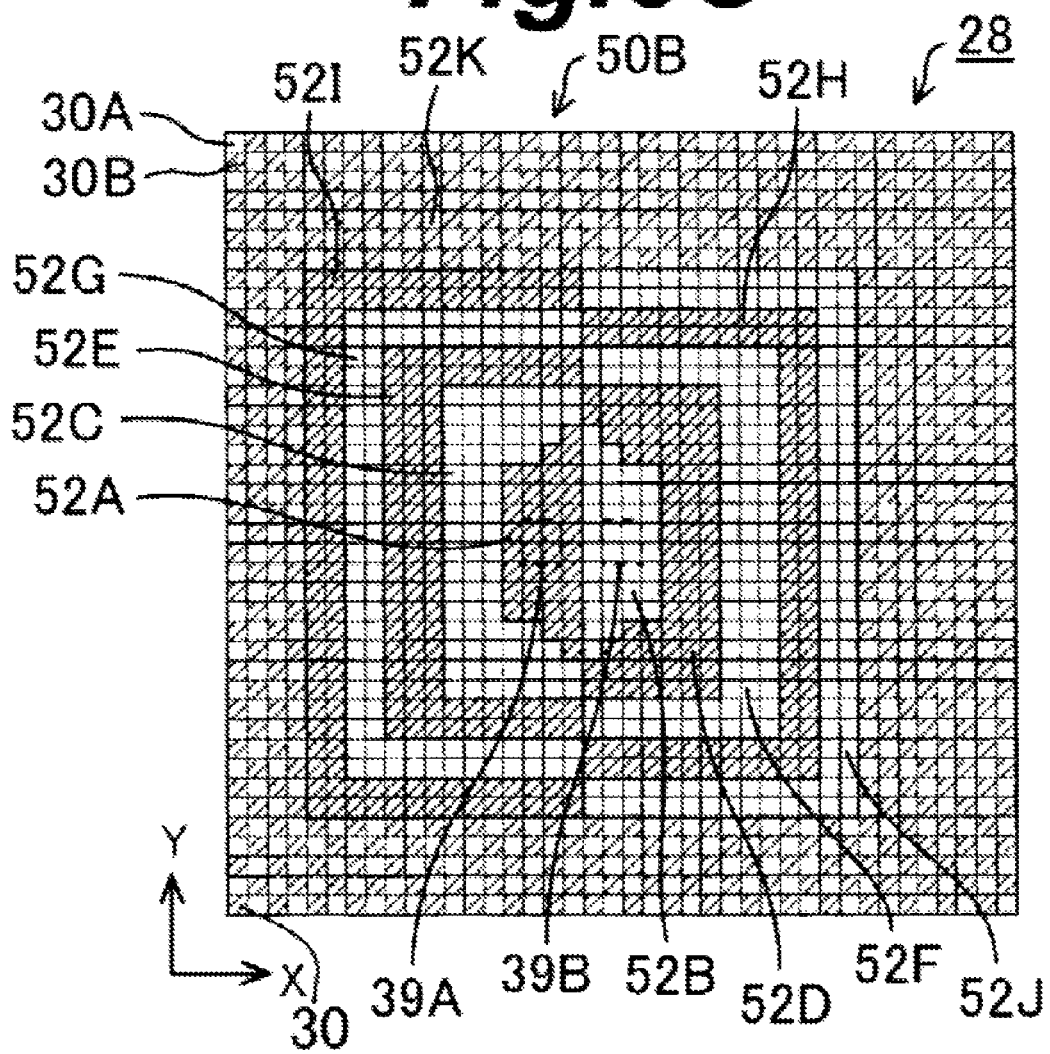

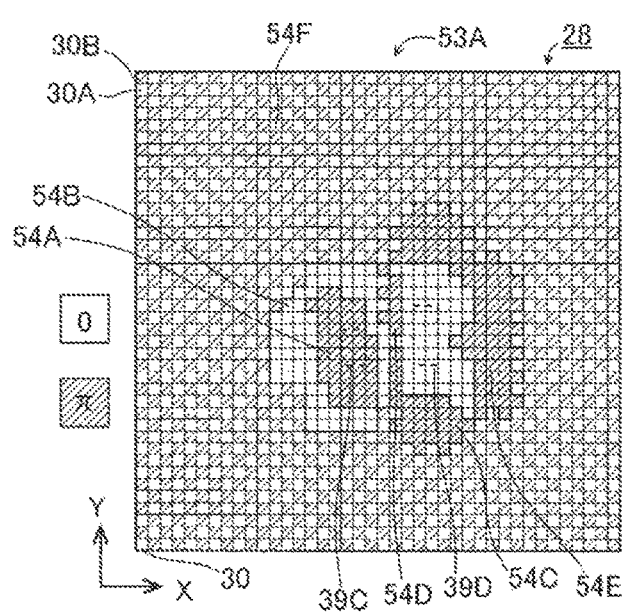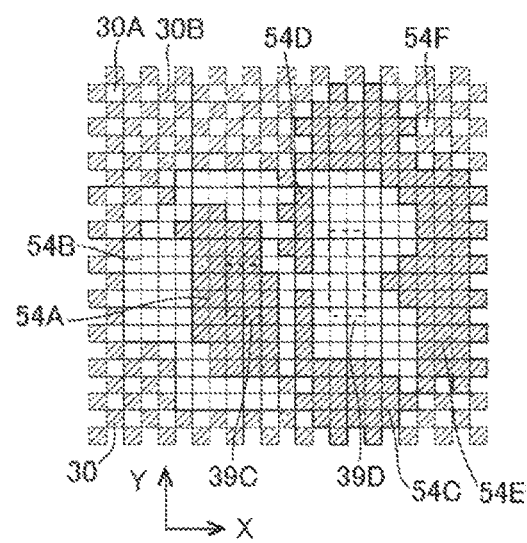

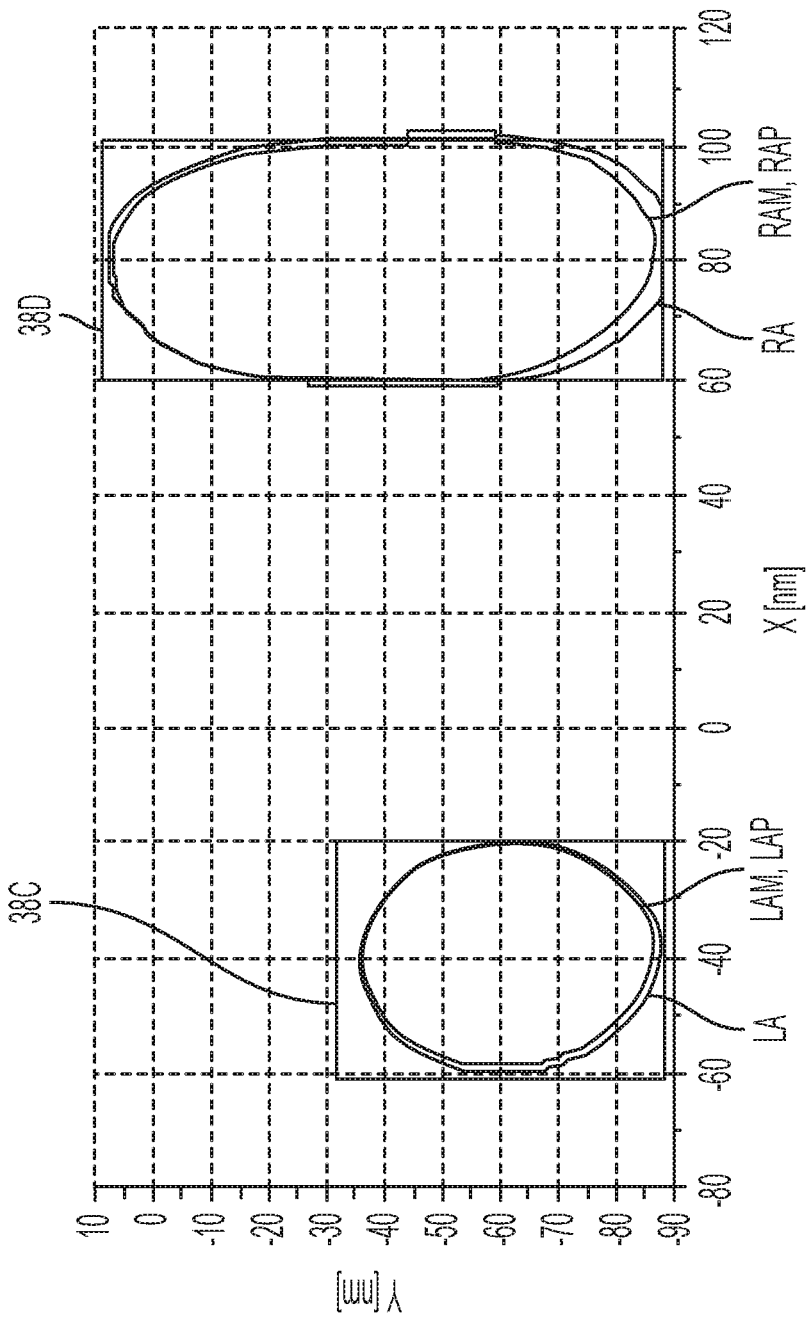

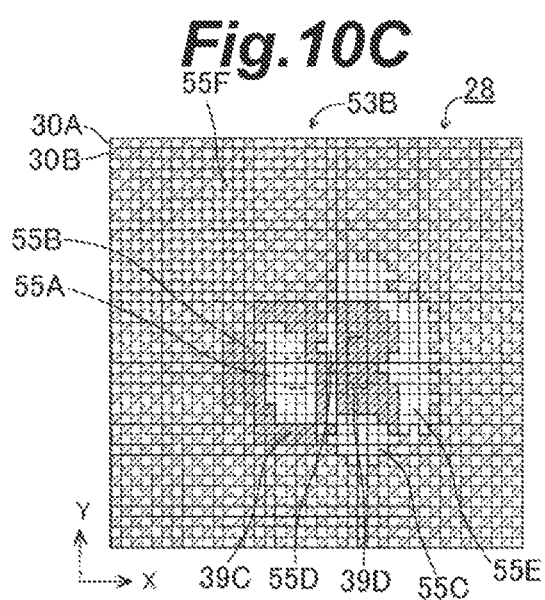

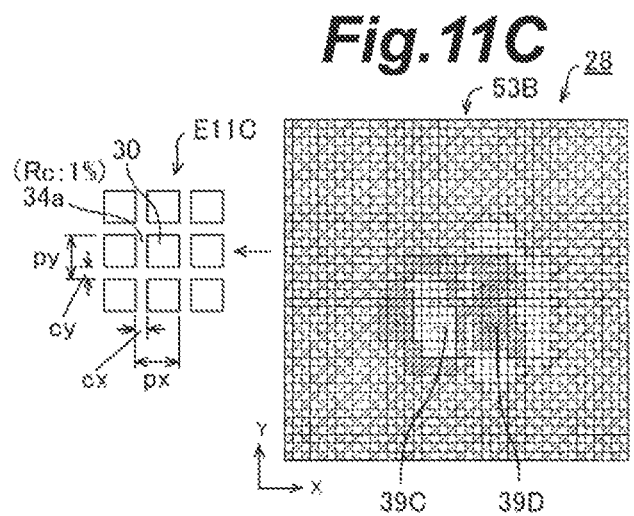
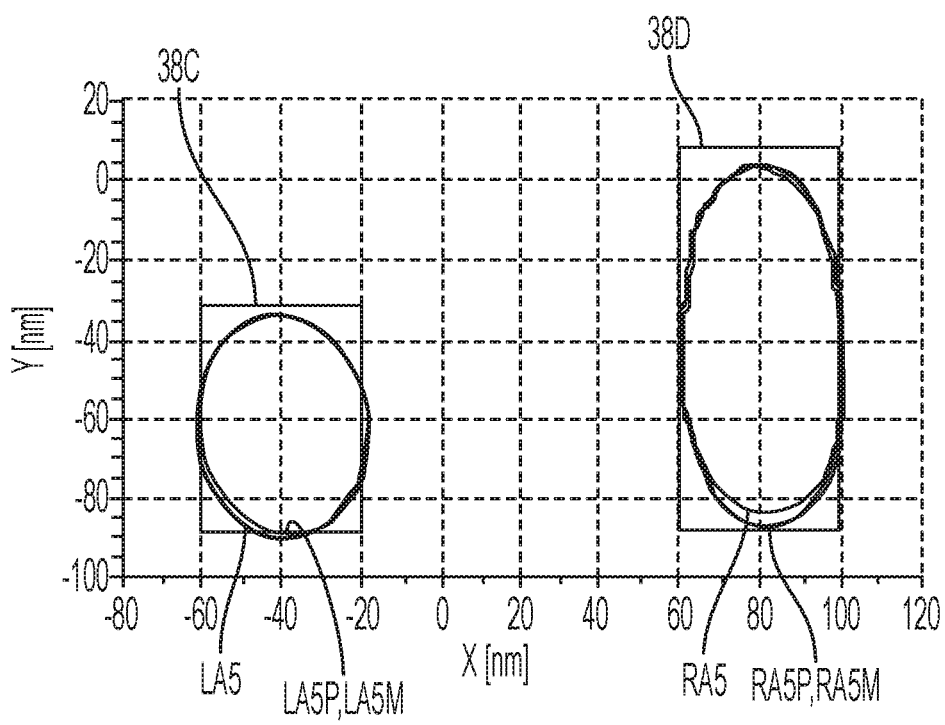

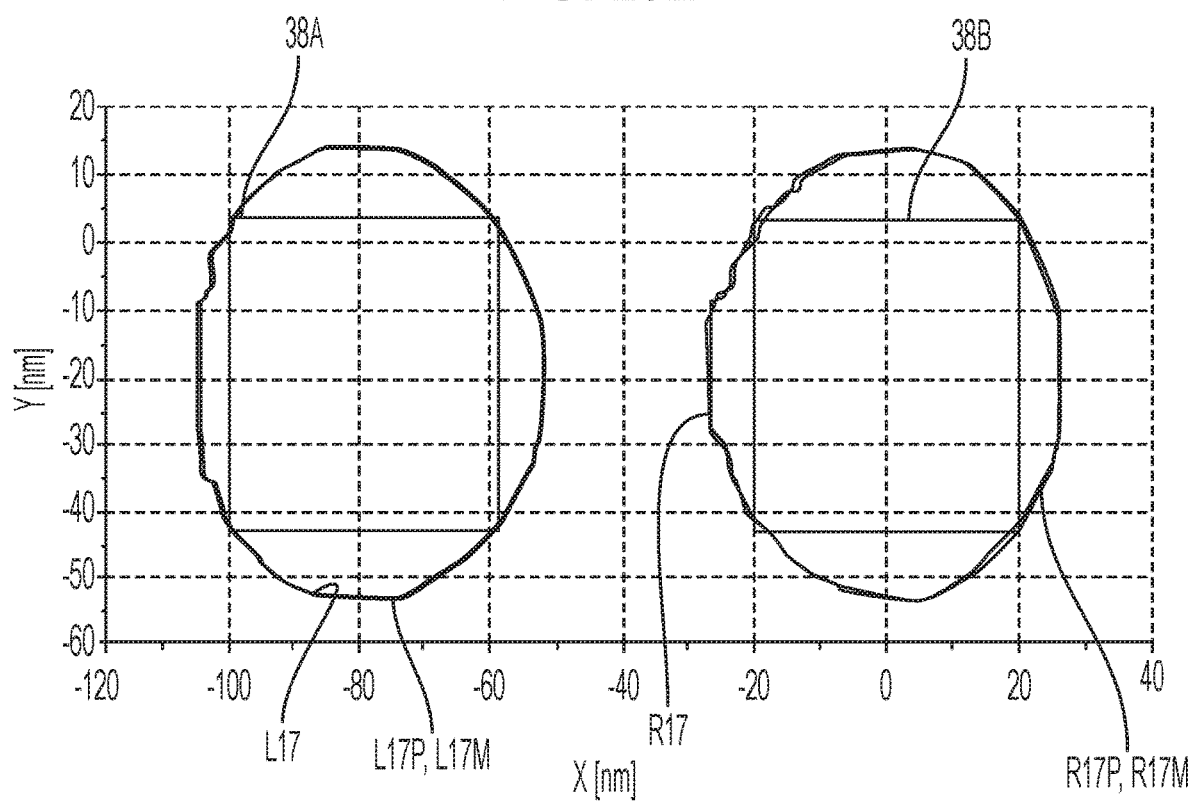

SPATIAL LIGHT MODULATOR, METHOD OF DRIVING SAME, AND EXPOSURE METHOD AND APPARATUS

CROSS-REFERENCE TO RELATED APPLICATIONS

This application is a continuation of U.S. Ser. No. 16/032,829, filed Jul. 11, 2018, which is a continuation of U.S. Ser. No. 13/993,145, filed Aug. 7, 2013, which is a U.S. national stage application of PCT/JP2011/071575 filed Sep. 22, 2011 and claims foreign priority benefit of Japanese Application No. 2010-277530 filed Dec. 13, 2010 in the Japanese Intellectual Property Office, the contents of which are incorporated herein by reference.

TECHNICAL FIELD

The present invention relates to a spatial light modulator having a plurality of optical elements and a method of driving the same, an exposure technology to expose an object with use of the spatial light modulator, and a device manufacturing technology using the exposure technology.

BACKGROUND

The exposure apparatus including those of a one-shot exposure type such as steppers or those of a scanning exposure type such as scanning steppers are used for forming a predetermined pattern in each shot area on a substrate such as a wafer or a glass plate via a projection optical system, for example, in a lithography process for manufacturing devices (electronic devices or microdevices) such as semiconductor devices or liquid crystal display devices.

There are the recently-proposed exposure apparatus of a so-called maskless method to generate a variable pattern on the object plane of the projection optical system, using spatial light modulators (SLM) having an array of many microscopic mirrors an inclination angle of each of which is variable, instead of masks, for efficiently manufacturing each of devices while suppressing an increase of manufacturing cost due to preparation of masks for respective types of devices and masks for respective layers on the substrate (e.g., cf. Patent Literature 1). There are also the proposed spatial light modulators of a type having an array of many micromirrors a height of a reflective surface of each of which is controllable, in order to control a phase distribution of incident light (e.g., cf. Non Patent Literature 1).

CITATION LIST

Patent Literature

Patent Literature 1: International Publication WO2009/060745

Non Patent Literature

Non Patent Literature 1: Yijian Chen et al., "Design and fabrication of tilting and piston micromirrors for maskless lithography," Proc. of SPIE (U.S.A.) Vol. 5751, pp. 1023-1037 (2005)

SUMMARY

In use of the spatial light modulator having the array of many micromirrors, errors of height (phase) set for each micromirror include, for example, a systematic error which is an error with a predetermined tendency common to the many micromirrors, in addition to a random error. Among these errors, influence of the random error is alleviated, for example, by averaging effect. However, since influence of the systematic error is not alleviated by averaging effect, occurrence of the systematic error can cause an intensity distribution of a spatial image finally formed on the surface of the substrate to deviate from a target distribution.

Furthermore, when there is light passing via gap regions between the micromirrors, the light can cause the intensity distribution of the spatial image finally formed on the surface of the substrate to deviate from the target distribution.

In the light of the above-described circumstances, an object of the present invention is to reduce the error from the target distribution of the intensity distribution of the spatial image finally formed on the surface of the substrate, in use of the spatial light modulator having the array of optical elements.

A first aspect of the present invention provides a method of driving a spatial light modulator having an array of optical elements each of which is to be illuminated with light. This driving method comprises: setting, in a first region which is at least a part of the array of optical elements, an arrangement of optical elements in a first state for letting incident light pass as light with the same phase as that of the incident light or with a phase different by a first phase from that of the incident light and optical elements in a second state for letting incident light pass as light with a phase different by a second phase which is different substantially 180° from the first phase, to a first arrangement; and setting, in a second region which is at least a part of the array of optical elements, an arrangement of optical elements in the first state and optical elements in the second state to a second arrangement in which optical elements in the first state or in the second state in the first arrangement are inverted into the second state or into the first state, respectively.

A second aspect of the present invention provides an exposure method of exposing a substrate with exposure light via an array of optical elements in a spatial light modulator and via a projection optical system. This exposure method comprises: setting an arrangement of states of the optical elements by the method of driving the spatial light modulator according to the present invention; and implementing overlay exposure of the substrate with the exposure light from an illumination area including the first region and the second region of the array of optical elements via the projection optical system, in a state in which the optical elements are set in the first arrangement and in a state in which the optical elements are set in the second arrangement.

A third aspect of the present invention provides an exposure method of exposing at least a partial region on a substrate with exposure light via a first spatial light modulator with an array of optical elements and via a projection optical system, and exposing at least the partial region on the substrate with exposure light via a second spatial light modulator with an array of optical elements and the projection optical system. This exposure method comprises: setting, in a first region which is at least a part of the array of optical elements in the first spatial light modulator, an arrangement of optical elements in a first state for letting incident light pass as light with the same phase as that of the incident light or with a phase different by a first phase from that of the incident light and optical elements in a second state for letting incident light pass as light with a phase different by a second phase which is different substantially 180° from the first phase, to a first arrangement; and setting, in a second region which is at least a part of the array of optical elements in the second spatial light modulator and corresponds to the first region, an arrangement of optical elements in the first state for letting incident light pass as light with the same phase as that of the incident light or with a phase different by the first phase from that of the incident light and optical elements in the second state for letting incident light pass as light with a phase different by the second phase which is different substantially 180° from the first phase, to a second arrangement. An arrangement of optical elements in the first state in the first arrangement corresponds to an arrangement of optical elements in the second state in the second arrangement, and an arrangement of optical elements in the second state in the first arrangement corresponds to an arrangement of optical elements in the first state in the second arrangement.

A fourth aspect of the present invention provides a spatial light modulator having an array of optical elements each of which is to be illuminated with light. This spatial light modulator comprises: a plurality of first circuits which output a first signal for setting states of the optical elements to a first state for letting incident light pass as light with the same phase as that of the incident light or with a phase different by a first phase from that of the incident light, or a second signal for setting the states of the optical elements to a second state for letting incident light pass as light with a phase different by a second phase which is different substantially 180° from the first phase; a control circuit which controls output signals from the plurality of first circuits, in order to set, in a first region which is at least a part of the array of optical elements, an arrangement of optical elements in the first state and optical elements in the second state to a first arrangement; and a plurality of second circuits which invert the output signals from the first circuits, in order to set, in a second region which is at least a part of the array of optical elements, an arrangement of optical elements in the first state and optical elements in the second state to a second arrangement in which optical elements in the first state or in the second state in the first arrangement are inverted into the second state or into the first state, respectively.

A fifth aspect of the present invention provides an exposure apparatus for exposing a substrate with exposure light via a projection optical system. This exposure apparatus comprises: an illumination system which emits the exposure light; a spatial light modulator which is arranged on the object plane side of the projection optical system and which has an array of optical elements each of which can be controlled so as to guide the exposure light to the projection optical system; and a control device which controls the illumination system and the spatial light modulator, and the control device operates as follows: the control device sets, in a first region which is at least a part of the array of optical elements, an arrangement of optical elements in a first state for letting incident light pass as light with the same phase as that of the incident light or with a phase different by a first phase from that of the incident light and optical elements in a second state for letting incident light pass as light with a phase different by a second phase which is different substantially 180° from the first phase, to a first arrangement, in accordance with a spatial image formed on the substrate via the projection optical system, to expose the substrate; and the control device sets, in a second region which is at least a part of the array of optical elements, an arrangement of optical elements in the first state and optical elements in the second state to a second arrangement in which optical elements in the first state or in the second state in the first arrangement are inverted into the second state or into the first state, respectively, to implement overlay exposure of the substrate.

A sixth aspect of the present invention provides a device manufacturing method comprising: forming a pattern of a photosensitive layer on the substrate, using the exposure method or the exposure apparatus of the present invention; and processing the substrate with the pattern formed thereon.

The present invention comprises setting the optical elements in the first state and in the second state to the first arrangement in the first region of the array of optical elements and setting the optical elements in the first state and in the second state to the second arrangement which is the inversion of the first arrangement in the second region of the array of optical elements, in the spatial light modulator, and when there is the systematic error in the optical elements in the first arrangement, there is the systematic error with an opposite sign in the optical elements in the second arrangement. For this reason, for example, by overlap illumination of an illumination target surface with light from the optical elements in the first arrangement and with light from the optical elements in the second arrangement, influence of the systematic error is alleviated. Furthermore, when there is light passing via gap regions between the optical elements, influence of the light passing via the gap regions is also alleviated.

BRIEF DESCRIPTION OF DRAWINGS

FIG. 9A is a drawing showing a first phase distribution for forming a second pattern of the spatial light modulator, FIG. 9B an enlarged view of a part of FIG. 9A, and FIG. 9C an enlarged view showing resist patterns of spatial images corresponding to the phase distribution of FIG. 9A.

FIGS. 20B, 20C, 20D, and 20E are enlarged views showing resist patterns after double exposure in cases where the gap phase is 0°, 90°, 180°, and 270°, respectively, with the systematic error ΔZ of 4 nm.

DESCRIPTION OF EMBODIMENTS

An example of embodiments of the present invention will be described below with reference to FIGS. 1 to 18.

Figure 1:
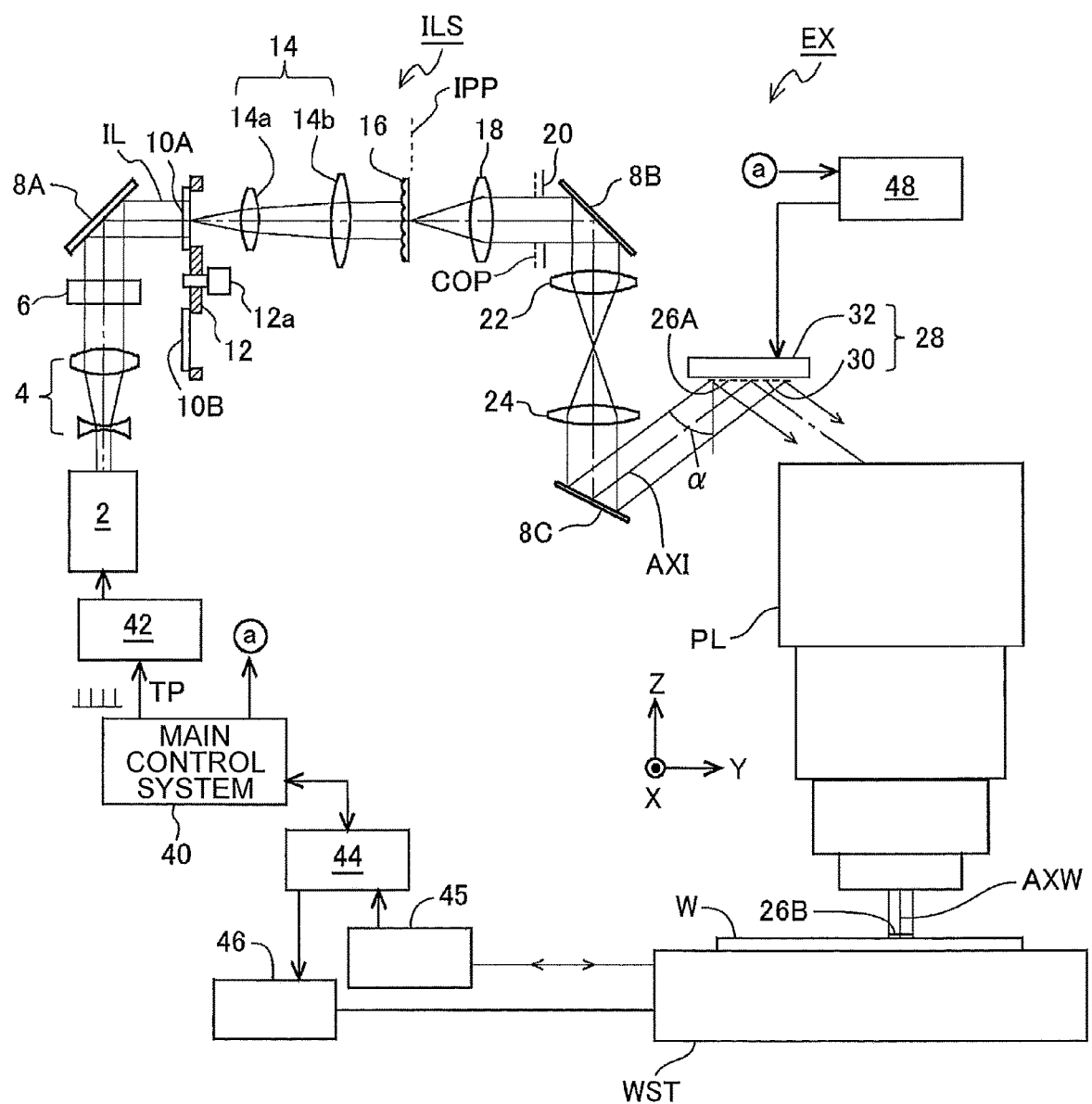
FIG. 1 is a drawing showing a schematic configuration of an exposure apparatus as an example of embodiments.

FIG. 1 shows a schematic configuration of an exposure apparatus EX of the maskless method according to the present embodiment. In FIG. 1, the exposure apparatus EX has a light source 2 for exposure which emits pulses of light, an illumination optical system ILS which illuminates an illumination target surface with illumination light (exposure light) IL for exposure from the light source 2, a spatial light modulator 28 with a large number of mirror elements 30 which are respective height-variable micromirrors arranged in a two-dimensional array pattern approximately on the illumination target surface or on a surface near it, and a modulation control unit 48 which drives the spatial light modulator 28. Furthermore, the exposure apparatus EX has a projection optical system PL which receives the illumination light IL reflected by a reflective, variable, uneven pattern (mask pattern with a variable phase distribution) generated by the large number of mirror elements 30 and which projects a spatial image (device pattern) created corresponding to the uneven pattern (phase distribution), onto a surface of a wafer W (substrate), a wafer stage WST which performs positioning and movement of the wafer W, a main control system 40 consisting of a computer which generally controls the operation of the overall apparatus, various control systems, and so on.

The description hereinafter will be based on such a coordinate system that in FIG. 1, the Z-axis is set along a direction perpendicular to a bottom surface of the wafer stage WST (a plane parallel to an unrepresented guide surface), the Y-axis is set along a direction parallel to the plane of FIG. 1 in a plane normal to the Z-axis, and the X-axis is set along a direction normal to the plane of FIG. 1. Angles around the X-axis, Y-axis, and Z-axis will also be called angles in θx direction, θy direction, and θz direction, respectively. In the present embodiment, the wafer W is scanned in the Y-direction (scanning direction) during exposure.

The light source 2 applicable herein can be a solid-state pulsed laser light source which generates a harmonic of laser light output from a YAG laser or a solid-state laser (semiconductor laser or the like). The solid-state pulsed laser light source can emit pulses of laser light, for example, with the wavelength of 193 nm (or any one of various wavelengths except for it) and with the pulse width of about 1 ns, e.g., a pulsed laser beam of linearly polarized light at the frequency of approximately 1 to 3 MHz. The light source 2 also applicable herein can be, for example, an ArF excimer laser light source which emits pulses of laser light with the wavelength of 193 nm and the pulse width of about 50 ns, at the frequency of approximately 4 to 6 kHz, a KrF excimer laser light source with the wavelength of 248 nm, or a light emitting diode which emits pulsed light.

In the present embodiment, a power supply 42 is connected to the light source 2. The main control system 40 supplies to the power supply 42, emission trigger pulses TP indicative of timing and light quantity (pulse energy) of pulse emission. In synchronism with the emission trigger pulses TP, the power supply 42 makes the light source 2 emit pulses at the indicated timing and light quantity.

The illumination light IL consisting of a substantially parallel beam of pulsed laser light with a rectangular sectional shape emitted from the light source 2 travels via a beam expander 4 consisting of a pair of cylindrical lenses, a polarization control optical system 6 to control a state of polarization of the illumination light IL, and a mirror 8A, to enter a diffractive optical element (diffractive optical element 10A in FIG. 1) selected from a plurality of diffractive optical elements 10A, 10B, and so on, in parallel with the Y-axis. The polarization control optical system 6 is, for example, an optical system that can replaceably set one of a half wave plate to rotate the direction of polarization of the illumination light IL, a quarter wave plate to convert the illumination light IL into circularly polarized light, and a birefringent prism of a wedge shape to convert the illumination light IL into randomly polarized light (unpolarized light).

The diffractive optical elements 10A, 10B, etc. are fixed at approximately equal angle intervals to a peripheral part of a rotary plate 12. The main control system 40 controls the angle of the rotary plate 12 through a drive unit 12a, to set a diffractive optical element selected according to an illumination condition, on the optical path of the illumination light IL. The illumination light IL diffracted by the selected diffractive optical element is guided to an entrance plane of a microlens array 16 by a relay optical system 14 consisting of lenses 14a, 14b. The illumination light IL incident into the microlens array 16 is two-dimensionally divided by a large number of microscopic lens elements forming the microlens array 16, to form a secondary light source (surface light source) on a pupil plane (illumination pupil plane IPP) of the illumination optical system ILS which is a rear focal plane of each lens element.

As an example, the diffractive optical element 10A is provided for normal illumination, the diffractive optical element 10B for small σ illumination to generate illumination light with a small coherence factor (σ value), and other diffractive optical elements (not shown) are also provided for dipolar illumination, for quadrupolar illumination, for annular illumination, and so on. A spatial light modulator having an array of a large number of microscopic mirrors inclination angles of each of which are variable around two axes orthogonal to each other, may be used instead of the plurality of diffractive optical elements 10A, 10B, etc., and a fly's eye lens or the like can also be used instead of the microlens array 16. A zoom lens may also be used in place of the relay optical system 14.

The illumination light IL from the secondary light source formed on the illumination pupil plane IPP travels via a first relay lens 18, a field stop 20, a mirror 8B to bend the optical path into the −Z-direction, a second relay lens 22, a condenser optical system 24, and a mirror 8C, to be incident at an average incidence angle α in the θx direction onto an illumination target surface (a surface in design where a transfer pattern is arranged) parallel to the XY plane. In other words, the optical axis AXI of the illumination optical system ILS intersects at the incidence angle α in the θx direction with the illumination target surface. The incidence angle α is, for example, from several deg (°) to several ten deg. In a power-off condition, reflective surfaces of the large number of mirror elements 30 arranged in the two-dimensional array pattern in the spatial light modulator 28 are arranged on or near the illumination target surface. The illumination optical system ILS is constructed including the optical members from the beam expander 4 to the condenser optical system 24 and the mirror 8C.

The illumination light IL from the illumination optical system ILS illuminates a rectangular illumination area 26A elongated in the X-direction while covering the array of the large number of mirror elements 30 in the spatial light modulator 28, with a substantially uniform illuminance distribution. The large number of mirror elements 30 are arranged at predetermined pitches in the X-direction and in the Y-direction in a rectangular region in the illumination area 26A. The illumination optical system ILS and the spatial light modulator 28 are supported by a frame not shown. The field stop 20 in the illumination optical system ILS is set at a position shifted by a predetermined distance in the optical-axis direction from a plane COP conjugate with the illumination target surface (the object plane of the projection optical system PL). This makes the intensity distribution of the illumination light IL in the illumination area 26A as a trapezoidal distribution in the Y-direction (the direction corresponding to the scanning direction of the wafer W) and the X-direction (non-scanning direction).

Figure 2A:
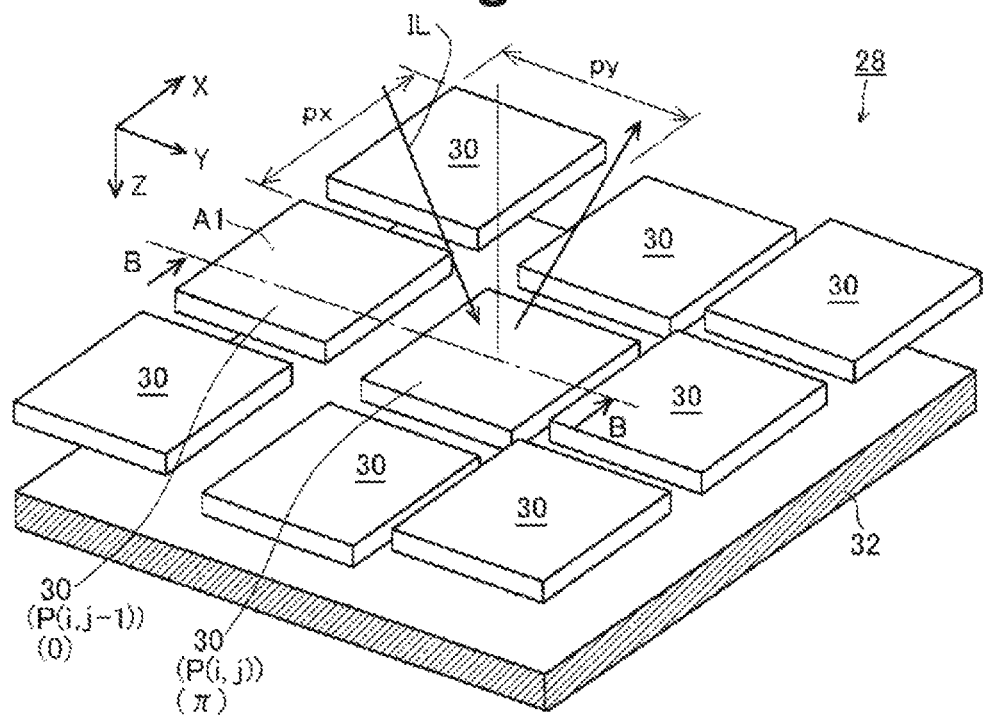
FIG. 2A is an enlarged perspective view showing a part of spatial light modulator 28 in FIG. 1, and FIG. 2B a cross-sectional view along the line BB in FIG. 2A.
Figure 2B:
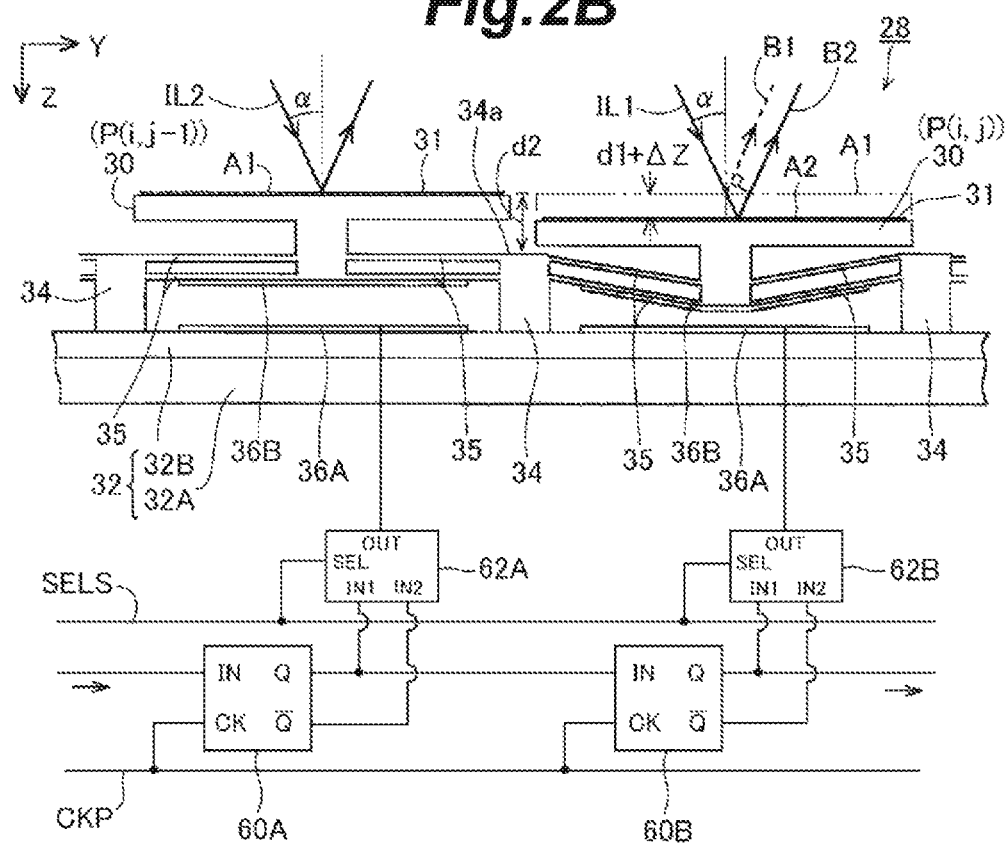

FIG. 2A is an enlarged perspective view showing a part of the array of mirror elements 30 in the spatial light modulator 28 in FIG. 1, and FIG. 2B a cross-sectional view along the line BB in FIG. 2A. In FIG. 2A, the large number of mirror elements 30 are arranged at the pitches (periods) px and py in the X-direction and in the Y-direction, respectively. As an example, the X-directional and Y-directional widths of the mirror elements 30 can be considered to be equal respectively to the pitches px, py. The reflective surfaces of the mirror elements 30 are square and the pitches px, py are equal to each other. It is noted herein that the reflective surfaces of the mirror elements 30 may be rectangular or of other shape and that the pitches px, py may be different from each other.

Each of the mirror elements 30 is located at a position P(i, j) which is the ith position (i=1, 2, ..., I) in the X-direction and the jth position (j=1, 2, ..., J) in the Y-direction. As an example, the number J of mirror elements 30 arranged in the Y-direction (direction corresponding to the scanning direction) is from several hundred to several thousand, and the number I of mirror elements 30 arranged in the X-direction is from several times to several ten times the number J. Furthermore, the pitch px of arrangement of the mirror elements 30 is, for example, approximately from 10 μm to 1 μm.

The spatial light modulator 28 has the large number of mirror elements 30, and a base member 32 which supports each of the mirror elements 30 through hinge portions 35 (cf. FIG. 2B) each with flexibility (elasticity).

In FIG. 2B, the base member 32 is composed of a substrate 32A of a flat plate shape which is, for example, comprised of silicon, and an insulating layer 32B of silicon nitride (e.g., $Si_3N_4$) or the like formed on a surface of the substrate 32A. Support portions 34 are formed at predetermined pitches in the X-direction and in the Y-direction on the surface of the base member 32 and a back-side projection of each mirror element 30 is supported through a pair of two-stage hinge portions 35 with flexibility in the Z-direction by elastic deformation, between adjacent Y-directional support portions 34. The support portions 34, hinge portions 35, and mirror elements 30 are integrally formed, for example, of polysilicon. A reflective film 31 comprised of a thin film of metal (e.g., aluminum or the like) to enhance reflectivity is formed on the reflective surface (front surface) of each mirror element 30.

Furthermore, electrodes 36A are formed on the surface of the base member 32 on the bottom side of mirror elements 30 and electrodes 36B are formed on the bottom faces of the hinge portions 35 so as to be opposed to the electrodes 36A. Signal lines (not shown) for applying a predetermined voltage between corresponding electrodes 36A, 36B for each mirror element 30 are provided in a matrix on the surface of the base member 32 and on the side faces of the support portions 34. The signal lines may be routed through through-holes (not shown) provided in the base member 32. In the present embodiment, in a state without application of the voltage between the electrodes 36A, 36B in a power-off condition or even in a power-on condition (first state), the reflective surface of the mirror element 30 agrees with a reference plane A1 which is a plane parallel to the XY plane, as indicated by the mirror element 30 at the position P(i, j−1) onto which the illumination light IL2 is incident. On the other hand, in a state with application of the predetermined voltage between the electrodes 36A, 36B in the power-on condition (second state), the reflective surface of the mirror element 30 agrees with a plane A2 displaced by a distance d1 in the Z-direction from the reference plane A1 in parallel with the XY plane, as indicated by the mirror element 30 at the position P(i, j) onto which the illumination light IL1 is incident. Each mirror element 30 in the spatial light modulator 28 is set either in the first state or in the second state.

The spatial light modulator 28 of this microscopic three-dimensional structure can be manufactured by use of the MEMS (Microelectromechanical Systems) technology, for example, as described in Non Patent Literature 1 cited in the Background Art. Since each mirror element 30 of the spatial light modulator 28 needs only to be set in the first state or in the second state by parallel displacement, it is easy to achieve downsizing of the mirror elements 30 and increase in the number of arrangement of mirror elements 30.

In FIG. 2B, in the state in which the reflective surface of each mirror element 30 agrees with the reference plane A1 (the first state), let us define a change amount of the phase of the illumination light IL reflected by the mirror element 30, as a first phase δ1; in the present embodiment the phase δ1 is 0°. Namely, in the present embodiment, the phase of the incident light is the same as the phase of the reflected light in the first state. In the state in which the reflective surface of each mirror element 30 agrees with the plane A2 displaced by the distance d1 from the reference plane A1 (the second state), let us define a change amount of the phase of the illumination light IL reflected by the mirror element 30, as a second phase δ2; then the phase δ2 is different by 180° (π (rad)) from the phase δ1. Specifically, the relations below hold.

$$\delta 1 = 0° \tag{1A}$$

$$\delta 2 = 180° = \pi \text{ (rad)} \tag{1B}$$

In the description hereinafter the phases without unit refer to phases in rad. The second phase δ2 is a difference between the change amount of the phase of the wavefront of reflected beam B1 indicated by a dashed line with the reflective surface of the mirror element at the position P(i, j) agreeing with the reference plane A1 and the change amount of the phase of the wavefront of reflected beam B2 with the reflective surface agreeing with the plane A2 at the distance d1. As an example, when it is assumed that the angle of incidence α is approximately 0° and that the wavelength of the illumination light IL1 incident to the reflective surfaces of the mirror elements 30 is λ (λ=193 nm herein), the distance d1 is given as follows.

$$d1 = \lambda/4 \tag{2A}$$

The distance between the reflective surface of the mirror element 30 in the second state and the reference plane A1 includes, in addition to the designed distance d1, a manufacturing error and/or a random error due to a driving error or the like and/or a systematic error ΔZ (an error with a predetermined tendency occurring in common to almost all the mirror elements 30) in fact.

When the angle of incidence α of the illumination light IL1 is approximately 0, an error Δϕ of the phase of reflected light B2 corresponding to the systematic error ΔZ of the height of the reflective surface is given as follows, using the wavelength λ of the illumination light IL1.

$$\Delta\phi = (4\pi/\lambda)\Delta Z \tag{2B}$$

For this reason, the change amount (the second phase δ2) of the phase of the illumination light IL reflected by a certain mirror element 30 in the second state is approximately 180°. A change amount of the phase δ2 due to the random error and the systematic error is about ±10° as an example. Influence of the random error is alleviated, for example, by exposing each point on the wafer W with multiple pulses.

Portions that reflect the illumination light IL in the surfaces of the support portions 34 between the mirror elements 30 will be referred to as gap regions 34a. The phase of reflected light on the gap regions 34a is changed by a Z-directional distance d2 between the surfaces of the gap regions 34a and the reference reflective surface A1. As an example, no consideration is given for the reflected light on the gap regions 34a, but influence thereof in the case of the width of the gap regions 34a being relatively wide will be described later.

In the description below, the mirror element 30 set in the first state to reflect the incident illumination light with the phase change of 0° will also be called a mirror element of phase 0 and the mirror element 30 set in the second state to reflect the incident illumination light with the phase change of 180° as a design value will also be called a mirror element of phase π. The modulation control unit 48 in FIG. 1 controls the voltage between the electrodes 36A, 36B of the mirror element 30 at each position P(i, j), according to information of a phase distribution (an uneven pattern of the array of mirror elements 30) of the illumination light IL set from the main control system 40, to set the mirror element 30 in the first state (phase 0) or in the second state (phase π).

FIG. 2B shows flip-flops 60A, 60B connected to each other and selection circuits 62A, 62B for selecting a first output of the flip-flop 60A, 60B or a second output as an inversion of the first output, which are a part of the modulation control unit 48 in FIG. 1. When the first output of the flip-flop 60A or the like is at low level (or at high level), the second output is at high level (or at low level). Outputs of the selection circuits 62A, 62B are connected to the respective electrodes 36A for driving two mirror elements arranged next to each other in the Y-direction, and the electrodes 36B opposed to them are connected, for example, to a ground line (not shown). As an example, when the output of the selection circuit 62A or the like is at low level (or at high level), the corresponding mirror element 30 is set in the first state (or in the second state).

The first output of the preceding-stage flip-flop (not shown) is supplied to an input part of the flip-flop 60A, the first output of the flip-flop 60B is supplied to the input part of the subsequent-stage flip-flop (not shown), and a control unit (not shown) outputs clock pulses CKP and selection signals SELS. The flip-flops 60A, 60B, etc. shift their outputs in synchronism with the clock pulses CKP. A group of flip-flops connected in this manner is called a shift register. The selection circuit 62A and other selection circuits are connected respectively to all the flip-flop 60A and other flip-flops. As an example, each of the selection circuit 62A and others selects and outputs the first output of the corresponding flip-fop 60A or other flip-flop with the selection signal SELS being in a high-level duration, and selects and outputs the second output of the corresponding flip-flop 60A with the selection signal SELS being in a low-level duration. Each of the flip-flop 60A and others has outputs of multiple bits in practice. The flip-flops 60A, 60B and selection circuits 62A, 62B and others may be formed in a region near the region of the array of mirror elements 30, for example, on the back surface of the substrate 32A or on the front surface of the base member 32. An overall configuration example of the modulation control unit 48 will be described later.

The flip-flops 60A, 60B, etc. in FIG. 2B are circuits for moving the phase distribution of the mirror elements 30 in the +Y-direction and there are also a group of flip-flops (not shown) provided for moving the phase distribution in the −Y-direction. Each of the selection circuits 62A, 62B, etc. selects one output of the two set of flip-flops in accordance with the scanning direction of the wafer W.

In FIG. 1, the illumination light IL, after reflected by the array of many mirror elements 30 in the illumination area 26A of the spatial light modulator 28, is incident at the average incidence angle α into the projection optical system PL. The projection optical system PL with the optical axis AXW supported by an unrepresented column is a reduction projection optical system which is non-telecentric on the spatial light modulator 28 (object plane) side and telecentric on the wafer W (image plane) side. The projection optical system PL forms a demagnified image of a spatial image according to a phase distribution of the illumination light IL set by the spatial light modulator 28, on an exposure region 26B (which is a region optically conjugate with the illumination area 26A) in one shot area on the wafer W.

Figure 3A:
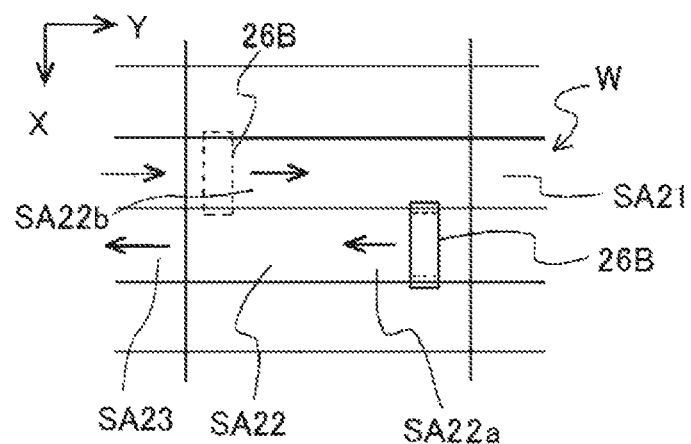
FIG. 3A is a drawing showing shot areas on a wafer during scanning exposure, FIG. 3B a drawing showing a shot area on the wafer during exposure in the step-and-repeat method, and FIG. 3C a drawing showing a light intensity distribution of an exposure region.
Figure 3C:
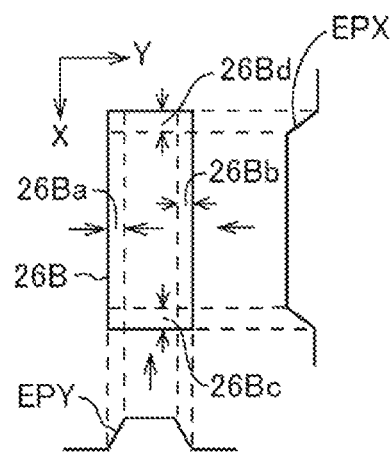

Since the light intensity distribution in the illumination area 26A is of the trapezoidal shape in the Y-direction and the X-direction as described above, a light intensity distribution in the exposure region 26B is also of a trapezoidal shape in the Y-direction (the scanning direction of the wafer W) and the X-direction, as shown in the enlarged view of FIG. 3C. In FIG. 3C, intensity profiles EPY and EPX indicate intensity profiles of the illumination light IL on straight lines passing the center of the exposure region 26B in parallel with the Y-axis and the X-axis, respectively. As seen from the intensity profiles EPY, EPX, the intensity decreases approximately linearly outward in slant portions 26Ba, 26Bb of a predetermined width at the Y-directional ends of the exposure region 26B and the intensity also decreases approximately linearly outward in joint portions 26Bc, 26Bd of a predetermined width at the X-directional ends of the exposure region 26B. The slant portions 26Ba, 26Bb are provided for alleviating influence of unintended phase imaging which can occur at the edges of the spatial light modulator 28. The joint portions 26Bc, 26Bd are provided for alleviating the influence of unintended phase imaging occurring at the edges of the spatial light modulator 28 and for alleviating joint errors to adjacent partial regions.

A projection magnification β of the projection optical system PL is, for example, approximately from 1/10 to 1/100. The resolution of the projection optical system PL is, for example, approximately from one to several times a width (β·px) of an image of the mirror element 30 in the spatial light modulator 28. For example, if the size of the mirror element 30 (the pitch of arrangement) is about several μm and the projection magnification β of the projection optical system PL is approximately 1/100, the resolution Re is approximately from several ten nm to several times it. The wafer W (substrate) includes, for example, one obtained by coating a surface of a base member of a circular flat shape of silicon or SOI (silicon on insulator) with a photoresist (photosensitive material) in the thickness of approximately several ten nm to 200 nm.

With the use of the projection optical system PL non-telecentric on the object side as in the present embodiment, the reflective surfaces of the large number of mirror elements 30 in the spatial light modulator 28 and the exposure surface of the wafer W (the surface of the photoresist) can be arranged approximately in parallel with each other. Therefore, it is easy to design and manufacture the exposure apparatus. When the exposure apparatus EX is the immersion lithography type, it is provided with a local liquid immersion device to supply and collect a liquid (e.g., pure water) which transmits the illumination light IL, between an optical member at the tip of the projection optical system PL and the wafer W, for example, as disclosed in U.S. Pat. Published Application No. 2007/242247. The resolution can be further increased in the case of the immersion lithography type because the numerical aperture NA can be made larger than 1.

In FIG. 1, the wafer W is sucked and held on the top surface of the wafer stage WST through a wafer holder (not shown) and the wafer stage WST is configured to implement step movement in the X-direction and the Y-direction on an unillustrated guide surface and movement at a constant speed in the Y-direction. X-directional and Y-directional positions, an angle of rotation in the θz direction, etc. of the wafer stage WST are measured by a laser interferometer 45 and this measurement information is supplied to a stage control system 44. The stage control system 44 controls the position and speed of the wafer stage WST through a driving system 46 such as a linear motor, based on the control information from the main control system 40 and the measurement information from the laser interferometer 45. The apparatus is also provided with an alignment system (not shown) to detect positions of alignment marks on the wafer W, for carrying out alignment of the wafer W.

For carrying out exposure of the wafer W, the alignment of the wafer W is first carried out as a basic operation and thereafter an illumination condition of the illumination optical system ILS is set. The main control system 40 supplies information of a phase distribution (uneven pattern) corresponding to a pattern to be formed in a plurality of partial regions in each shot area on the wafer W, to the modulation control unit 48. Then the wafer W is positioned at a scan start position, for example, for carrying out exposure in shot areas SA21, SA22, . . . aligned on a line in the Y-direction on the surface of the wafer W shown in FIG. 3A. Thereafter, scan is started at a constant speed in the +Y-direction on the wafer W. Arrows in the shot areas SA22 and others in FIG. 3A indicate directions of movement of the exposure region 26B relative to the wafer W.

During the exposure, the main control system 40 supplies to the power supply 42, the emission trigger pulses TP, for example, according to a relative position of a first partial area SA22a of the shot area SA22 on the wafer W relative to the exposure region 26B, to cause the illumination light to be emitted as pulsed light. Furthermore, the main control system 40 supplies the control signal at a frequency of several times to several ten times that of the emission trigger pulses TP to the modulation control unit 48. In synchronism with the control signal, the modulation control unit 48 controls the phase distribution (uneven pattern) of the array of optical elements in the spatial light modulator 28 so as to gradually move the phase distribution of a transfer object in the Y-direction. Through this process, the partial region SA22a is subjected to scanning exposure with the exposure region 26B where the internal spatial image moves gradually.

Thereafter, for exposure of the first partial region of the shot area SA23 adjacent to the shot area SA22 on the wafer W, while the wafer W is kept scanned in the same direction, the modulation control unit 48 moves the phase distribution of the array of optical elements in the spatial light modulator 28 in the Y-direction in synchronism with the pulse emission of the illumination light IL as in case of the exposure of the shot area SA22. In this manner, the exposure can be continuously carried out from the shot area SA21 to the first partial region of SA22. Thereafter, the wafer stage WST is actuated to implement step movement of the wafer W in the X-direction (non-scanning direction). Then, the scanning direction of the wafer W relative to the exposure region 26B indicated by a dotted line is set to the opposite −Y-direction, and the modulation control unit 48 moves the phase distribution (uneven pattern) of the array of optical elements in the spatial light modulator 28 in the opposite direction to that during the exposure of the first region SA22a and others of the shot area SA22 and others in synchronism with the pulse emission of the illumination light IL. By this operation, the exposure can be continuously carried out from the shot area SA23 to the second partial region SA22b and others of SA21. On this occasion, double exposure is implemented in the joint portions 26Bd and 26Bc of the exposure region 26B in FIG. 3C at the boundary portions of the first partial region SA22a and the second partial region SA22b, in order to reduce the joint error.

In this manner, a predetermined spatial image can be efficiently transferred by exposure in each of the shot area SA21 to SA23 and others on the wafer W by the maskless method. Thereafter, the photoresist on the wafer W is developed to form a resist pattern (circuit pattern) corresponding to the spatial image in each shot area on the wafer W. It is noted that the shot areas SA21 to SA23 may be exposed while each area is divided into three or more partial regions in the X-direction. Furthermore, because of the maskless method, it is also possible to expose the shot areas SA21 to SA23 with spatial images different from each other.

The below will describe a method of driving the spatial light modulator 28 in the case where the systematic error ΔZ is included in the distance between the reference plane A1 and the reflective surface of the mirror element 30 in FIG. 2B set in the aforementioned second state (phase π) in the spatial light modulator 28 and where the error Δϕ of Expression (2B) is thus included in the phase of the reflected light.

Figure 4A:
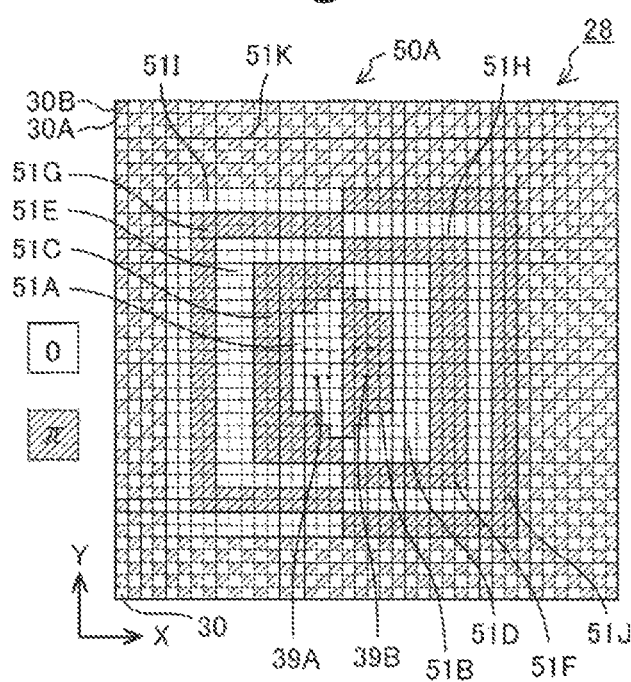
FIG. 4A is a drawing showing a first phase distribution for forming a first pattern of the spatial light modulator, FIG. 4B an enlarged view of a part of FIG. 4A, FIG. 4C an enlarged view showing resist patterns of spatial images corresponding to the phase distribution of FIG. 4A, and FIG. 4D an enlarged view showing resist patterns in the presence of the systematic error in the phase of the mirror elements 30.
Figure 4B:
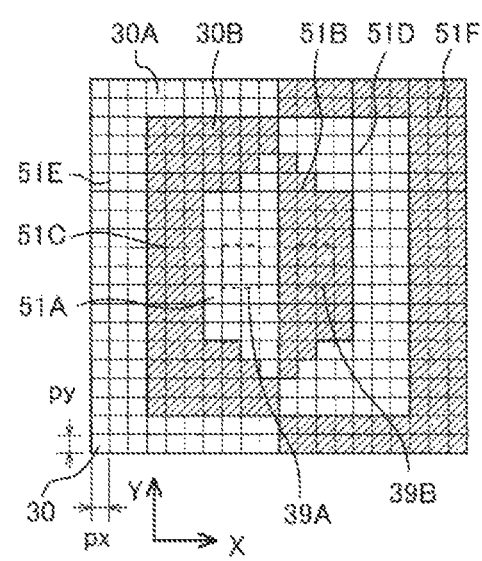
Figure 4D:
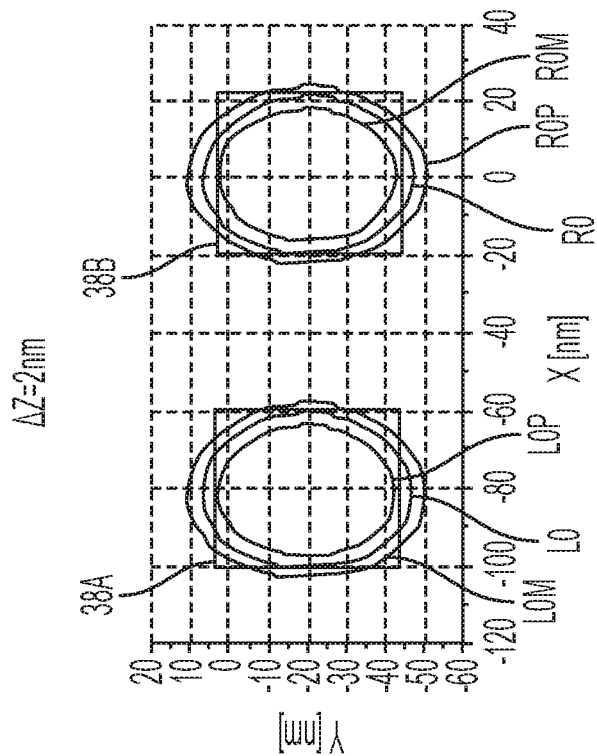
Figure 4C:
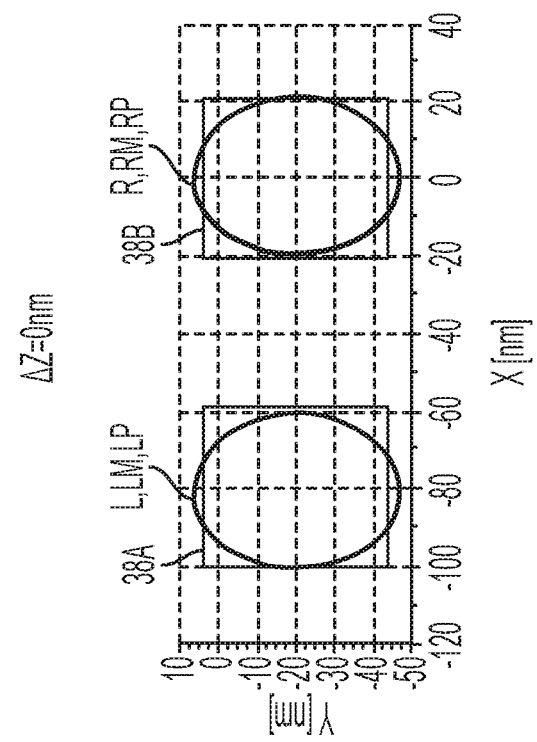

First, let us suppose that resist patterns to be formed on the surface of the wafer W after development are a pair of nearly square targets 38A, 38B in axial symmetry each having approximately the X-directional width of 40 nm and the Y-directional length of 48 nm and arranged with the X-directional spacing of 40 nm, as shown in FIGS. 4C and 4D as an example. In FIG. 4C and others, the horizontal axis and the vertical axis correspond to the X-axis (nm) and the Y-axis (nm), respectively, on the image plane of the projection optical system PL. FIG. 4A is a perspective view showing an example of phase distribution 50A of the illumination light IL (uneven distribution of the reflective surfaces of the mirror elements 30) formed by a part of the array of mirror elements 30 in the spatial light modulator 28 in FIG. 1, in order to form resist patterns as close to the targets 38A, 38B as possible, and FIG. 4B an enlarged view of the central part of FIG. 4A. The phase distributions of the array of mirror elements 30 in FIG. 6A and others which will be described below are also respective perspective views. It is also assumed for convenience' sake of description that the projection optical system PL forms an erect image. Furthermore, among the mirror elements 30, the mirror elements 30A in the first state (phase 0) are represented by patterns in white and the mirror elements 30B in the second state (phase π) by hatched patterns.

In FIGS. 4A and 4B, patterns 39A, 39B optically conjugate with the targets 38A, 38B are shown as imaginary patterns by dashed lines. The pitch px (=py) of the arrangement of the individual mirror elements 30 is set to be 20 nm at the stage of projected image, i.e., to satisfy β·px=20 (nm), using the projection magnification β of the projection optical system PL. The phase distribution 50A includes: a first region 51A, a fourth region 51D, a fifth region 51E, an eighth region 51H, and a ninth region 51I each consisting of the mirror elements 30A in the first state (phase 0); a second region 51B, a third region 51C, a sixth region 51F, a seventh region 51G, and a tenth region 51J each consisting of the mirror elements 30B in the second state (phase π); and a peripheral region 51K of a frame shape surrounding these first region 51A to tenth region 51J. The imaginary patterns 39A and 39B are arranged in the first region 51A and in the second region 51B, respectively. The peripheral region 51K is a region where the mirror elements 30A in the first state and the mirror elements 30B in the second state are arranged in a checkered pattern. The checkered pattern can also be called a checkered grid or a checkerboard pattern. A spatial image corresponding to a phase distribution of the peripheral region 51K includes images in a line width that is half of the width of the images of the mirror elements 30 and, because the projection optical system PL does not resolve patterns finer than the width of the images of the mirror elements 30 (or because diffracted light does not pass through an aperture stop), the spatial image corresponding to the peripheral region 51K becomes a light shielded part.

Simulations were conducted to obtain intensity distributions of spatial images on image planes at the best focus position of the projection optical system PL and at defocus positions of ±40 nm, under illumination conditions that the foregoing phase distribution 50A was used to optimize the light quantity distribution of the illumination light IL on the illumination pupil plane IPP so as to achieve a high resolution and that the illumination light IL was linearly polarized light in the Y-direction and, for comparison, under the condition that the systematic error ΔZ of the height of the reflective surfaces of the mirror elements 30 was 0. Furthermore, theoretical resist patterns obtained by slicing those spatial images by a predetermined threshold (e.g., a value with which an average of X-directional widths becomes a target value) are patterns L, R at the best focus position, patterns LP, RP with the defocus of +40 nm, and patterns LM, RM with the defocus of −40 nm in FIG. 4C. In this case, the left patterns L, LM, LP correspond to the target 38A in the −X-direction and the right patterns R, RM, RP to the target 38B in the +X-direction (the same also applies hereinafter). The left and right patterns L, R are elliptical against the targets 38A, 38B, according to the resolution of the projection optical system PL. It is found from FIG. 4C that when the systematic error ΔZ is 0, there is little change in the formed resist patterns even with the defocuses. It is noted hereinafter that in FIG. 4D and others, patterns Lj, Rj (j=0, 1, 2, . . . ) represent resist patterns at the best focus position, patterns LjP, RjP resist patterns with the defocus of +40 nm, and patterns LjM, RjM resist patterns with the defocus of −40 nm.

Next, simulations were conducted to obtain intensity distributions of spatial images on the image planes at the best focus position of the projection optical system PL and at the defocus positions of ±40 nm, under the same illumination conditions using the phase distribution 50A and under the condition that the systematic error ΔZ of the height of the reflective surfaces of the mirror elements 30 was 2 nm (the phase error Δϕ of Expression (2B) was approximately 7.5°). Furthermore, theoretical resist patterns obtained from the spatial images are patterns L0, R0 at the best focus position and patterns L0P, R0P, L0M, R0M with the defocuses in FIG. 4D. It is found from FIG. 4D that when the systematic error ΔZ is 2 nm, ratios of sizes of the left and right resist patterns formed vary depending upon the defocuses (e.g., the pattern L0P is smaller than the pattern R0P).

Targets 38AS, 38BS and patterns L1, R1, L1P, R1P, L1M, R1M in FIG. 5A are resist patterns obtained by subjecting the targets 38A, 38B and the patterns L0, R0, L0P, R0P, L0M, L0M in FIG. 4D to shrink (reduction) in the width of 10 nm. Concerning the shrunk resist patterns, a CD (critical dimension) as a width in the transverse direction (the X-direction herein) of the left pattern UP or the like is defined as CD-L and the CD of the right pattern R1P or the like as CD-R; under this definition, the critical dimensions were calculated with various set values of the systematic error ΔZ and with various defocus amounts, in order to quantify variations of sizes of the left and right resist patterns.

Figure 5B:
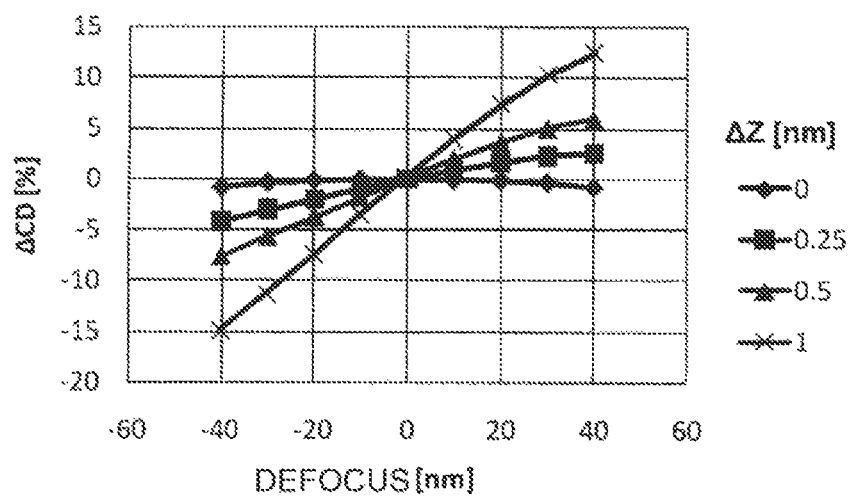
FIG. 5A is an enlarged view showing reduced (shrunk) resist patterns in the presence of the systematic error in the phase of the mirror elements 30, FIG. 5B a drawing showing relations between line widths of the left patterns in FIG. 5A and defocus amounts, and FIG. 5C a drawing showing relations between line widths of the right patterns in FIG. 5A and defocus amounts
Figure 5C:
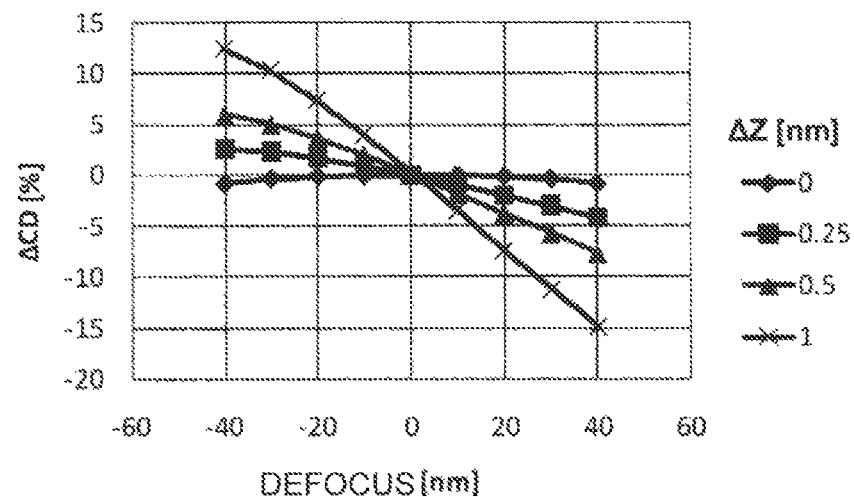

FIGS. 5B and 5C show CD-L and CD-R calculated as described above. In FIGS. 5B and 5C the horizontal axis represents defocus amounts (nm) and the vertical axis change amounts ΔCD (%) of CD with respect to the target value; the change amounts ΔCD shown are those with the systematic error ΔZ being set at 0, 0.25, 0.5, and 1 (nm). It is found from FIGS. 5B and 5C that with the defocus amounts of ±40 nm, the CD error of about 7% is made even with the systematic error ΔZ of about 0.5 nm. However, the signs of left CD-L and right CD-R are opposite about the defocuses and by making use of this relation, the CD error can be substantially reduced even with the defocus in the presence of the systematic error ΔZ, as described below.

Namely, in the present embodiment, when the systematic error ΔZ of the mirror elements 30 is 2 nm, a first phase distribution 50A in FIG. 6A (which is the same as the phase distribution of FIG. 4A) is first set in the array of mirror elements 30 in the spatial light modulator 28 and the wafer W is exposed with a spatial image by the projection optical system PL. By imaginarily slicing and shrinking an exposure dose distribution in this exposure, it is possible to obtain resist patterns L1, R1, L1P, R1P, L1M, R1M in FIG. 6B which are the same as those in FIG. 5A. Thereafter, a second phase distribution 50B in FIG. 6C resulting from inversion of 0 and π of the phase distribution 50A is set in the array of mirror elements 30 in the spatial light modulator 28 and the wafer is doubly exposed with a spatial image by the projection optical system PL. In the phase distribution 50B of FIG. 6C, a first region 52A to a tenth region 52J corresponding to the first region 51A (phase 0) to the tenth region 51J (phase π) in FIG. 6A are of the phase π to the phase 0, respectively. A peripheral region 52K of the phase distribution 50B corresponding to the peripheral region 51K of the phase distribution 50A is a checkered pattern but its phases are switched from 0 to π and vice versa from those in the peripheral region 51K. Since the image of the peripheral region 52K is a light shielded portion, the phase distribution of the same checkered pattern as the peripheral region 51K may also be used instead of the peripheral region 52K.

In this case, when it is assumed that the systematic error ΔZ causes, for example, the second region 51B (phase π+Δϕ) in comparison to the first region 51A (phase 0) to have the phase leading by Δϕ from the target value in the phase distribution 50A, the second region 52B (phase 0) in comparison to the corresponding first region 52A (phase π+Δϕ) has the phase lagging by Δϕ behind the target value in the phase distribution 50B. In other words, the second phase distribution 50B becomes equivalent to a distribution resulting from inversion of the signs of the systematic error Δϕ (ΔZ) in the first phase distribution 50A. For this reason, the characteristics of change against defocus of the line widths CD-L, CD-R of the left and right resist patterns in FIG. 5A about the second phase distribution 50B become the characteristics of FIGS. 5C and 5B opposite to those about the phase distribution 50A.

Figure 6D:
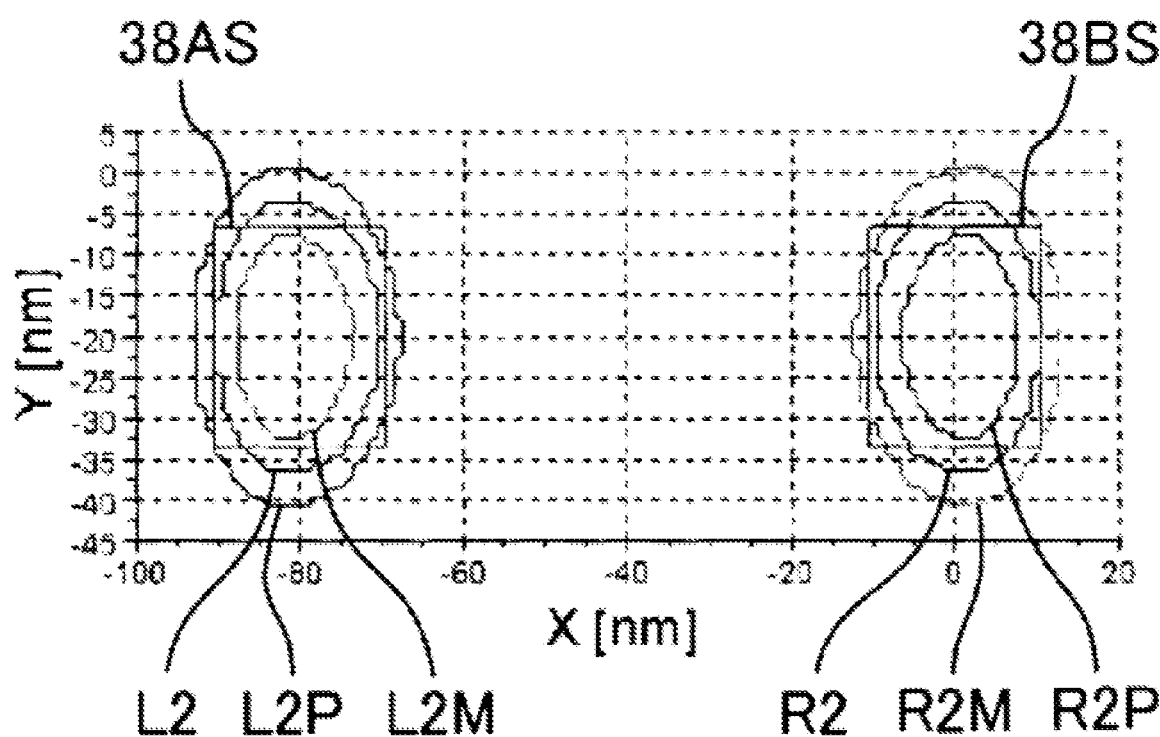
FIG. 6A is a drawing showing a first phase distribution including the systematic error of the spatial light modulator, FIG. 6B an enlarged view showing reduced resist patterns corresponding to the phase distribution of FIG. 6A, FIG. 6C a drawing showing a second phase distribution which is an inversion of the phase distribution of FIG. 6A, FIG. 6D an enlarged view showing reduced resist patterns corresponding to the phase distribution of FIG. 6C, and FIG. 6E an enlarged view showing reduced resist patterns after double exposure.

Accordingly, by slicing exposure dose distributions of spatial images of the phase distribution 50B and shrinking sliced patterns, it is possible to obtain resist patterns L2, R2, L2P, R2P, L2M, R2M in FIG. 6D. In this case, concerning the patterns with the defocus of +40 nm, the pattern L2P on the target 38AS side in FIG. 6D is larger than the pattern R2P on the target 38BS side, while the pattern UP on the target 38AS side in FIG. 6B is smaller than the pattern R1P on the target 38BS side. With the defocus of −40 nm, the magnitude relations between the patterns L1M, R1M in FIG. 6B and the patterns L2M, R2M in FIG. 6D are reverse to each other.

Figure 6E:
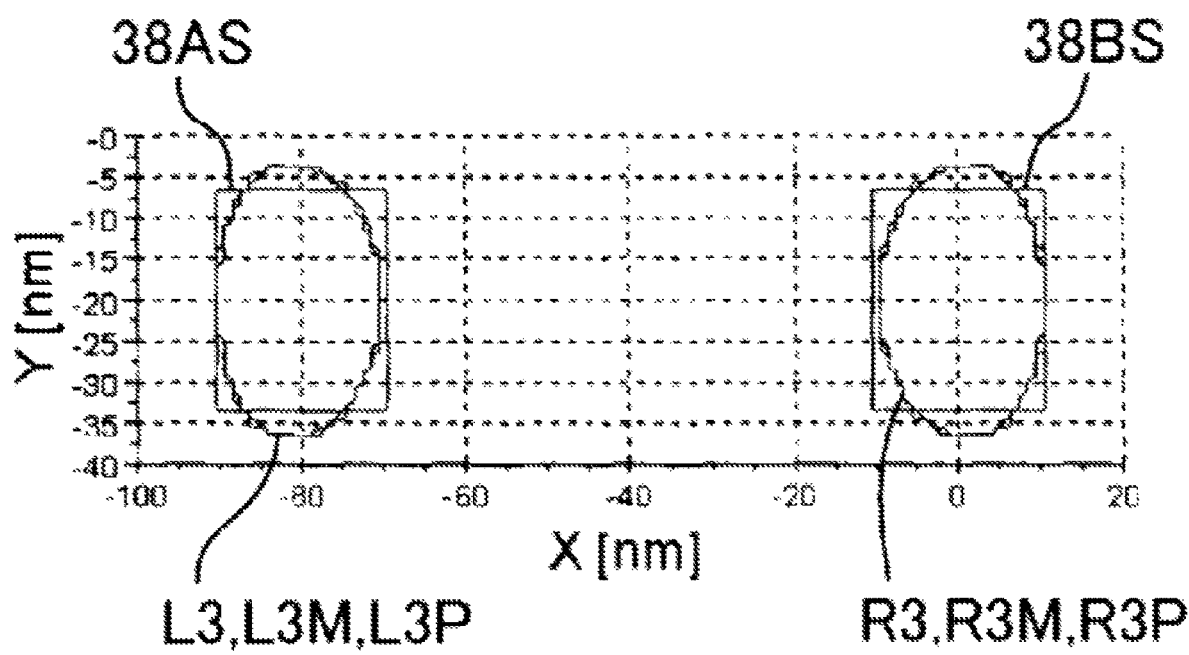

An exposure dose in the exposure of the spatial image of the phase distribution 50A is equal to that in the exposure of the spatial image of the phase distribution 50B and they are set to achieve an appropriate exposure dose after double exposure. As a result, an exposure dose distribution after the double exposure is approximately equal to that in use of the phase distribution 50A with the systematic error $\Delta Z$ of 0. Namely, by slicing the exposure dose distributions after the double exposure, it is possible to obtain patterns L3, R3 with the best focus and patterns L3P, R3P, L3M, R3M with the defocuses of ±40 nm as approximately equal patterns, as shown in FIG. 6E. Therefore, it is confirmed that even if there are the systematic error $\Delta Z$ of 2 nm and the defocus amount from about +40 to −40 nm, the patterns nearly equal to the targets 38AS, 38BS can be formed after the development and shrink.

The inventors confirmed that when reflected light from the gap regions 34a in the array of mirror elements 30 was mixed in the reflected light from the mirror elements 30, influence thereof was alleviated by implementing an overlay of the exposure with the foregoing first phase distribution and the exposure with the second phase distribution which is the inversion of the first phase distribution. Specifically, the first exposure is assumed to be carried out while the array of mirror elements 30 in the spatial light modulator 28 is set in the phase distribution 50A of FIG. 7A which is the same as FIG. 6A. It is, however, assumed that in the phase distribution 50A of FIG. 7A, the systematic error $\Delta Z$ of the height of the mirror elements 30 in the second state is 0 and that there are gap regions 34a of X-directional and Y-directional widths cx, cy (provided that cx=cy) in the arrangement of the mirror elements 30, as shown in its partly enlarged view E6A. As an example, while the pitch of the arrangement of images of the mirror elements 30 is 20 nm (=β·px), the width β·ex of images of the gap regions 34a is 2.5 nm (12.5% of the pitch). The reflectance Rc of the gap regions 34a for the illumination light IL is assumed to be 10% (which is a percentage relative to the reflectance of the mirror elements 30). Furthermore, it is assumed that a change amount δ3 of the phase of the reflected light from the gap regions 34a (a difference from the change amount δ1 of the phase of the reflected light from the mirror elements 30 in the first state), which is determined according to the distance d2 between the reference reflective surface A1 and the surfaces of the gap regions 34a in FIG. 2B, is 0°. In the description hereinafter, the change amount δ3 of the phase of the reflected light from the gap regions 34a with respect to the change amount δ1 of phase will also be referred to as gap phase.

Figure 7A:
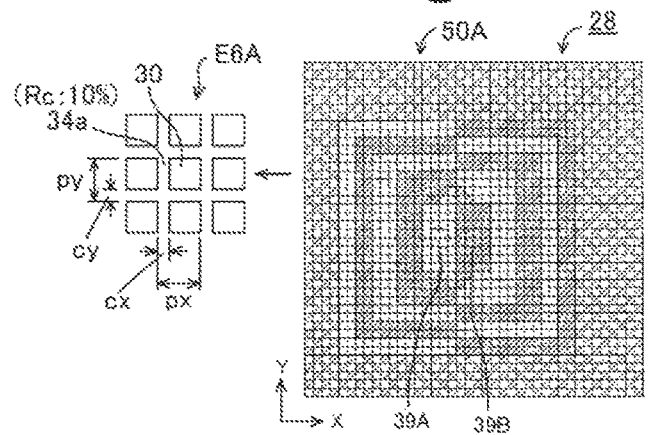
FIG. 7A is a drawing showing a first phase distribution including reflection in gap regions in the spatial light modulator, FIG. 7B an enlarged view showing resist patterns corresponding to the phase distribution of FIG. 7A, FIG. 7C a drawing showing a second phase distribution which is an inversion of the phase distribution of FIG. 7A, FIG. 7D an enlarged view showing resist patterns corresponding to the phase distribution of FIG. 7C, and FIG. 7E an enlarged view showing resist patterns after double exposure.
Figure 7B:
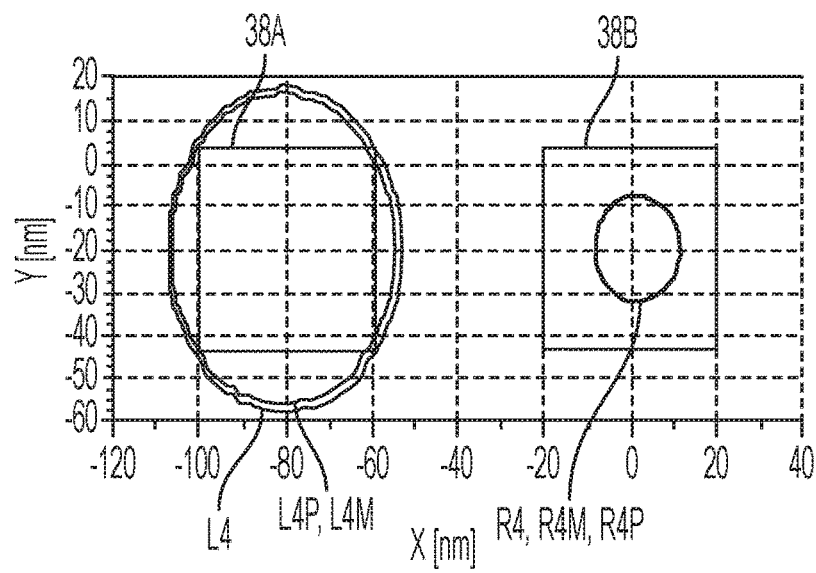

In this case, simulations were also conducted under the condition that the wafer W was first exposed with the spatial image of the phase distribution 50A in FIG. 7A by the projection optical system PL. The simulations of spatial images below were performed for situations where the spatial images were formed at the best focus position and at the defocus positions of ±40 nm. In resist patterns corresponding to exposure dose distributions of the spatial images obtained as the simulation results, patterns L4, L4P, L4M on the left target 38A side are considerably larger than patterns R4, R4P, R4M on the right target 38B side, as shown in FIG. 7B.

Figure 7C:
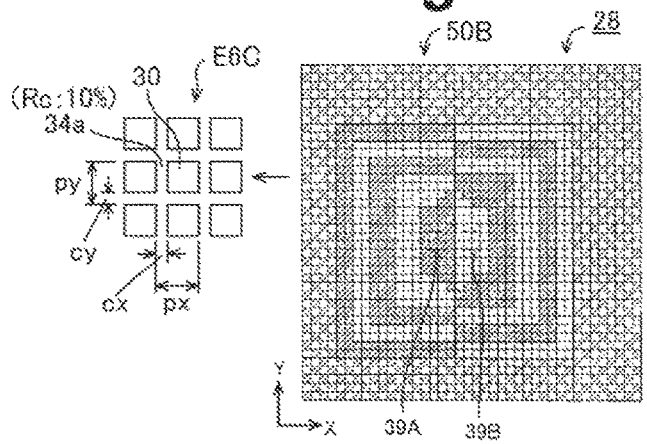
Figure 7D:
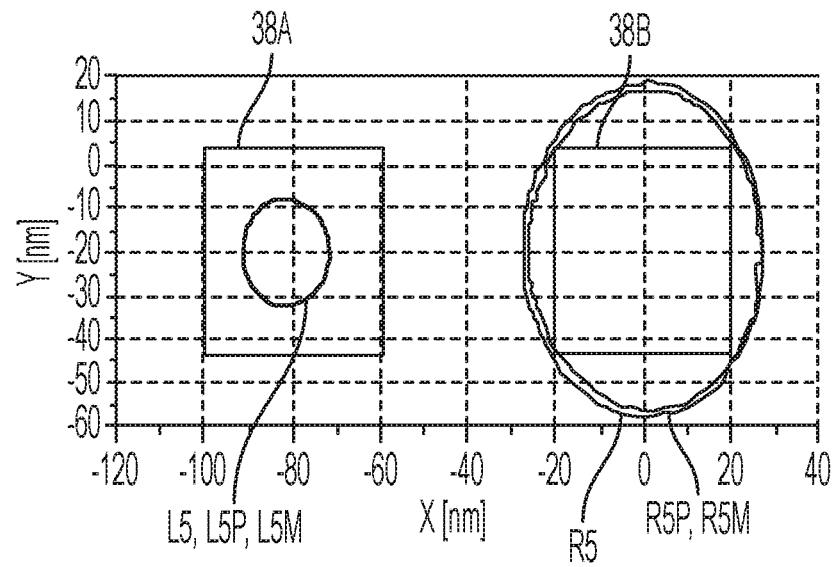

Next, the second phase distribution 50B in FIG. 7C as the inversion of 0 and π of the phase distribution 50A is set in the array of the mirror elements 30 in the spatial light modulator 28 and the wafer W is doubly exposed with the spatial image by the projection optical system PL. In the phase distribution 50B as well, as shown in partly enlarged view E6C, the reflectance Rc of the gap regions 34a is 10% and the change amount of the phase of the reflected light (gap phase δ3) is 0°. In resist patterns corresponding to exposure dose distributions of the spatial images of the phase distribution 50B in FIG. 7C, as shown in FIG. 7D, patterns L5, L5P, L5M on the left target 38A side are considerably smaller than patterns R5, R5P, R5M on the right target 38B side.

Figure 7E:
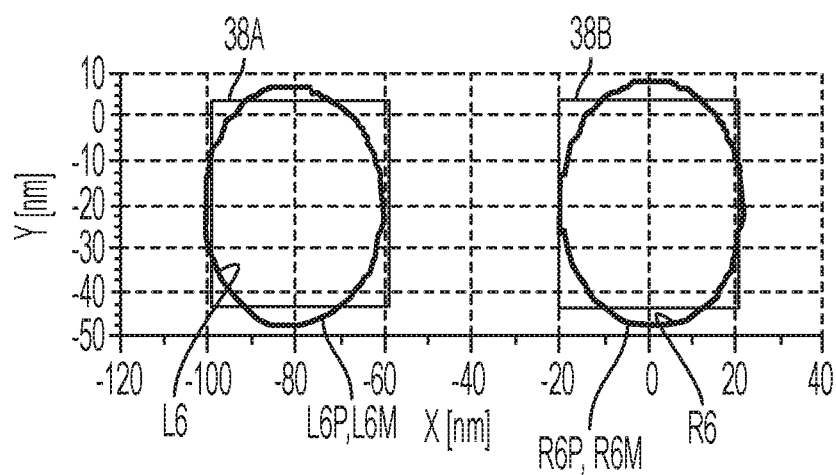

As a result, in resist patterns corresponding to exposure dose distributions after the double exposure, as shown in FIG. 7E, patterns L6, R6 with the best focus and patterns L6P, R6P, L6M, R6M with the defocuses of ±40 nm become almost equal. It is found therefore that even if the reflectance of the gap regions 34a in the phase 0° in the array of the mirror elements 30 is approximately 10% and there is the defocus from +40 to −40 nm, patterns nearly equivalent to the targets 38A, 38B can be formed after development. In FIGS. 7B, D, and E, the slice level to determine the pattern size was determined so that the maximum of the X-directional widths of the patterns in FIG. 7E became approximately equal to the target, and it was also applied to FIGS. 7B and D.

Figure 8A:
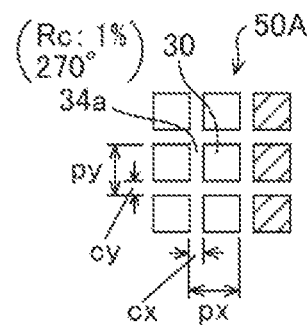
FIG. 8A is an enlarged view showing a part of a first phase distribution including gap regions generating reflected light, FIG. 8B an enlarged view showing resist patterns corresponding to the first phase distribution, FIG. 8C a drawing showing a part of a second phase distribution which is an inversion of the first phase distribution, FIG. 8D an enlarged view showing resist patterns corresponding to the second phase distribution, and FIG. 8E an enlarged view showing resist patterns after double exposure.
Figure 8B:
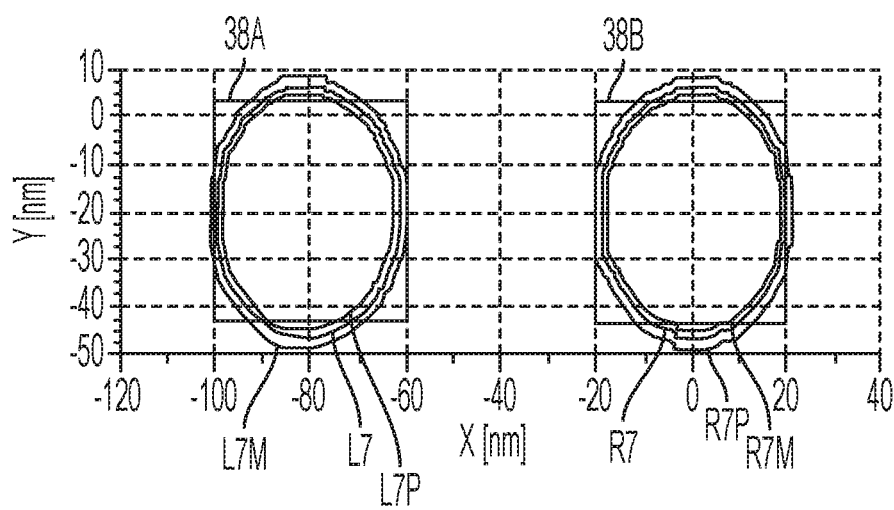

Simulations were also conducted for situations where the change amount (gap phase δ3) of the phase of the reflected light from the gap regions 34a in the array of the mirror elements 30 was 270°. It was assumed in this case that the phase distribution of the first exposure was the same as the phase distribution 50A in FIG. 7A but the reflectance Rc of the gap regions 34a was 1%, as shown in a partly enlarged view of FIG. 8A. In resist patterns corresponding to exposure dose distributions of spatial images of this phase distribution 50A, as shown in FIG. 8B, a pattern L7M on the target 38A side is slightly larger than a pattern R7M on the target 38B side, and a pattern L7P is slightly smaller than a pattern R7P.

Figure 8C:
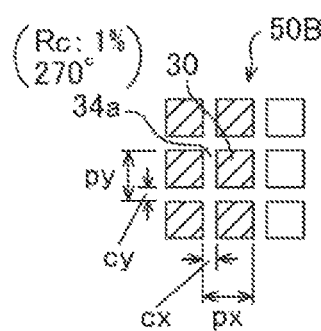
Figure 8D:
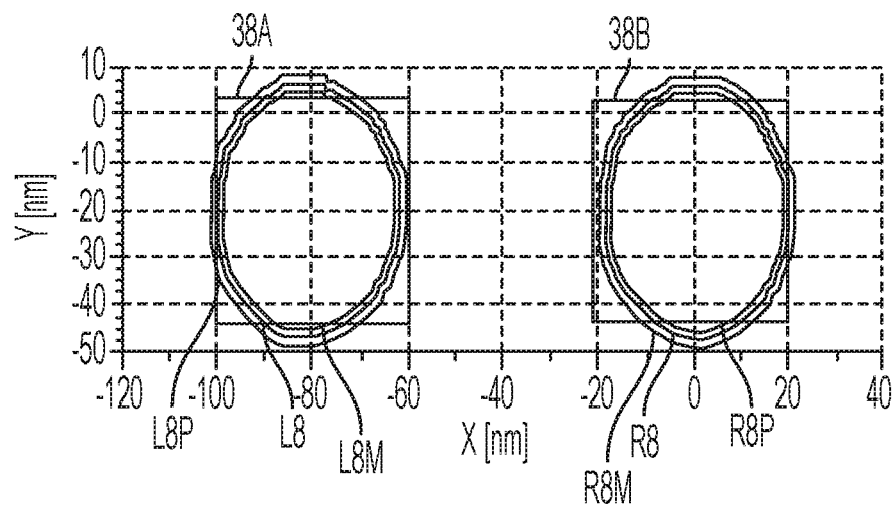
Figure 8E:
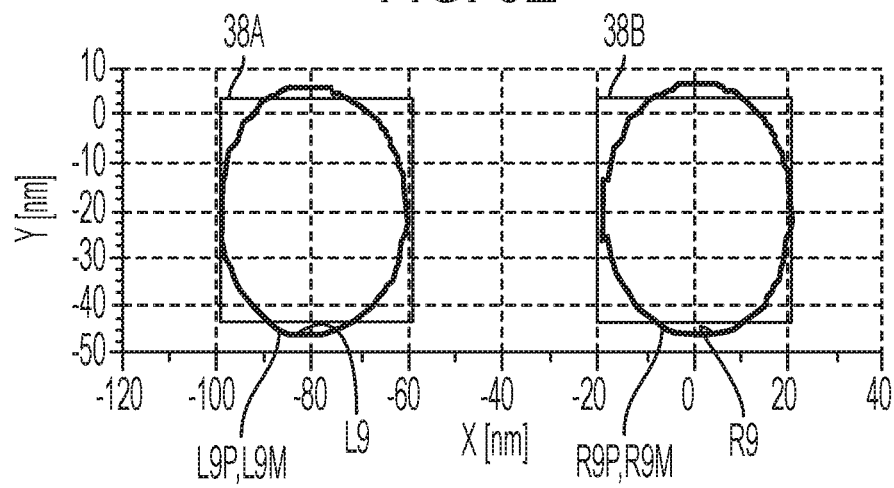

Furthermore, the phase distribution of the second exposure is the same as the phase distribution 50B in FIG. 7B, but the reflectance Rc of the gap regions 34a is 1% and the gap phase δ3 270°, as shown in a partly enlarged view of FIG. 8C. In resist patterns corresponding to exposure dose distributions of spatial images of the phase distribution 50B in FIG. 8C, as shown in FIG. 8D, a pattern L8M on the target 38A side is slightly smaller than a pattern R8M on the target 38B side and a pattern L8P is slightly larger than a pattern R8P. Therefore, in resist patterns corresponding to exposure dose distributions after the double exposure, as shown in FIG. 8E, patterns L9, R9 with the best focus and patterns L9P, R9P, L9M, R9M with the defocuses of ±40 nm become approximately equal. It is therefore found that even if the reflectance of the gap regions 34a with the gap phase of 270° in the array of mirror elements 30 is approximately 1% and there is the defocus from about +40 nm to −40 nm, the patterns nearly equivalent to the targets 38A, 38B can be formed after development. In FIGS. 8B, D, and E, the slice level to determine the pattern size was determined so that the maximum of the X-directional widths of the patterns in FIG. 8E became approximately equal to the target, and it was also applied to FIGS. 8B and D.

Next, as another example, simulations were conducted for situations where resist patterns to be formed on the surface of the wafer W after development were asymmetric patterns, as shown in FIG. 9C. The resist patterns in FIG. 9C are a short rectangular target 38C approximately with the X-directional width of 40 nm and the Y-directional length of 56 nm and a long rectangular target 38D approximately with the X-directional width of 40 nm and the Y-directional length of 96 nm arranged with the X-directional space of 80 nm from the target 38C.

FIG. 9A shows an example of phase distribution 53A of illumination light IL formed by a part of the array of the mirror elements 30 in the spatial light modulator 28 in FIG. 1, in order to form resist patterns as close to the targets 38C, 38D as possible, and FIG. 9B is an enlarged view of the central part of FIG. 9A. In FIGS. 9A and 9B, patterns optically conjugate with the targets 38C, 38D are represented virtually by dashed lines. The pitch of the arrangement of the individual mirror elements 30 is set to be 20 nm at the stage of projected image. The phase distribution 53A includes a first region 54A, a third region 54C, a fourth region 54D, and a fifth region 54E each consisting of the mirror elements 30 in the phase π, a second region 54B consisting of the mirror elements 30 in the phase 0, and a peripheral region 54F of a checkered pattern in a frame shape surrounding these first region 54A to fifth region 54E.

With the use of the phase distribution 53A, simulations were conducted under the unpolarized illumination condition with the coherence factor (σ value) of 0.14 and, for comparison, under the condition that the systematic error ΔZ of the height of the reflective surfaces of the mirror elements 30 was 0, to obtain intensity distributions of spatial images on the image planes at the best focus position of the projection optical system PL and at the defocus positions of ±40 nm. Furthermore, resist patterns obtained from those spatial images are, as shown in FIG. 9C, such that patterns LA, RA at the best focus position and patterns LAP, RAP and LAM, RAM with the defocuses of ±40 nm are approximately identical and each of them is a pattern close to the target 38C or 38D.

Figure 10A:
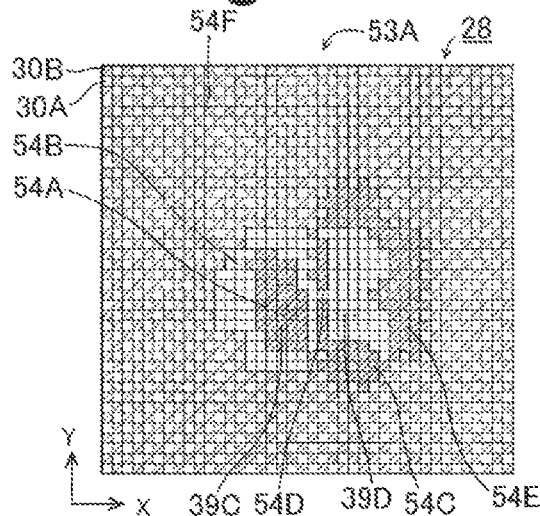
FIG. 10A is a drawing showing a first phase distribution for the second pattern including the systematic error of the spatial light modulator, FIG. 10B an enlarged view showing resist patterns corresponding to the phase distribution of FIG. 10A, FIG. 10C a drawing showing a second phase distribution which is an inversion of the phase distribution of FIG. 10A, FIG. 10D an enlarged view showing resist patterns corresponding to the phase distribution of FIG. 10C, and FIG. 10E an enlarged view showing resist patterns after double exposure.
Figure 10B:
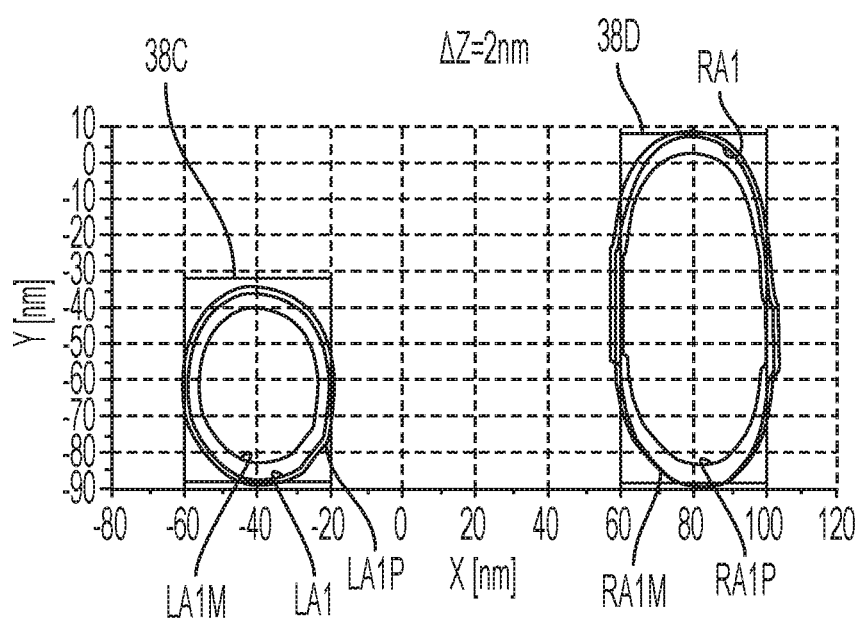

Next, with the use of the phase distribution 53A in FIG. 10A which is the same as FIG. 9A, simulations were conducted under the same illumination condition and the condition that the systematic error ΔZ of the height of the reflective surfaces of the mirror elements 30 was 2 nm, to obtain intensity distributions of spatial images. Furthermore, resist patterns obtained from the spatial images are, as shown in FIG. 10B, such that patterns LA1, RA1 at the best focus position are different from patterns LA1P, RA1P, LA1M, RA1M with the defocuses.

Figure 10D:
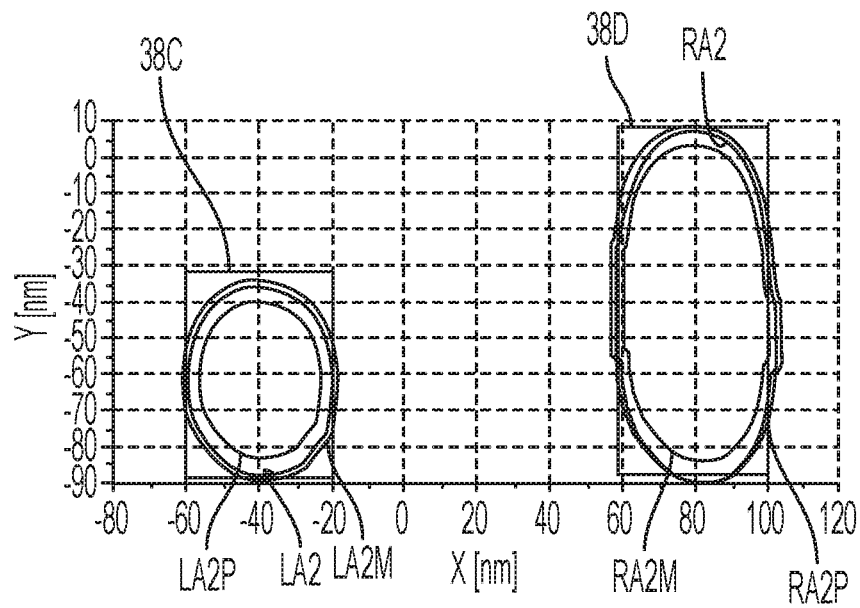
Figure 10E:
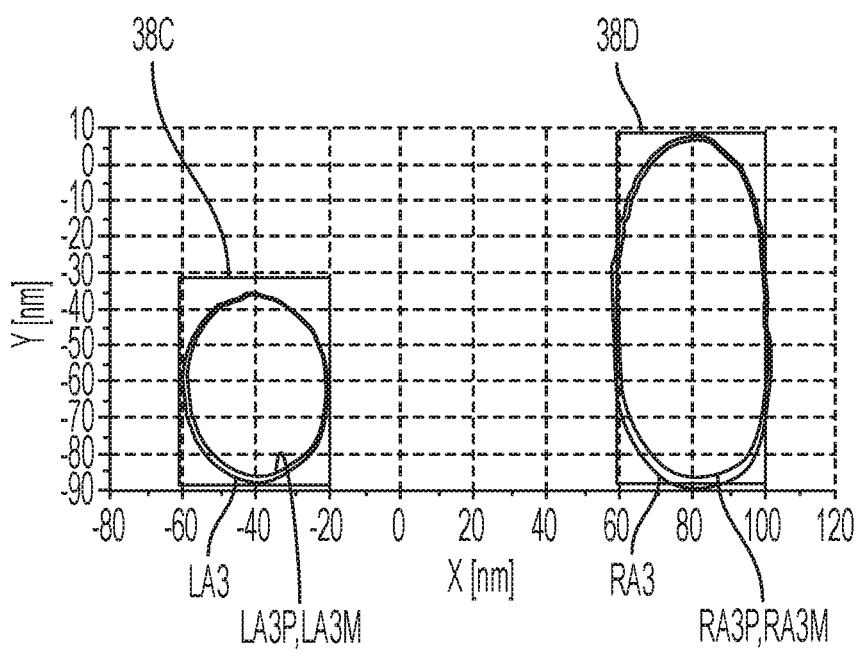

Thereafter, a second phase distribution 53B including first region 55A to fifth region 55E and peripheral region 55F in FIG. 10C which is an inversion of 0 and π of the phase distribution 53A, is set in the array of the mirror elements 30 in the spatial light modulator 28 and the wafer W is doubly exposed with spatial images by the projection optical system PL. In this case, the systematic error in the phase distribution 53B is also −ΔZ with respect to the systematic error ΔZ in the phase distribution 53A. Therefore, resist patterns obtained by slicing exposure dose distributions of the spatial images of the phase distribution 53B are, as shown in FIG. 10D, such that patterns LA2, RA2 at the best focus position and patterns LA2P, RA2P, LA2M, RA2M with the defocuses are different in characteristics opposite to those in FIG. 10B. As a result, by slicing exposure dose distributions after the double exposure, we obtain patterns LA3, RA3 with the best focus and patterns LA3P, RA3P, LA3M, RA3M with the defocuses of ±40 nm as nearly equal patterns, as shown in FIG. 10E. It is therefore found that even if the systematic error ΔZ is 2 nm and there is the defocus from about +40 nm to −40 nm, the patterns approximately equivalent to the targets 38C, 38D can be formed after development.

It was also confirmed in this example that the influence of the reflected light from the gap regions 34a in the array of the mirror elements 30 was alleviated by implementing the overlay of the exposure with the first phase distribution 53A and the exposure with the second phase distribution 53B as the inversion thereof. Specifically, the first exposure was based on the setup where the array of mirror elements 30 in the spatial light modulator 28 was set in the phase distribution 53A of FIG. 11A which is the same as FIG. 9A and the conditions that the systematic error ΔZ was 0 and that, as shown in its partly enlarged view E11A, the width β·ex of images of the gap regions 34a with respect to the pitch of 20 nm (=β·px) of the arrangement of images of the mirror elements 30 was 2.5 nm (12.5% of the pitch). It was further assumed that the reflectance Rc of the gap regions 34a was 1% and the change amount of the phase of the reflected light from the gap regions 34a (the difference from the change amount δ1) was 0°.

Figure 11A:
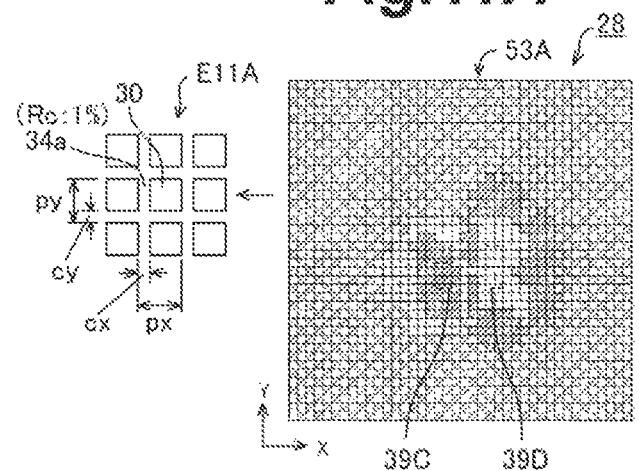
FIG. 11A is a drawing showing a first phase distribution for the second pattern including reflection in gap regions in the spatial light modulator, FIG. 11B an enlarged view showing resist patterns corresponding to the phase distribution of FIG. 11A, FIG. 11C a drawing showing a second phase distribution which is an inversion of the phase distribution of FIG. 11A, FIG. 11D an enlarged view showing resist patterns corresponding to the phase distribution of FIG. 11C, and FIG. 11E an enlarged view showing resist patterns after double exposure.
Figure 11B:
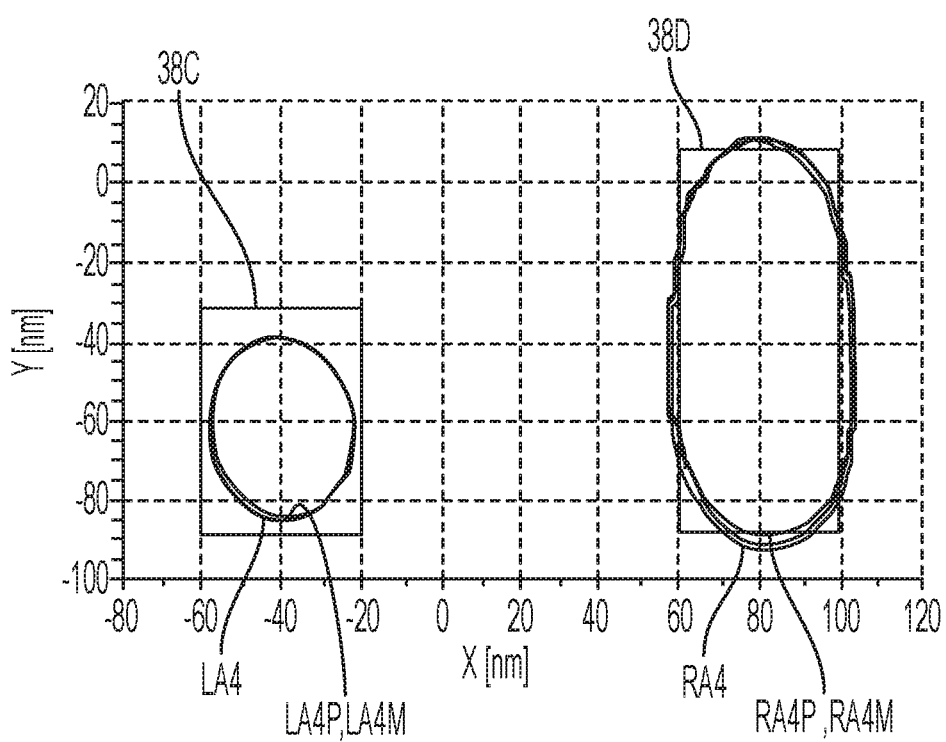

In this case as well, exposure dose distributions of spatial images of the phase distribution 53A in FIG. 11A are first obtained and resist patterns obtained from the exposure dose distributions are, as shown in FIG. 11B, such that left patterns LA4, LA4P, LA4M are smaller than the target 38C and right patterns RA4, RA4P, RA4M are larger than the target 38D.

Figure 11E:
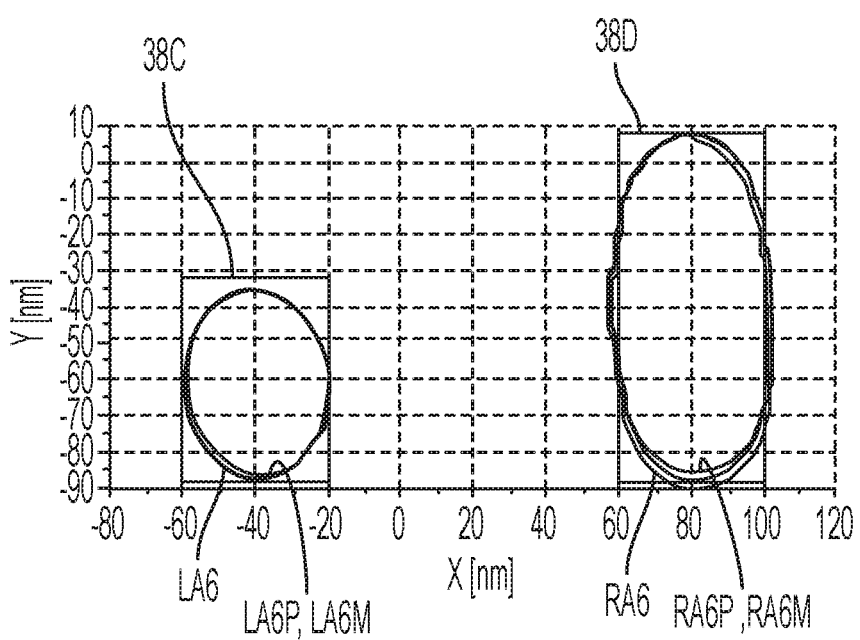

Next, the second phase distribution 53B in FIG. 11C as an inversion of 0 and π of the phase distribution 53A is set in the array of mirror elements 30 in the spatial light modulator 28 (where the reflectance Rc of the gap regions 34a is 1% and the change amount of the phase of the reflected light therefrom is 0° as shown in a partly enlarged view E11C) and the wafer W is doubly exposed with the spatial image thereof by the projection optical system PL. Resist patterns corresponding to exposure dose distributions of spatial images of the phase distribution 53B in FIG. 11C are, as shown in FIG. 11D, such that left patterns LA5, LA5P, LA5M are approximately equal to the target 38C and right patterns RA5, RA5P, RA5M are smaller than the target 38D. As a result, resist patterns corresponding to exposure dose distributions after the double exposure are, as shown in FIG. 11E, such that patterns LA6, RA6 with the best focus and patterns LA6P, RA6P, LA6M, RA6M with the defocuses of ±40 nm are approximately equal. It is therefore found that even if the reflectance of the gap regions 34a in the phase 0° in the array of mirror elements 30 is approximately 1% and there is the defocus from about +40 to −40 nm, the patterns nearly equivalent to the targets 38C, 38D can be formed after development.

Figure 12A:
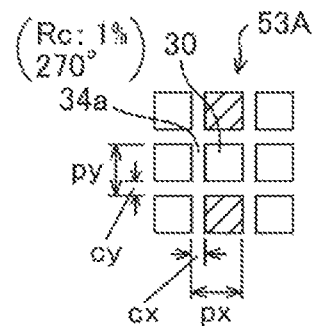
FIG. 12A is an enlarged view showing a part of a first phase distribution for the second pattern including gap regions generating reflected light, FIG. 12B an enlarged view showing resist patterns corresponding to the first phase distribution, FIG. 12C a drawing showing a part of a second phase distribution which is an inversion of the first phase distribution, FIG. 12D an enlarged view showing resist patterns corresponding to the second phase distribution, and FIG. 12E an enlarged view showing resist patterns after double exposure.
Figure 12B:
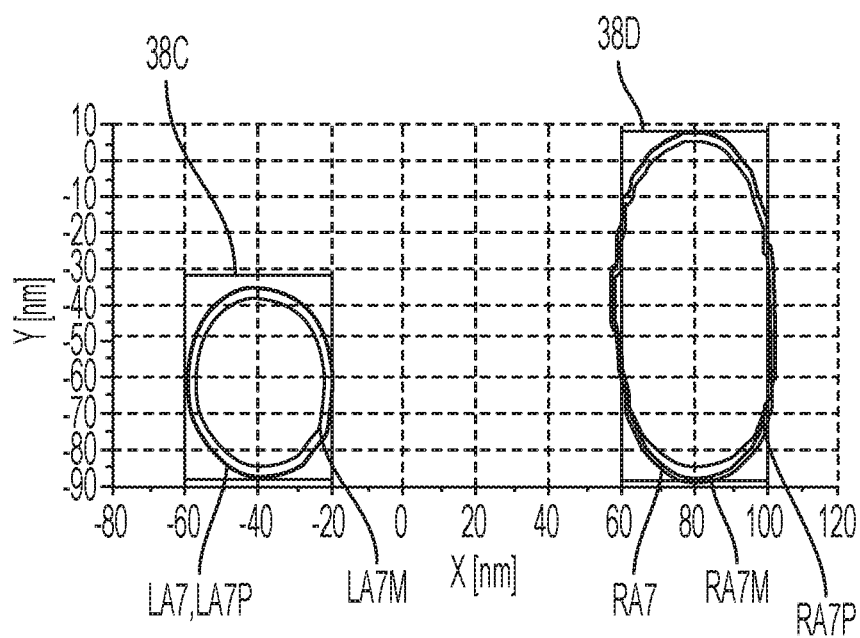

Furthermore, simulations were also conducted under the conditions that the phase distribution of the first exposure was the same as the phase distribution 53A in FIG. 11A and that, as shown in a partly enlarged view of FIG. 12A, the reflectance Rc of the gap regions 34a was 1% and the change amount of the phase of the reflected light from the gap regions 34a was 270°. Resist patterns corresponding to exposure dose distributions of spatial images of this phase distribution 53A are, as shown in FIG. 12B, such that a pattern LA7M (LA7P) on the target 38C side is slightly smaller (larger), in comparison with a pattern RA7M (RA7P) on the target 38D side.

Figure 12C:
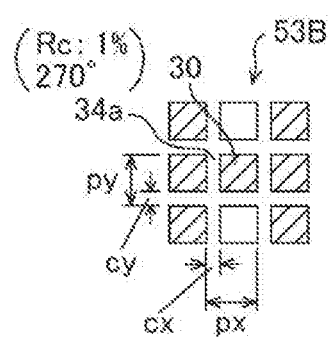
Figure 12D:
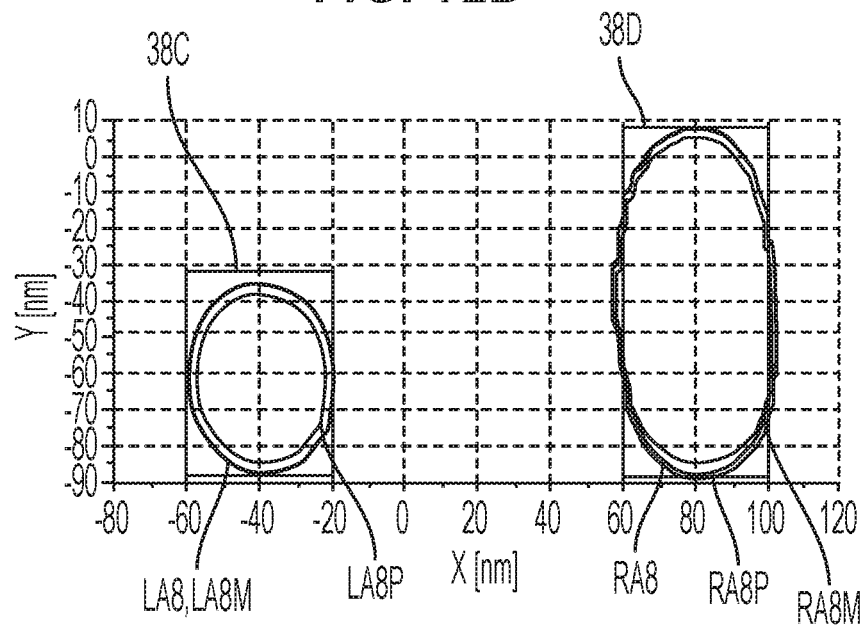
Figure 12E:
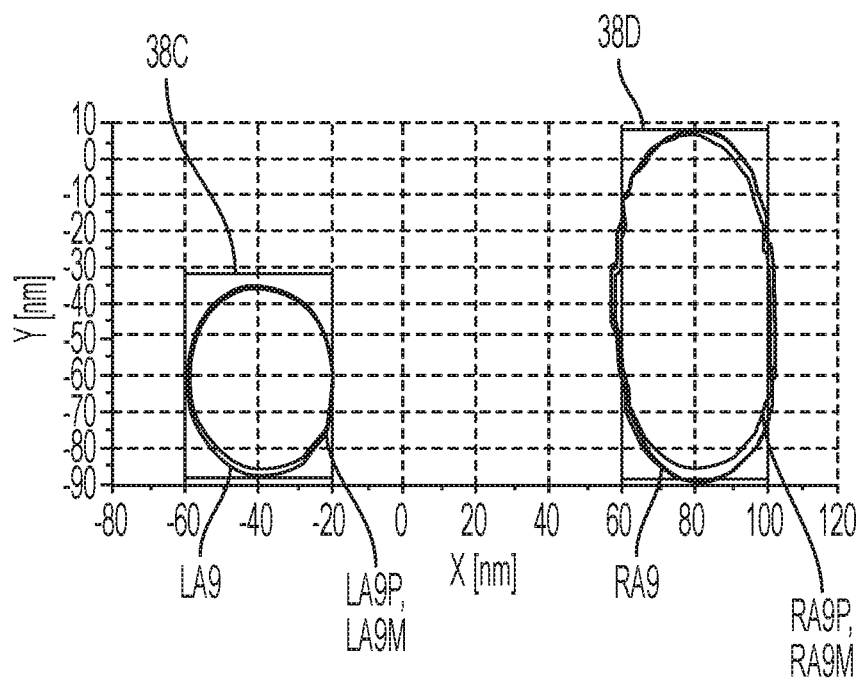

Furthermore, the phase distribution of the second exposure was the same as the phase distribution 53B in FIG. 11B and, as shown in a partly enlarged view of FIG. 12C, the reflectance Rc of the gap regions 34a was set to 1% and the change amount of the phase of the reflected light from the gap regions 34a to 270°. Resist patterns corresponding to exposure dose distributions of spatial images of the phase distribution 53B in FIG. 12C are, as shown in FIG. 12D, such that a pattern LA8M (LA8P) on the target 38C side is slightly larger (smaller), in comparison with a pattern LA8M (LA8P) on the target 38D side. Therefore, resist patterns corresponding to exposure dose distributions after the double exposure are, as shown in FIG. 12E, such that patterns LA9, RA9 with the best focus and patterns LA9P, RA9P, LA9M, RA9M with the defocuses of ±40 nm are approximately equal. It is therefore found that even if the reflectance of the gap regions 34a in the phase 270° in the array of mirror elements 30 is 1% and there is the defocus from about +40 to −40 nm, the patterns nearly equivalent to the targets 38C, 38D can be formed after development.

Figure 13A:
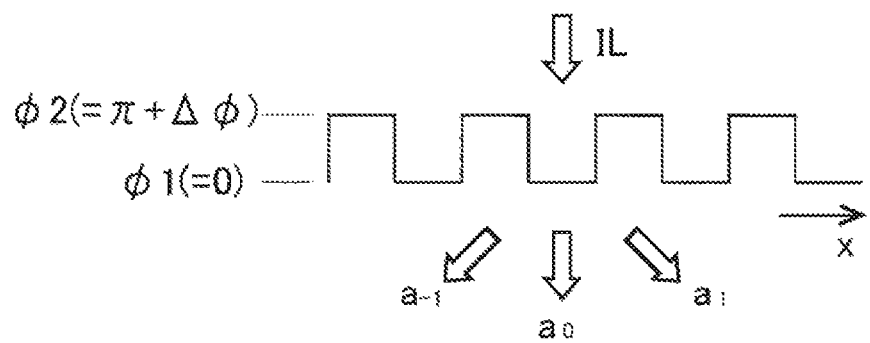
FIG. 13A is a drawing showing zero-order light and ±first-order light from a periodic pattern, FIG. 13B a drawing showing a first phase distribution, and FIG. 13C a drawing showing a second phase distribution which is an inversion of the first phase distribution.

The below will describe situations where a periodic phase distribution is set in the array of mirror elements 30 in the spatial light modulator 28. First, the phase distribution as an exposure object in the array of mirror elements 30 is assumed to be, as shown in FIG. 13A, a distribution in which an arrangement of the mirror elements 30 in the first state and with the change amount of the phase of the reflected light with respect to the incident light being $\phi 1$ (=0) and an arrangement of the mirror elements 30 in the second state and with the change amount of the phase of the reflected light being $\phi 2$ (=$\pi+\Delta\phi$) are repeated at a predetermined pitch in the X-direction. The error $\Delta\phi$ in the phase $\phi 2$ in the second state is the phase error of Expression (2B) corresponding to the systematic error $\Delta Z$ of the height of the reflective surfaces of the mirror elements 30. In this case, the amplitude $a_0$ of zero-order light and the amplitudes $a_1$, $a_{-1}$ of ±first-order light from the illumination light IL with the amplitude of 1 incident to the phase distribution of FIG. 13A are as follows.

$$a_0 = (1/4)\{\exp(i\phi 1) + \exp(i\phi 2)\} \tag{3A}$$

$$a_1 = a_{-1} = \{1/(2^{1/2}\pi)\}\{\exp(i\phi 1) - \exp(i\phi 2)\} \tag{3B}$$

By substituting $\phi 1 = 0$ and $\phi 2 = \pi + \Delta\phi$ into these equations, we obtain the amplitudes $a_0$, $a_1$, and $a_{-1}$ approximately as given below, under the condition that $\Delta\phi$ (rad) is an infinitesimal value.

$$a_0 = -(1/4)i\Delta\phi \tag{3C}$$

$$a_1 = a_{-1} = (2^{1/2}/\pi)(1 + i\Delta\phi/2) \tag{3D}$$

Figure 13B:
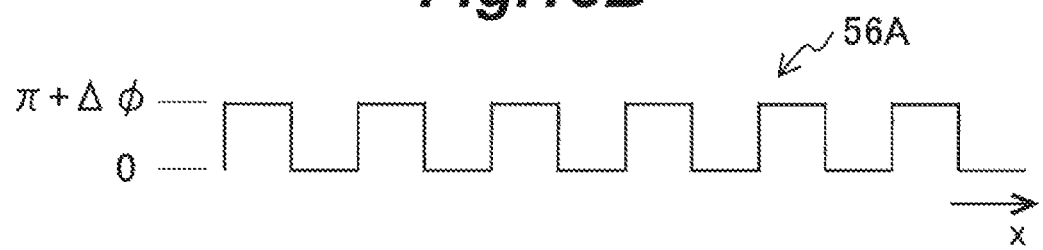

In this case as well, a phase distribution 56A in FIG. 13B which is the same as FIG. 13A is first coherently illuminated to expose the wafer with a spatial image thereof. The x-directional electric field $E_1(x)$ of the spatial image is given as below. It is noted herein that the pitch (period) of the spatial image is P.

$$E_1(x) = a_0 + 2a_1 \exp(i\Delta\theta)\cos(2\pi x/P) \tag{3E}$$

The phase difference $\Delta\theta$ in Expression (3E) is a phase difference between the zero-order light and the first-order light due to defocus. The phase difference $\Delta\theta$ is given as below when $\delta$ is a defocus amount, n the refractive index of a medium between the projection optical system PL and the wafer, and $\lambda$ the wavelength of the illumination light IL.

$$\Delta\theta = \frac{2\pi}{\lambda} n\delta \left\{ 1 - \sqrt{1 - \left(\frac{\lambda}{nP}\right)} \right\} \tag{4}$$

The intensity $I_1(x)$ of the spatial image is expressed by the product of the electric field $E_1(x)$ in Expression (3E) and its complex conjugate as below. The third expression below is an expression obtained by ignoring the second-order and higher-order terms about $\Delta\phi$ under the condition that $\Delta\phi$ is an infinitesimal amount. The first term of the third expression below is the intensity in an ideal focus condition, and the second term the intensity dependent on the systematic error $\Delta\phi$.

$$I_1(x) = E_1(x) \cdot \overline{E_1(x)} \tag{5}$$

$$= \frac{4}{\pi^2}\left(1 + \frac{\Delta\phi^2}{2}\right) \cdot \left\{\cos\left(\frac{4\pi x}{P}\right) + 1\right\} - \frac{\sqrt{2}}{\pi}\Delta\phi\left\{\frac{\Delta\phi}{2}\cos(\Delta\theta) + \sin(\Delta\theta)\right\}\cos\left(\frac{2\pi x}{P}\right) + \frac{\Delta\phi^2}{16}$$

$$\approx \frac{4}{\pi^2}\left\{\cos\left(\frac{4\pi x}{P}\right) + 1\right\} - \frac{\sqrt{2}}{\pi}\Delta\phi\sin(\Delta\theta)\cos\left(\frac{2\pi x}{P}\right)$$

Figure 13C:
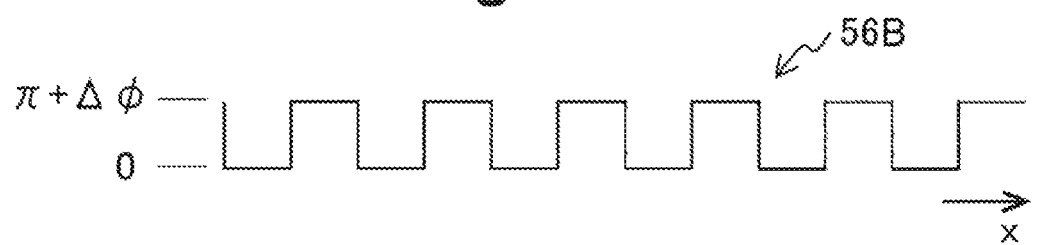

Next, the wafer is assumed to be subjected to overlay exposure with a spatial image of a phase distribution 56B of FIG. 13C, which is an inversion of the portions of phase 0 and the portions of phase $\pi$ in the phase distribution 56A of FIG. 13B. In the phase distribution 56B, the systematic phase error $\Delta\phi$ is also added to the portions of phase $\pi$. The x-directional electric field $E_2(x)$ of the spatial image of the phase distribution 56B is as follows.

$$E_2(x) = a_0 - 2a_1 \exp(i\Delta\theta)\cos(2\pi x/P) \tag{3F}$$

The intensity $I_2(x)$ of the spatial image is expressed by the product of the electric field $E_2(x)$ of Expression (3F) and its complex conjugate as below. The second expression below is also obtained by ignoring the second-order and higher-order terms about $\Delta\phi$ under the condition that $\Delta\phi$ is an infinitesimal amount.

$$I_2(x) = \frac{4}{\pi^2}\left(1 + \frac{\Delta\phi^2}{2}\right) \cdot \left\{\cos\left(\frac{4\pi x}{P}\right) + 1\right\} + \frac{\sqrt{2}}{\pi}\Delta\phi\left\{\frac{\Delta\phi}{2}\cos(\Delta\theta) + \sin(\Delta\theta)\right\}\cos\left(\frac{2\pi x}{P}\right) + \frac{\Delta\phi^2}{16} \tag{7}$$

$$\approx \frac{4}{\pi^2}\left\{\cos\left(\frac{4\pi x}{P}\right) + 1\right\} + \frac{\sqrt{2}}{\pi}\Delta\phi\sin(\Delta\theta)\cos\left(\frac{2\pi x}{P}\right)$$

The second expression in this expression (7) is an inversion of the sign of the second term (the intensity dependent on the systematic error $\Delta\phi$) in the third expression in Expression (5).

An exposure dose distribution $I_{ave}$ after the overlay operation of the exposure with the spatial image of the phase distribution 56A and the exposure with the spatial image of the phase distribution 56B is an average of an approximate value of the intensity $I_1(x)$ in Expression (5) and an approximate value of the intensity $I_2(x)$ in Expression (7) as below, in which the term dependent on the systematic error in the intensity $I_1(x)$ and the term dependent on the systematic error in the intensity $I_2(x)$ cancel out each other.

$$I_{ave} = \frac{I_1(x) + I_2(x)}{2} = \frac{4}{\pi^2}\left\{\cos\left(\frac{4\pi x}{P}\right) + 1\right\} \quad (8)$$

It is also seen from this expression that when there is the systematic error $\Delta Z$ of the height of the mirror elements 30 (phase error $\Delta\phi$) in the periodic phase distribution, the double exposure provides the spatial image without influence of the phase error $\Delta\phi$.

Figure 14A:
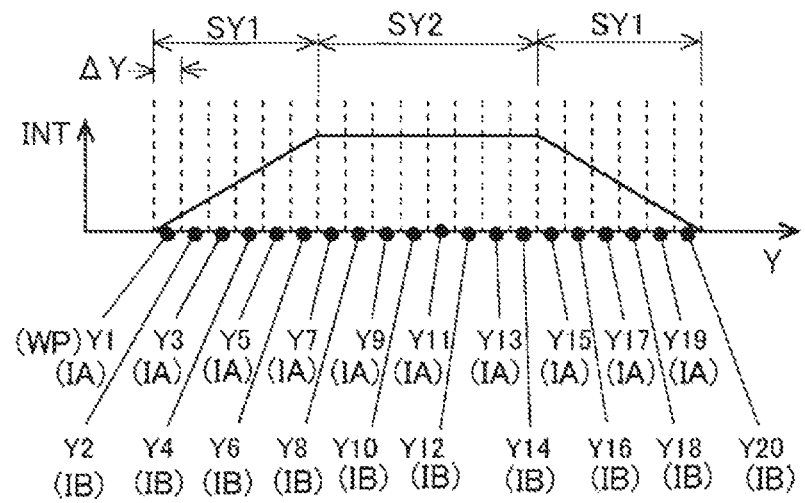
FIG. 14A is a drawing showing a light intensity distribution in a scanning direction of an exposure region, FIG. 14B an explanatory drawing of a moving method of phase distribution in the array of mirror elements 30 in the spatial light modulator, and FIG. 14C a drawing showing two spatial light modulators in a modification example of the embodiment.

The below will describe a situation where the exposure with the spatial image of the first phase distribution 50A in FIG. 6A and the exposure with the spatial image of the second phase distribution 50B in FIG. 6B which is the inversion of the phase distribution 50A as described above are implemented by scanning exposure. In the present embodiment, the Y-directional intensity distribution INT of the illumination light IL in the exposure region 26B on the surface of the wafer W varies in a trapezoidal shape with the width SY1 of slant portions at the both ends and the width SY2 of a flat portion, as shown in FIG. 14A. In FIG. 14A, the horizontal axis represents Y-coordinates on the wafer W driven by the wafer stage WST in FIG. 1. During scanning exposure, for example, the wafer stage WST is scanned at a constant speed in the +Y-direction and every time an arbitrary exposed point WP on the surface of the wafer W arrives at a Y-directional point Yi (i=1, 2, 3, . . . ) in the exposure region 26B, one pulse of illumination light IL is emitted from the illumination optical system ILS onto the spatial light modulator 28, thereby to expose a region including the exposed point WP, with the spatial image of the phase distribution set in the spatial light modulator 28. In this case, when a Y-directional moving amount of the wafer W for each pulse emission is defined as $\Delta Y$, i.e., when a distance between position Yi and position Y(i+1) is defined as $\Delta Y$, the positions Yi are located in respective partial regions resulting from division of the exposure region 26B by width $\Delta Y$ in the Y-direction. In synchronism with the Y-directional movement of the exposed point WP, the spatial images of the phase distributions 50A, 50B also move at the same speed in the Y-direction.

In this case, when it is assumed in the present embodiment that the wafer W is exposed with the spatial image IA of the first phase distribution 50A upon arrival of the exposed point WP at a position Yj (j is an integer), the wafer W is exposed with the spatial image IB of the second phase distribution 50B upon arrival of the exposed point WP at a next position Y(j+1). Namely, while the exposed point WP moves in the Y-direction, the wafer is exposed alternately with the spatial images IA and IB. In the example of FIG. 14A, the wafer is exposed with the spatial image IA upon every arrival of the exposed point WP at the odd-numbered position Y1, Y3, . . . and exposed with the spatial image IB upon every arrival at the even-numbered position Y2, Y4, . . . . Furthermore, in a duration in which the exposed point WP passes through either of the slant portions in the width SY1 at the both ends of the intensity distribution INT, the same number of times of exposures are carried out with the spatial image IA of the phase distribution 50A and with the spatial image IB of the phase distribution 50B; in a duration in which the exposed point WP passes through the flat portion in the width SY2 in the center of the intensity distribution INT, the same number of times of exposures are also carried out with the spatial images IA and IB. A condition for this operation is that an even number of moving amounts $\Delta Y$ of the wafer W between pulse emissions fall within each of the widths SY1 and SY2 as below.

$$SY1/\Delta Y = \text{even number}, \, SY2/\Delta Y = \text{even number} \quad (9)$$

When the conditions of Expression (9) do not hold, the number of exposures with the spatial image IA and the number of exposures with the spatial image IB during the movement of the exposed point WP through the slant portion of the intensity distribution in the width SY1 (or through the flat portion in the width SY2) are different and the influence of the systematic error $\Delta Z$ of the mirror elements 30 is not completely cancelled out, raising a possibility of remnants of the systematic error $\Delta Z$.

Figure 14B:
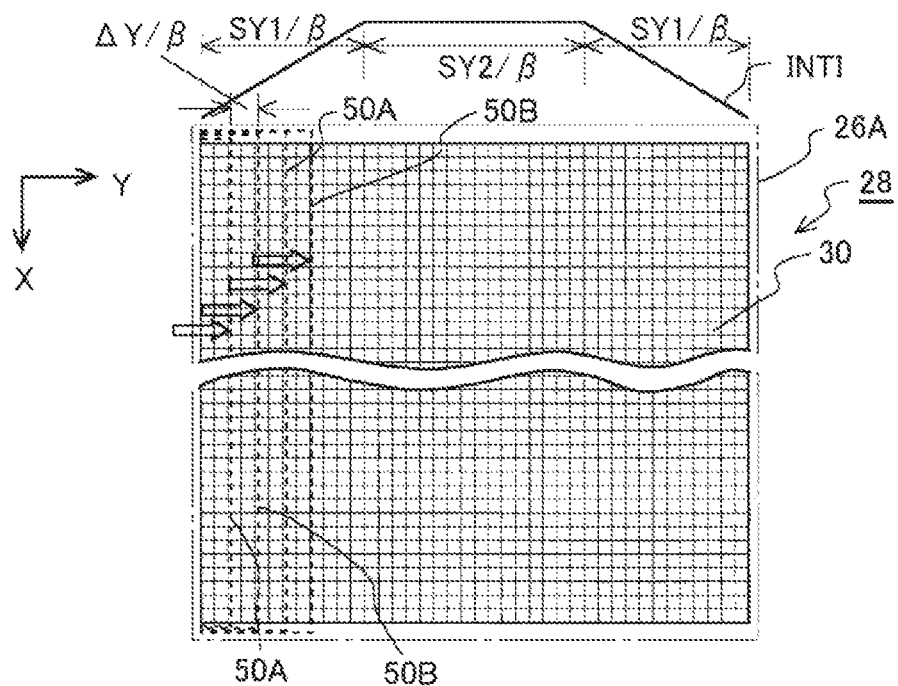

For satisfying the conditions of Expression (9), as shown in FIG. 14B, the Y-directional movement amount of the phase distribution 50A or 50B per pulse emission is set to $\Delta Y/\beta$ ($\beta$ is the projection magnification of the projection optical system PL) in the array of mirror elements 30 in the spatial light modulator 28. In FIG. 14B, the Y-directional intensity distribution INT1 of the illumination area 26A with the illumination light IL is a distribution in which the width of the slant portions of the intensity at the both ends is SY1/$\beta$ and the width of the flat portion of intensity in the center is SY2/$\beta$. From Expression (9), the Y-directional movement amount $\Delta Y/\beta$ of the phase distribution 50A or 50B per pulse emission is the width SY1/$\beta$ of the slant portions of the intensity distribution INT1 divided by the even number.

When the first one-pulse exposure is carried out with the phase distribution 50A being set in the array of mirror elements 30, the next one-pulse exposure is carried out with the phase distribution 50B being set at the position resulting from Y-directional movement of the first phase distribution 50A by $\Delta Y/\beta$; thereafter, the inverted phase distribution 50A (or 50B) is set at the position resulting from Y-directional movement of the phase distribution 50B (or 50A) by $\Delta Y/\beta$ to carry out the next one-pulse exposure, followed by repetitions of the foregoing operations. Since in the present embodiment the projection optical system PL is assumed to form an erect image, when the scanning direction of the wafer W is the –Y-direction, the phase distributions 50A, 50B also move in the –Y-direction.

Figure 15:
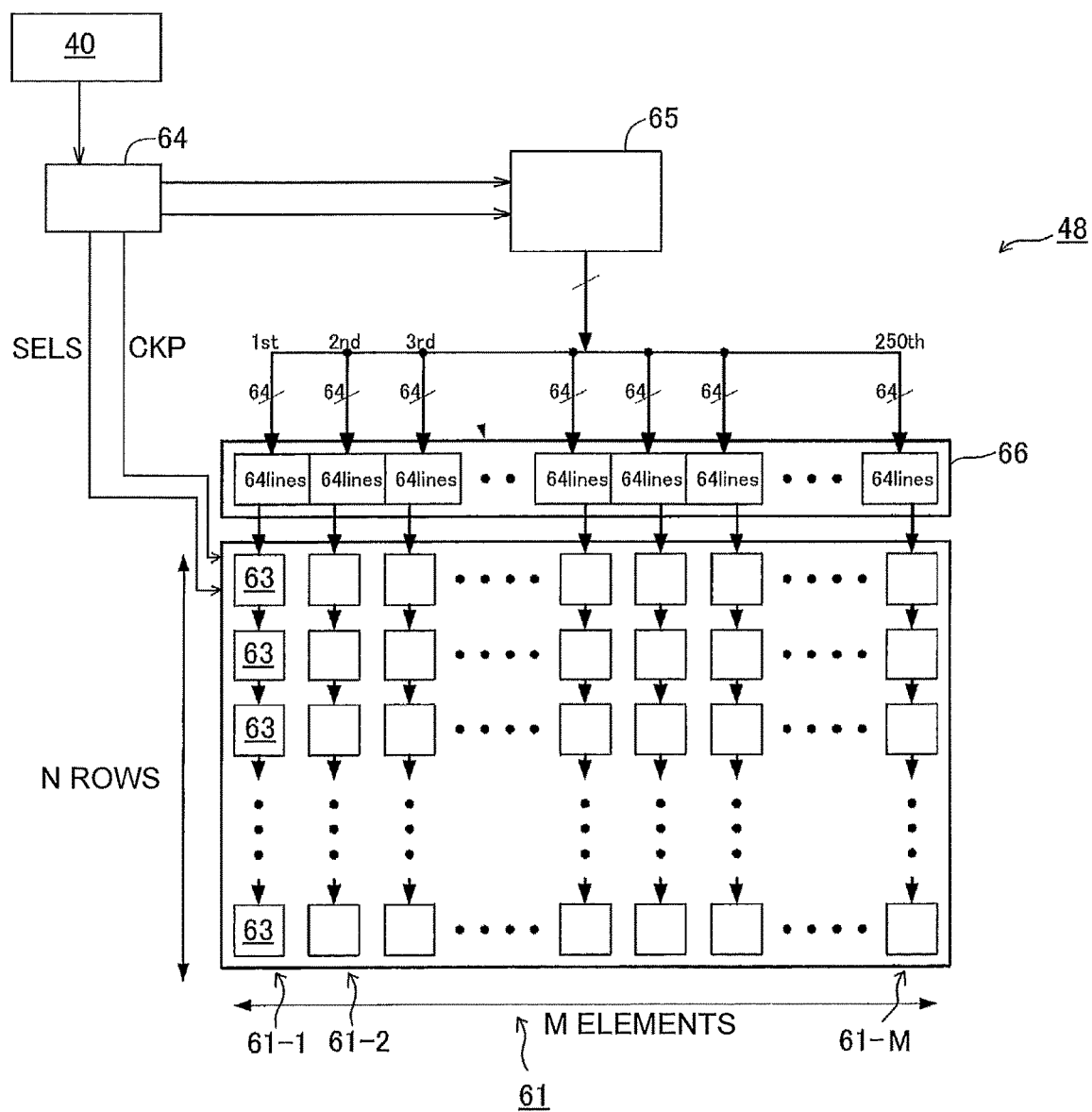
FIG. 15 is a block diagram showing a configuration example of modulation control unit 48 in FIG. 1.

The below will describe a configuration example of the entire modulation control unit 48 of the spatial light modulator 28 in FIG. 1, with reference to FIG. 15. In FIG. 15, the modulation control unit 48 is provided with a controller 64, a memory 65 storing data of phase distribution, a shift register circuit section 61, and a multiplexer section 66 for converting, for example, 64-bit phase data read from the memory 65, into plural sets of parallel outputs and feeding the outputs to the shift register circuit section 61. Since the shift register circuit section 61 and the multiplexer section 66 can be disposed on the base member 32 of the spatial light modulator 28, the shift register circuit section 61 and the multiplexer section 66 are regarded as a part of the spatial light modulator 28 in the present embodiment. The mirror elements 30 in the spatial light modulator 28 are arranged in M columns in the X-direction and N rows in the Y-direction (cf. FIG. 17A). The shift register circuit section 61 is a section in which M columns of shift registers 61-$j$ (j=1, 2, . . . , M) for driving N rows of mirror elements 30 in the spatial light modulator 28 as a whole are arranged in parallel. As an example, M is 16000 (=64×250) and N 2000. Each shift register 61-$j$ is of a serial-input and parallel-output type to process N-bit phase data.

Each shift register 61-$j$ is composed of connected circuit units 63 each of which consists of one flip-flop 60A or the like, one flip-flop to transfer data in the reverse direction (not shown), and one selection circuit 62A or the like to select an output signal from the flip-flops 60 or the like, as shown in FIG. 2B. The controller 64 writes information of phase distribution from the main control system 40 in FIG. 1 into the memory 65. Furthermore, the controller 64 supplies to the memory 65 and each shift register 61-$j$, clock pulses CKP, which are, for example, ns times (ns is an integer and, for example, ns=20) the frequency of emission trigger pulses TP supplied from the main control system 40, to shift data of phase distribution for one line of mirror elements 30 (M elements) sequentially read out of the memory 65, in each shift register 61-$j$. When the frequency of pulse emissions from the light source 2 is, for example, 2 MHz and the integer ns, e.g., 20, the frequency of clock pulses CKP is 40 MHz. Furthermore, the controller 64 supplies the selection signal SELS the level of which is inverted every emission trigger pulse TP, to the selection circuit 62A or the like in each circuit unit 63. This causes the phase distribution set in the array of mirror elements 30 to be inverted while shifting in the Y-direction, every pulse emission of the illumination light IL.

The below will describe an example of operation to perform scanning exposure of the wafer W while controlling the phase distribution set in the array of mirror elements 30 in the spatial light modulator 28, in the exposure apparatus EX of the present embodiment, with reference to FIG. 16. It is assumed herein that the spatial image of the phase distribution 50A in FIG. 6A and the spatial image of the phase distribution 50B in FIG. 6B as the inversion of the phase distribution 50A are alternately transferred by exposure in a part of each shot area on the wafer W. It is assumed for convenience' sake of description that the wafer W is scanned in the −Y-direction and the shift register circuit section 61 in FIG. 15 sequentially moves the phase data in the −Y-direction.

Figure 16:
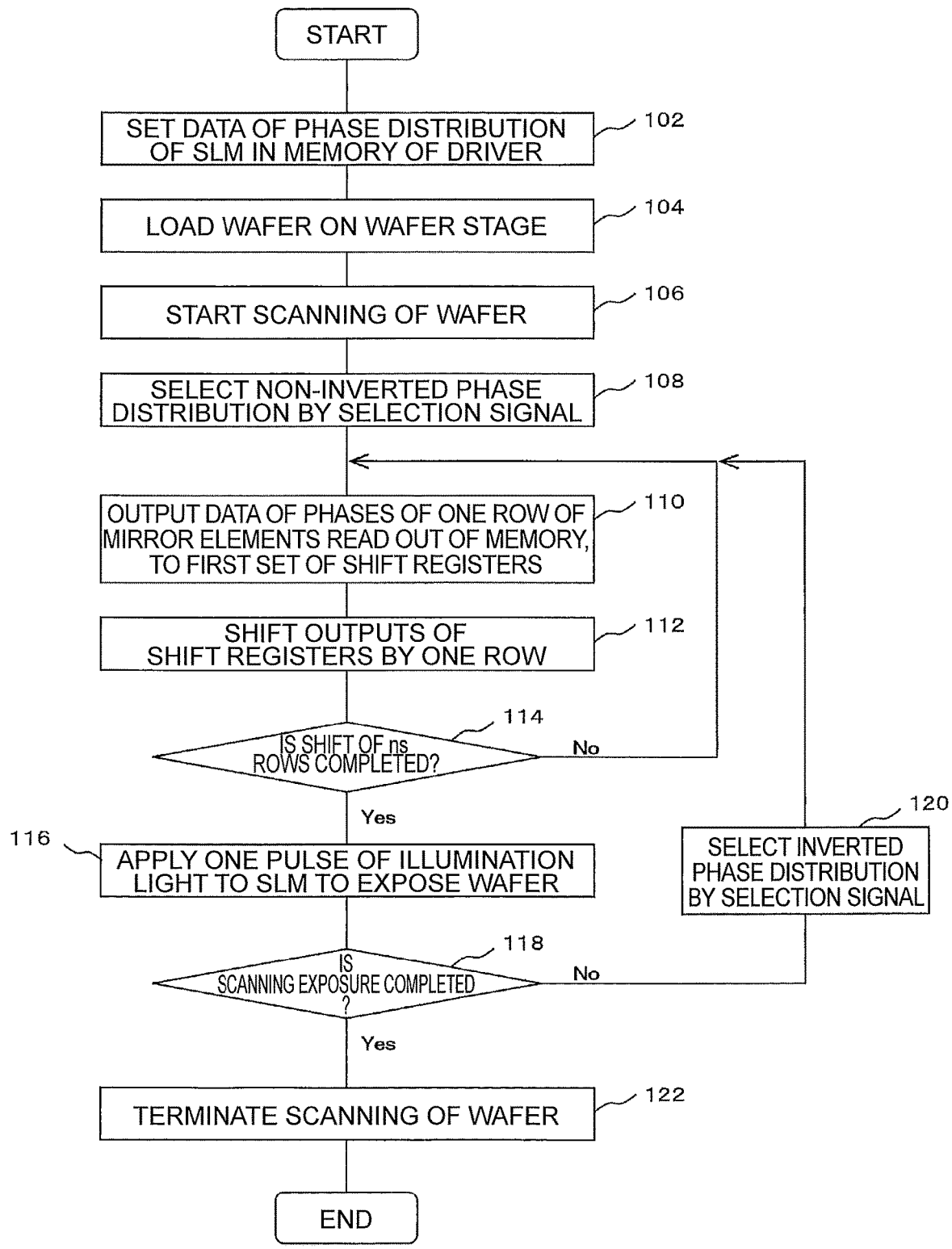
FIG. 16 is a flowchart showing an example of operation of implementing exposure while driving the spatial light modulator.

First, in step 102 in FIG. 16, the main control system 40 supplies the data of the phase distribution 50A for the array of mirror elements 30 in the spatial light modulator (SLM) 28 corresponding to the spatial image to be transferred by exposure on the wafer W, to the controller 64 of the modulation control unit 48. The controller 64 writes the data into the memory 65. In next step 104, the wafer W coated with a photoresist is loaded on the wafer stage WST and in next step 106, the scanning in the −Y-direction of the wafer W is started by the wafer stage WST. In next step 108, the controller 64 sets the selection signal SELS to the level of selecting the phase distribution 50A (non-inverted phase distribution).

In next step 110, the controller 64 outputs data of phases (0 or π) for one row of mirror elements 30 arranged in the X-direction, which is read out of the memory 65, to each shift register 61-$j$ (j=1, 2, . . . , M). In next step 112, the controller 64 outputs one clock pulse CKP to advance the data to the subsequent-stage flip-flop in each shift register 61-$j$ in the shift register circuit section 61. Thereafter, it is determined in step 114 whether the phase data is shifted by ns rows (ns is, for example, 20) and, when the shift of ns rows is not achieved yet, the operation returns to step 110 to repeat the operation of steps 110 and 112.

Figure 17A:
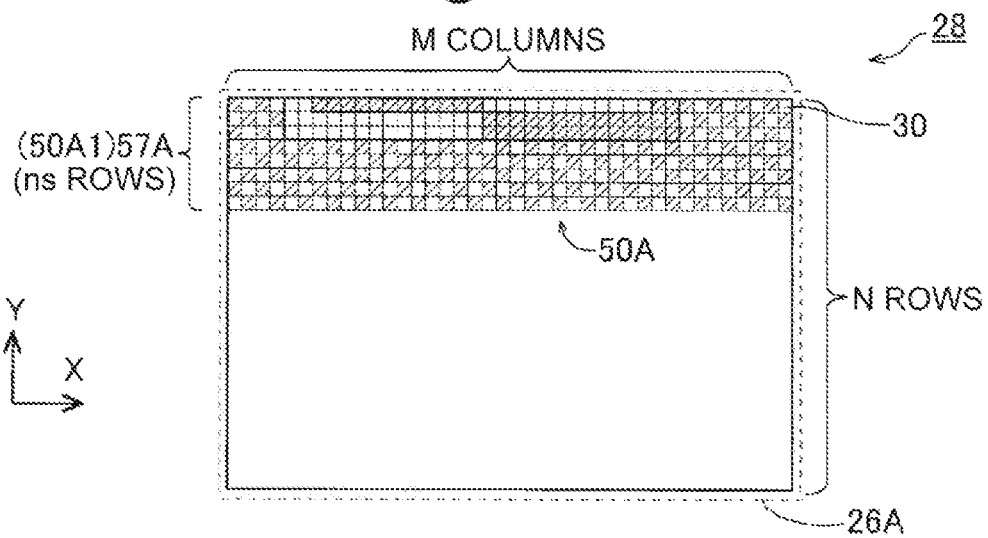
FIGS. 17A, 17B, and 17C are drawings showing respective states of movement of phase distribution in the scanning direction on the array of mirror elements 30 in the spatial light modulator.

Thereafter, when the phase data is shifted by ns rows, the operation transfers to step 116 and the main control system 40 supplies the emission trigger pulse TP to the power unit 42 to make the light source 2 emit one pulse to illuminate the illumination area 26A including the array of mirror elements 30 in the spatial light modulator 28, as shown in FIG. 17A. At this time, a partial phase distribution 50A1 of the phase distribution 50A is set in a first region 57A of ns rows from the +Y-direction in the array of mirror elements 30 and the wafer W is exposed with a spatial image of the phase distribution 50A1. It is noted that in FIG. 17A and others, the ns rows are illustrated as seven rows and the number of mirror elements 30 in the array is illustrated as being much smaller than the actual number. It is determined in next step 118 whether one scanning exposure process is completed. When the scanning exposure is continued, the operation moves to step 120 in which the controller 64 sets the selection signal SELS to the level of selecting the phase distribution (the phase distribution 50B herein) opposite to the preceding one. After that, the operation returns to step 110.

Figure 17B:
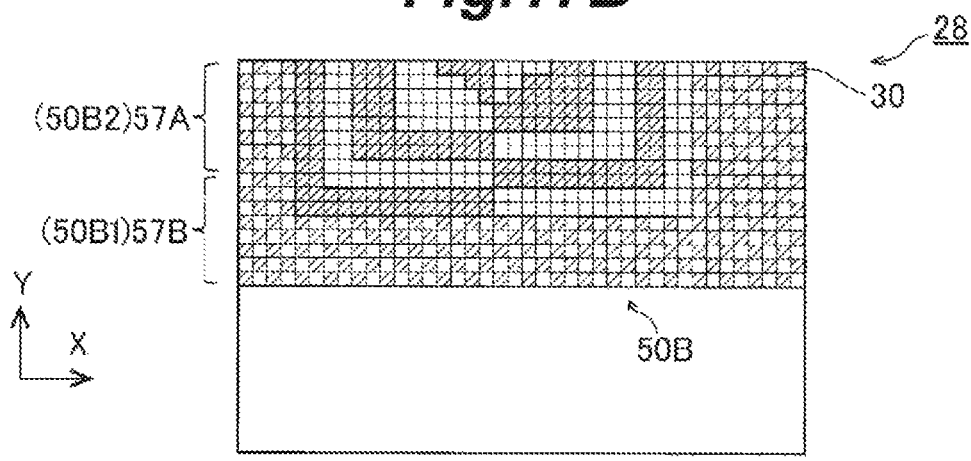

In steps 110 to 114 after execution of this step 120, the operation of outputting the phase data to the first-stage flip-flop in each shift register 61-$j$ and shifting the phase data in the shift register is also repeated ns times. In step 116 after that, one pulse of illumination light IL is emitted to expose the wafer W with spatial images of partial phase distributions 50B2, 50B1 of the inverted phase distribution 50B set in the first region 57A and second region 57B of ns rows from the +Y-direction on the array of mirror elements 30, as shown in FIG. 17B. In this case, the phase distribution 50B1 in the second region 57B is a distribution resulting from inversion of the phases of the phase distribution 50A1 in the first region 57A in FIG. 17A.

Figure 17C:
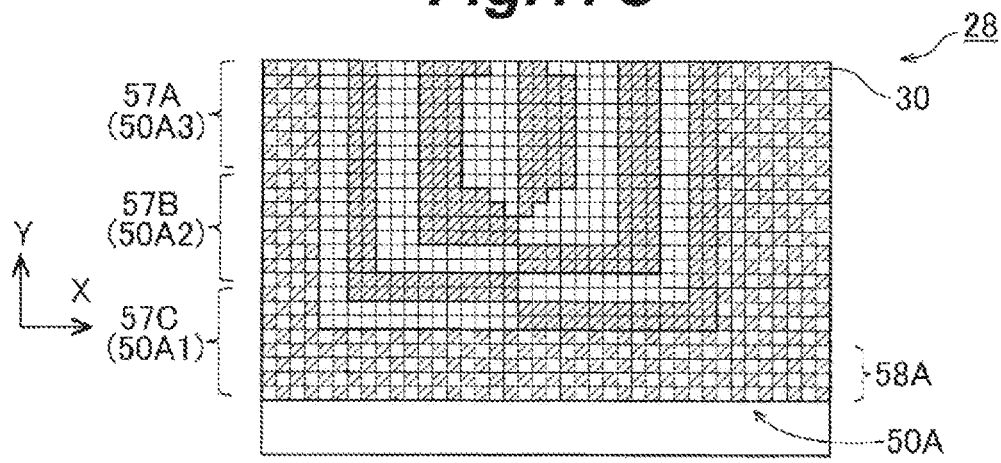
Figure 18A:
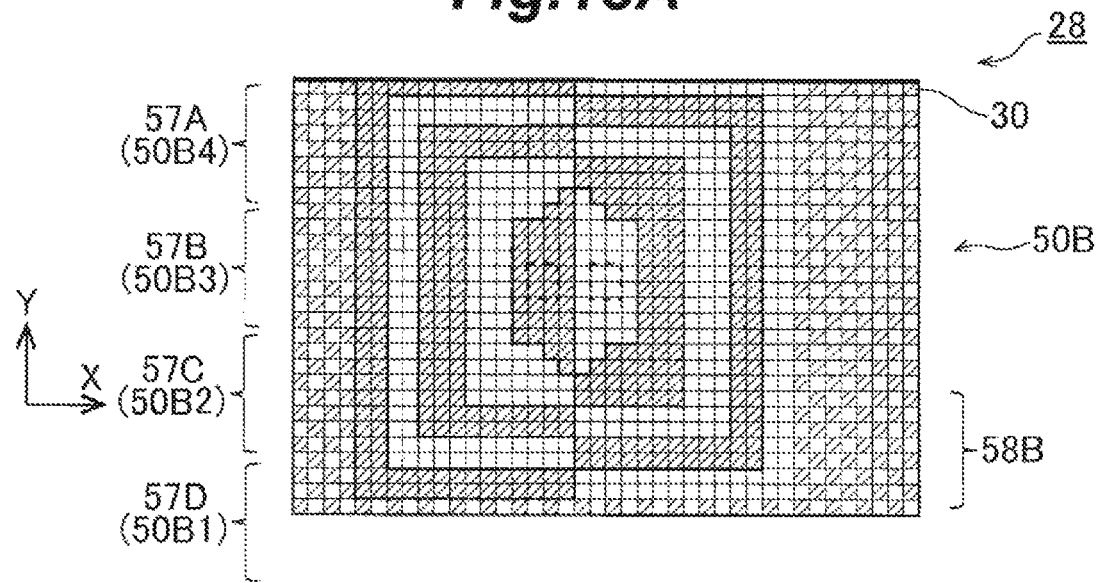
FIGS. 18A and 18B are drawings showing respective states of movement of phase distribution in the scanning direction on the array of mirror elements 30 in the spatial light modulator, subsequent to FIG. 17C.
Figure 18B:
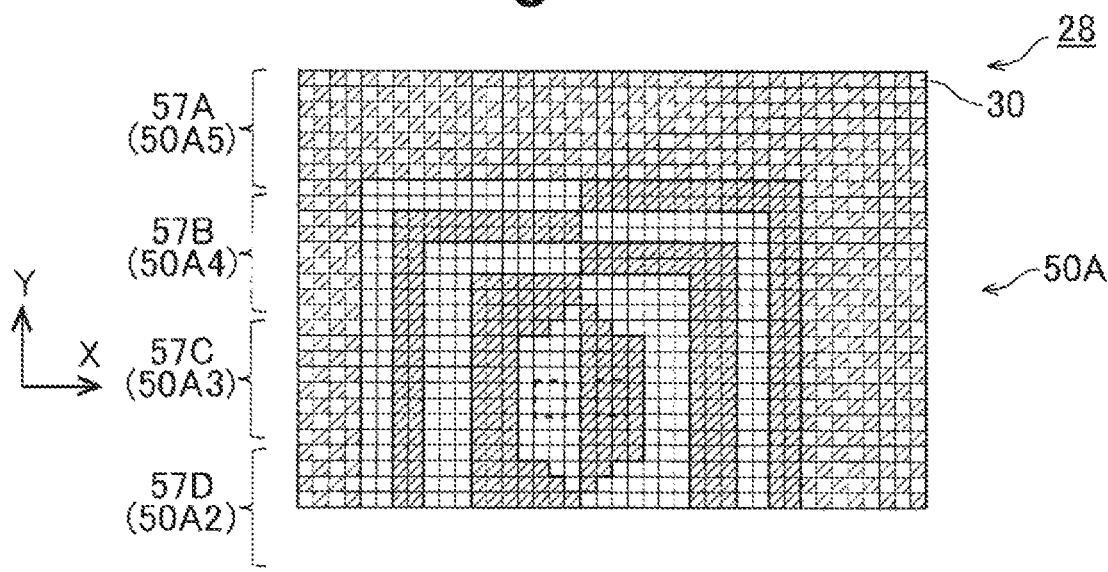

By the next operation of steps 120, and 110 to 116, the wafer W is exposed with spatial images of partial phase distributions 50A3 to 50A1 of the phase distribution 50A set in the first region 57A to third region 57C of ns rows from the +Y-direction on the array of mirror elements 30, as shown in FIG. 17C. On this occasion, the phase distribution 50A being the phase distribution opposite to the preceding one is selected in step 120. By the next operation of steps 120, and 110 to 116, the wafer W is exposed with spatial images of partial phase distributions 50B4 to 50B1 of the inverted phase distribution 50B set in the first region 57A to fourth region 57D of ns rows from the +Y-direction on the array of mirror elements 30, as shown in FIG. 18A. However, a part of the fourth region 57D is located outside the array of mirror elements 30 and the data as an inversion of the phase distribution in a region 58A at an end in FIG. 17C is not used in FIG. 18A. Similarly, by the next operation of steps 120, and 110 to 116, the wafer W is exposed with spatial images of partial phase distributions 50A5 to 50A2 of the phase distribution 50A set in the first region 57A to fourth region 57D on the array of mirror elements 30, as shown in FIG. 18B. In this case, the data as an inversion of the phase distribution in a region 58B at an end in FIG. 18A is not used, either.

In this manner, the wafer W is alternately exposed by scanning exposure with the spatial images of the phase distributions 50A, 50B. After completion of the scanning exposure in step 118, the operation moves to step 122 to halt the wafer stage WST. Thereafter, for example, the wafer stage WST is stepwise moved in the X-direction and, with change of the scanning direction to the opposite direction, the operation of steps 106 to 122 is then repeated. Since on this occasion the present embodiment involves alternately performing the scanning exposure with the phase distributions 50A, 50B, even if there is the systematic error ΔZ of the height of the reflective surfaces of the mirror elements 30, the exposure can be carried out with high accuracy by the maskless method while suppressing the influence of the error.

The effects and others of the present embodiment are as described below.

(1) The exposure apparatus EX of the present embodiment is provided with the spatial light modulator 28. The driving method of the spatial light modulator 28 by the modulation control unit 48 is the method of driving the spatial light modulator 28 with the array of mirror elements 30 (optical elements) each of which can guide the illumination light IL to the projection optical system PL. This driving method includes the step (this step corresponds to steps 110 to 114 after execution of step 108) of setting, in the array of mirror elements 30, the mirror elements 30A in the first state for guiding reflected light of incident light without change in phase (in the first phase δ1 of 0) to the projection optical system PL and the mirror elements 30B in the second state for guiding reflected light of incident light with change in phase by the second phase δ2 (δ2 is approximately 180° where M is 0) different approximately 180° from the first phase δ1 to the projection optical system PL, to the first arrangement with the phase distribution 50A. Furthermore, the driving method includes the step (this step corresponds to steps 110 to 114 after an odd number of times of execution of step 120) of setting, in the array of mirror elements 30, the mirror elements 30A and the mirror elements 30B to the second arrangement with the phase distribution 50B which is the inversion of the phase distribution 50A.

The mirror elements 30A in the first state may guide the reflected light with the phase changed by the first phase δ1 of an arbitrary value relative to the phase of incident light to the projection optical system PL.

The spatial light modulator 28 has: the array of mirror elements 30 each of which is to be illuminated with light; the flip-flops 60A, 60B (first circuits) which output the first signal to set the state of the mirror elements 30 to the first state (the state of the mirror elements 30A) or the second signal to set the state of the mirror elements 30 to the second state (the state of the mirror elements 30B); the multiplexer section 66 (control circuit) which controls the output signals from the shift registers 60A, 60B, in order to set, in the first region which is at least a part of the array of mirror elements 30, the arrangement of the mirror elements 30A in the first state and the mirror elements 30B in the second state to the first arrangement; and the selection circuits 62A, 62B (second circuits) which invert the output signals from the flip-flops 60A, 60B, in order to set, in the second region which is at least a part of the array of mirror elements 30, the arrangement of the mirror elements 30A in the first state and the mirror elements 30B in the second state to the second arrangement resulting from the inversion of the optical elements in the first state or in the second state in the first arrangement into the second state or into the first state, respectively.

The exposure apparatus EX is the exposure apparatus for exposing the wafer W (substrate) with the illumination light IL (exposure light) through the projection optical system PL, which has: the light source 2 and the illumination optical system ILS for emitting the illumination light; the spatial light modulator 28 arranged on the object plane side of the projection optical system PL and having the array of mirror elements 30 (optical elements) each of which can be controlled so as to guide the illumination light IL to the projection optical system PL; and the main control system 40 and the modulation control unit 48 (control device) which control the light source 2 and the spatial light modulator 28. The main control system 40 and modulation control unit 48 set, in the first region which is at least a part of the array of mirror elements 30, the arrangement of the mirror elements 30A in the first state and the mirror elements 30B in the second state to the first arrangement (the phase distribution 50A), in accordance with the spatial image formed on the wafer W through the projection optical system PL, implement of exposure of the wafer W, set, in the second region which is at least a part of the array of mirror elements 30, the arrangement of the mirror elements 30A and 30B to the second arrangement (the phase distribution 50B) which is the inversion of the first arrangement, and implement overlay exposure of the wafer W.

The present embodiment includes setting the mirror elements 30A, 30B to the first arrangement in the first region of the array of mirror elements 30 and setting the mirror elements 30A, 30B to the second arrangement which is the inversion of the first arrangement in the second region of the array of mirror elements 30, and the systematic error ΔZ of the height of the reflective surfaces occurring in the mirror elements 30 in the first arrangement has the sign opposite to that of the systematic error (−ΔZ) occurring in the mirror elements 30 in the second arrangement. For this reason, the influence of the systematic error ΔZ is alleviated when the wafer W is exposed by overlay exposure with the light from the mirror elements 30 in the first arrangement and with the light from the mirror elements 30 in the second arrangement. Furthermore, when there is light reflected by the gap regions 34a between the mirror elements 30, the influence of the reflected light from the gap regions 34a on the spatial image is also alleviated.

(2) Since the spatial light modulator 28 has the mirror elements 30 (reflective elements) as optical elements, it has high efficiency of utilization of the illumination light IL. It is also possible, however, to use a transmission type spatial light modulator each of individual optical elements of which changes the phase of transmitted light by predetermined φ1 or approximately (φ1+180°, in place of the spatial light modulator 28. Such optical elements applicable herein can be electro-optic elements which vary the refractive index by voltage, or liquid crystal cells or the like.

(3) The exposure method by the exposure apparatus EX according to the present embodiment is the exposure method of exposing the wafer W (substrate) with the illumination light IL (exposure light) via the spatial light modulator 28 with the array of mirror elements 30 and via the projection optical system P1, which includes the steps 110 to 114 of setting the arrangement of states of the mirror elements 30 by the aforementioned driving method of the spatial light modulator 28, and the step 116 of implementing overlay exposure of the wafer W with the illumination light IL from the illumination area 26A including the first region and the second region of the array of mirror elements 30 via the projection optical system PL, in the state in which the mirror elements 30 are set in the first arrangement and in the state in which the mirror elements 30 are set in the second arrangement as the inversion of the first arrangement.

By the exposure method or the foregoing exposure apparatus EX, various patterns can be formed with high accuracy by the maskless method while alleviating the influence of the systematic error of the mirror elements 30 and/or the influence of the reflected light from the gap regions 34*a* between the mirror elements 30.

Each mirror element 30 in the spatial light modulator 28 may be configured so that it can be set in a plurality of states including a third state and other states except for the first state and the second state.

(4) The illumination light IL from the illumination optical system ILS is obliquely incident approximately at the angle of incidence α to the mirror elements 30 and the reflected light from the mirror elements 30 is incident into the projection optical system PL so as to intersect with the optical axis AXW of the projection optical system PL. Therefore, the projection optical system PL is non-telecentric on the object plane side, and thus the whole of reflected light from the spatial light modulator 28 can be applied onto the wafer W through the projection optical system PL, achieving high efficiency of utilization of the illumination light IL. Furthermore, the polarization state of the illumination light IL set by the polarization control optical system 6 can be accurately reproduced on the surface of the wafer W.

(5) The mirror elements 30 are disposed in the rectangular region whose longitudinal direction is the X-direction, the exposure apparatus EX has the wafer stage WST (substrate stage) for moving the wafer W in the scanning direction corresponding to the Y-direction perpendicular to the X-direction on the image plane of the projection optical system P1, and the modulation control unit 48 moves the patterns (phase distribution) formed by the mirror elements 30, in the Y-direction, according to the movement of the wafer W by the wafer stage WST. This allows efficient exposure over the entire surface of the wafer W.

The aforementioned embodiment can be modified as in modifications below.

Figure 14C:
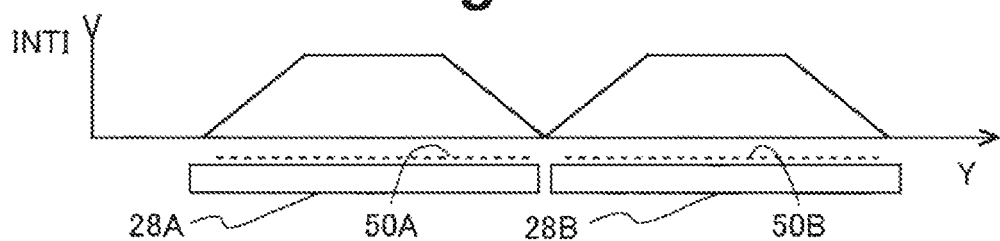

First, instead of alternately setting the phase distributions 50A, 50B by the array of mirror elements 30 in one spatial light modulator 28 as in the present embodiment, it is also possible to adopt a method of arranging two spatial light modulators 28A, 28B adjacent to each other in the Y-direction on the object plane of the projection optical system PL, setting only the first phase distribution 50A or the like in one spatial light modulator 28A, and setting only the second phase distribution 50B or the like in the other spatial light modulator 28B, as shown in a modification example of FIG. 14C. In this modification example, the intensity distribution INT1 of the illumination light IL is set in the trapezoidal shape in the Y-direction in each of the spatial light modulators 28A, 28B. Moreover, the phase distributions 50A, 50B or the like move in the Y-direction every pulse emission in each of the spatial light modulators 28A, 28B. Furthermore, spatial light modulators may be arranged as many as an even number larger than 2 so that the number of spatial light modulators set in the first phase distribution 50A becomes equal to the number of spatial light modulators set in the second phase distribution 50B. For example, the number of spatial light modulators may be 2, 4, 6, or an even number larger than it.

Likewise, it is also possible to adopt a method of dividing one spatial light modulator into two regions, first half and second half, setting only the first phase distribution 50A or the like in the first half region, and setting only the second phase distribution 50B or the like in the second half region. In this modification example, the intensity distribution of the illumination light has a shape of two trapezoids coupled in the Y-direction corresponding to the first half and the second half of the spatial light modulator. Furthermore, one spatial light modulator may be divided into equal regions as many as an even number equal to or larger than two, and either of the first phase distribution 50A and the second phase distribution 50B is set in each region so that the first phase distributions 50A and the second phase distributions 50B can exist in the same number in the entire region of the spatial light modulator. In this case, the intensity distribution of the illumination light has a shape of trapezoids coupled in the Y-direction as many as the same number as the number of divided regions.

Furthermore, another possible modification is as follows: the array of mirror elements 30 in one spatial light modulator 28 is illuminated with the illumination light IL in an intensity distribution of trapezoidal shapes at two locations as in FIG. 14C, and the first phase distribution 50A or the like and the second phase distribution 50B or the like are set in respective regions of the intensity distribution of the trapezoidal shapes at the two locations.

Next, the influence of the reflected light from the gap regions 34*a* will be discussed based on simulations for the case where the reflectance of the gap regions 34*a* in the array of mirror elements 30 in the spatial light modulator 28 in FIG. 7A is high.

Figure 19A:
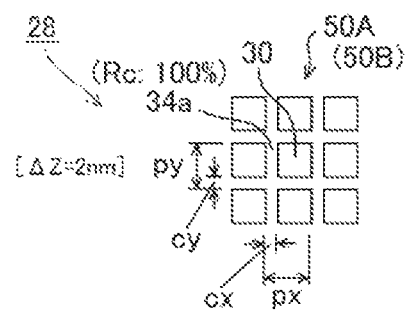
FIG. 19A is an enlarged view showing an arrangement of mirror elements 30 including gap regions.
Figure 19B:
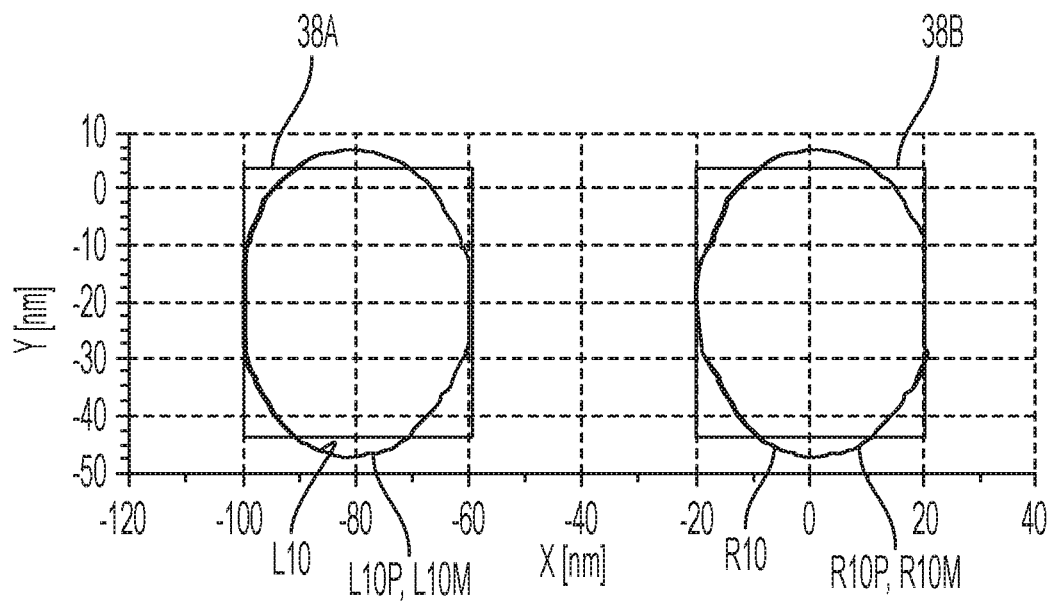
FIGS. 19B, 19C, 19D, and 19E are enlarged views showing resist patterns after double exposure in cases where the gap phase is 0°, 90°, 180°, and 270°, respectively, with the systematic error ΔZ of 2 nm.
Figure 19C:
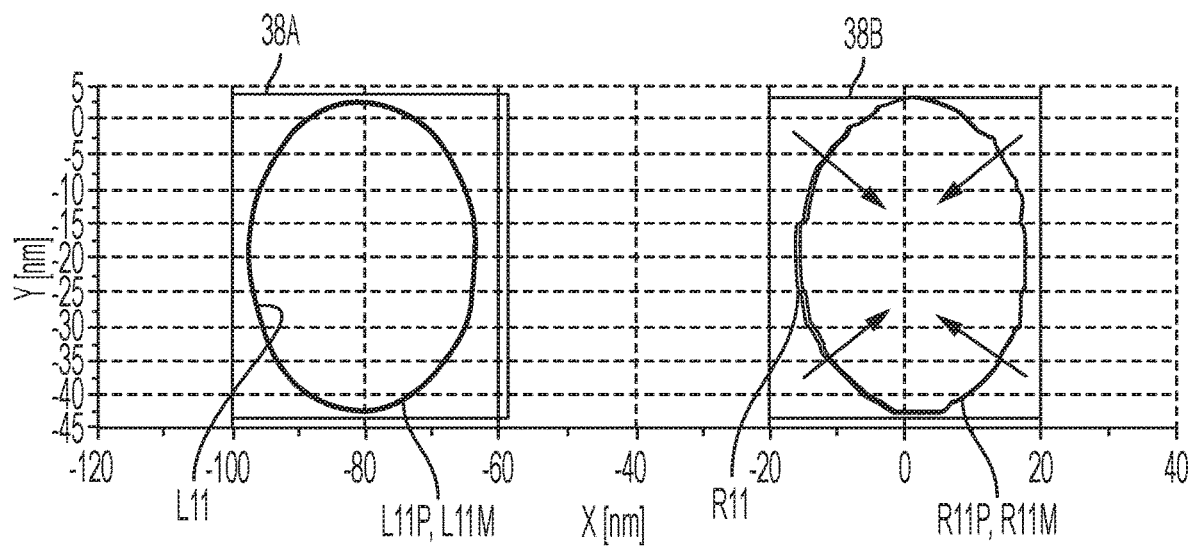
Figure 19D:
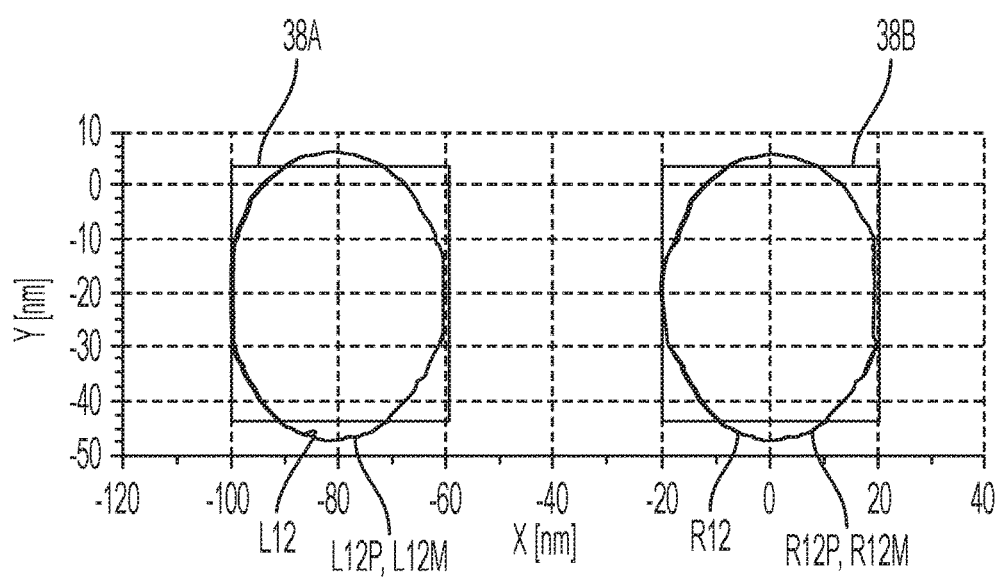
Figure 19E:
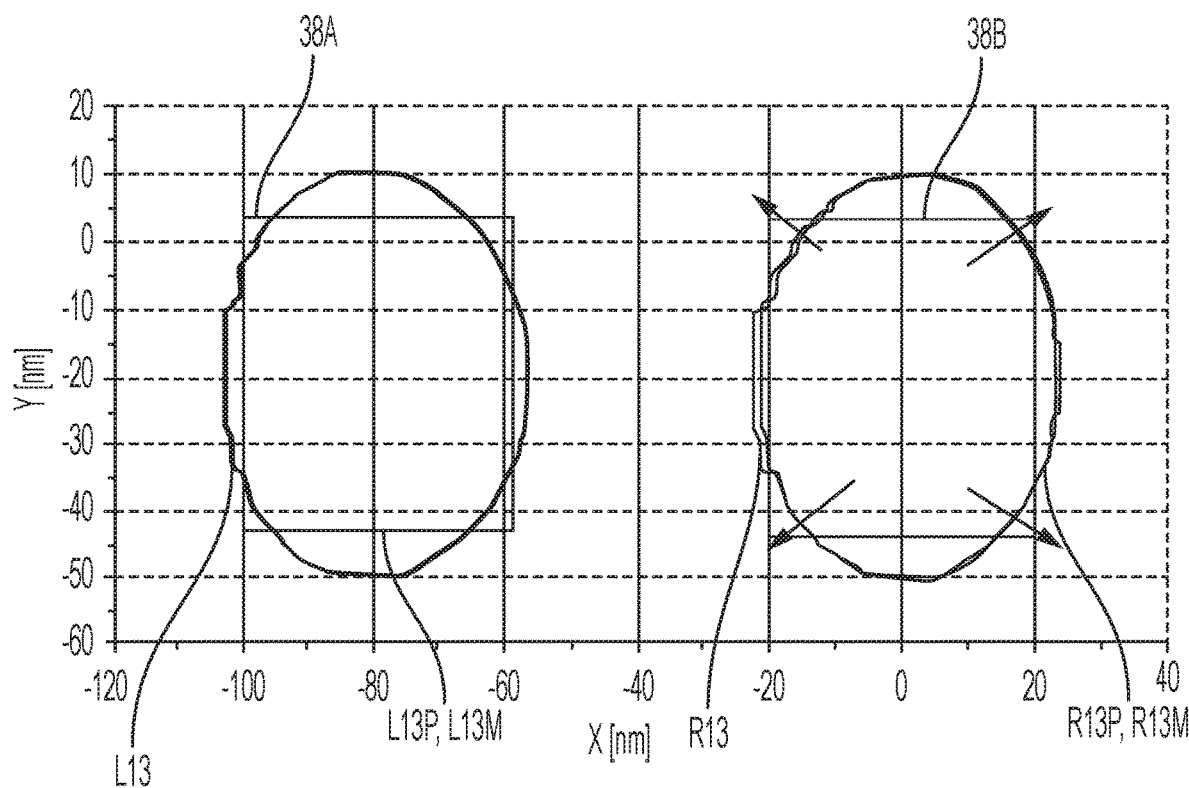
Figure 20A:
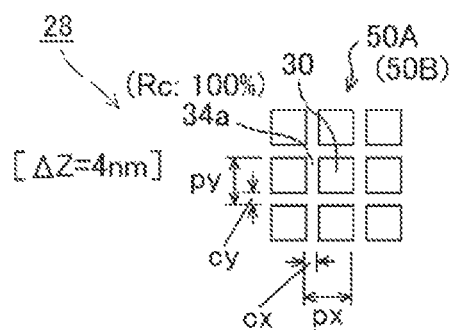
FIG. 20A is an enlarged view showing an arrangement of mirror elements 30 including gap regions.

First, let us assume that, as shown in FIGS. 19A and 20A, the pitches px, py of the arrangement of the array of mirror elements 30 in the spatial light modulator 28 are 8 μm, the widths cx, cy of the gap regions 34*a* are 1 μm, and the reflectance Rc of the gap regions 34*a* is 100%. It is also assumed that when each mirror element 30 is set in the second state (phase π), the systematic error ΔZ in the distance between its reflective surface and the reference plane A1 in FIG. 2B is 2 nm in FIG. 19A and 4 nm in FIG. 20A. Then, simulations were conducted to obtain shape changes of resist patterns (changes with respect to targets 38A, 38B) formed by sequentially setting the phase distribution of the array of mirror elements 30 in the spatial light modulator 28 to the first phase distribution 50A in FIG. 7A and the second phase distribution 50B in FIG. 7C and doubly exposing the wafer W with their spatial images by the projection optical system PL, for each of cases where the gap phase δ3 as the change amount of the phase of the reflected light from the gap regions 34*a* in FIG. 19A or FIG. 20A was set to 0°, 90°, 180°, and 270°. FIGS. 19B to 19E and FIGS. 20B to 20E show the simulation results in the cases where the systematic error ΔZ is 2 nm and 4 nm, respectively. The slice level of each pattern in FIGS. 19 and 20 was determined so that the maximum of the X-directional widths became approximately equal to the target when the reflectance Rc of the gap regions 34*a* was 100% and the systematic error ΔZ 0 nm. This slice level is independent of the gap phase δ3 and thus is the same value.

FIG. 19B shows patterns L10, R10 with the best focus and patterns L10P, R10P, L10M, R10M with the defocuses of ±40 nm in the case of the gap phase δ3 being 0°. FIG. 19C shows patterns L11, R11 with the best focus and patterns L11P, R11P, L11M, R11M with the defocuses of ±40 nm in the case of the gap phase δ3 being 90°. FIG. 19D shows patterns L12, R12 with the best focus and patterns L12P, R12P, L12M, R12M with the defocuses of ±40 nm in the case of the gap phase δ3 being 180°. FIG. 19E shows patterns L13, R13 with the best focus and patterns L13P, R13P, L13M, R13M with the defocuses of ±40 nm in the case of the gap phase δ3 being 270°. It is seen from FIGS. 19B to E that in the case of the systematic error ΔZ being 2 nm, the patterns close to the targets 38A, 38B are obtained with the best focus and with the defocuses when the gap phase δ3 is 0° or 180°.

Figure 20B:
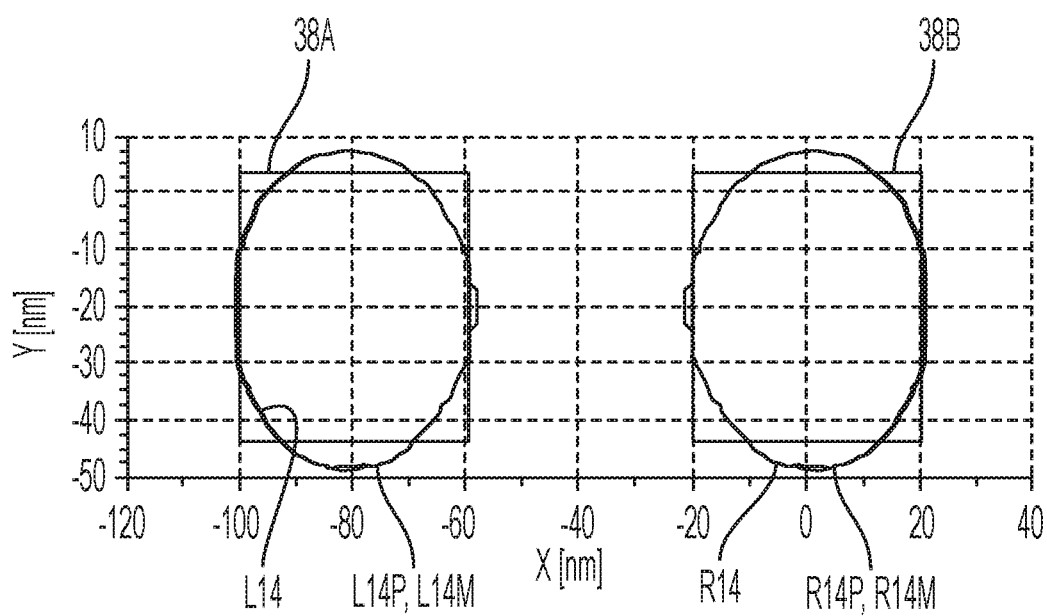
Figure 20C:
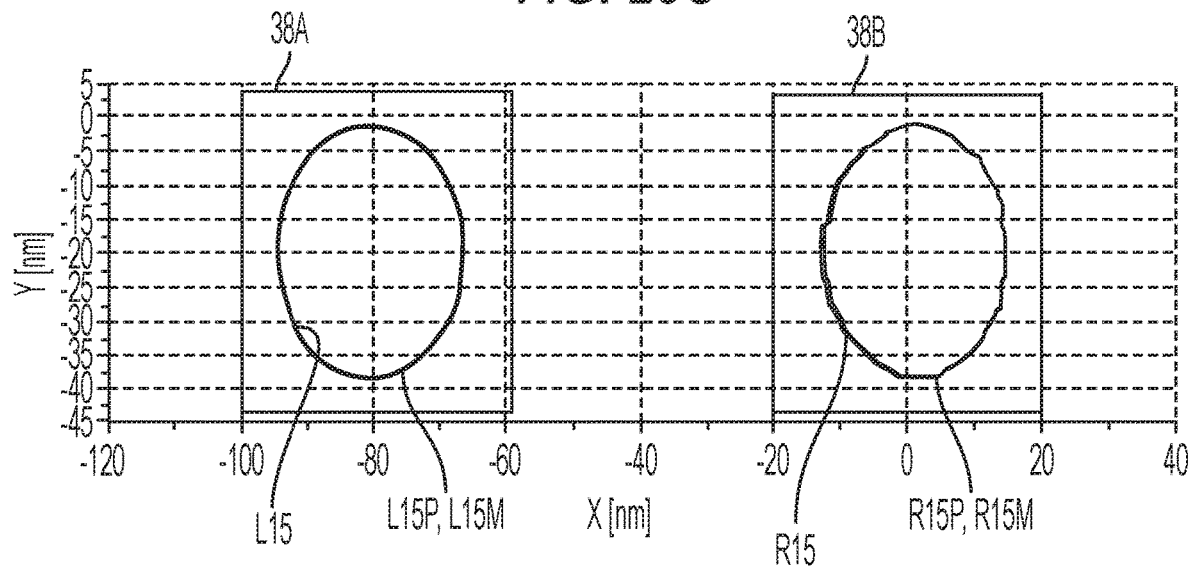
Figure 20D:
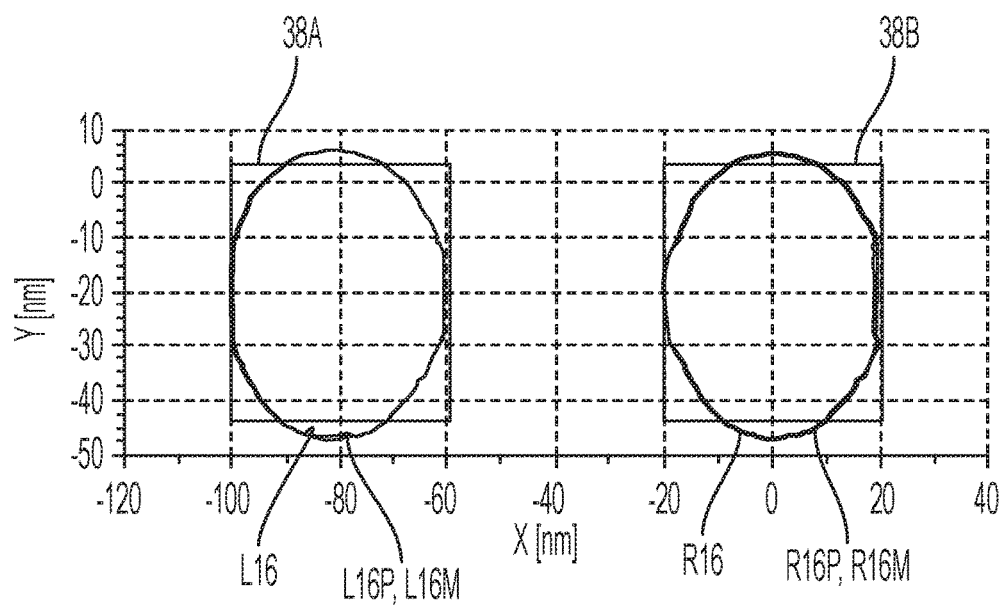

FIG. 20B shows patterns L14, R14 with the best focus and patterns L14P, R14P, L14M, R14M with the defocuses of ±40 nm in the case of the gap phase δ3 being 0°. FIG. 20C shows patterns L15, R15 with the best focus and patterns LISP, R15P, L15M, R15M with the defocuses of ±40 nm in the case of the gap phase δ3 being 90°. FIG. 20D shows patterns L16, R16 with the best focus and patterns L16P, R16P, L16M, R16M with the defocuses of ±40 nm in the case of the gap phase δ3 being 180°. FIG. 20E shows patterns L17, R17 with the best focus and patterns L17P, R17P, L17M, R17M with the defocuses of ±40 nm in the case of the gap phase δ3 being 270°. It is seen from FIGS. 20B to E that in the case of the systematic error ΔZ being 4 nm, the patterns close to the targets 38A, 38B are obtained with the best focus and with the defocuses when the gap phase δ3 is 0° or 180°.

Figure 21:
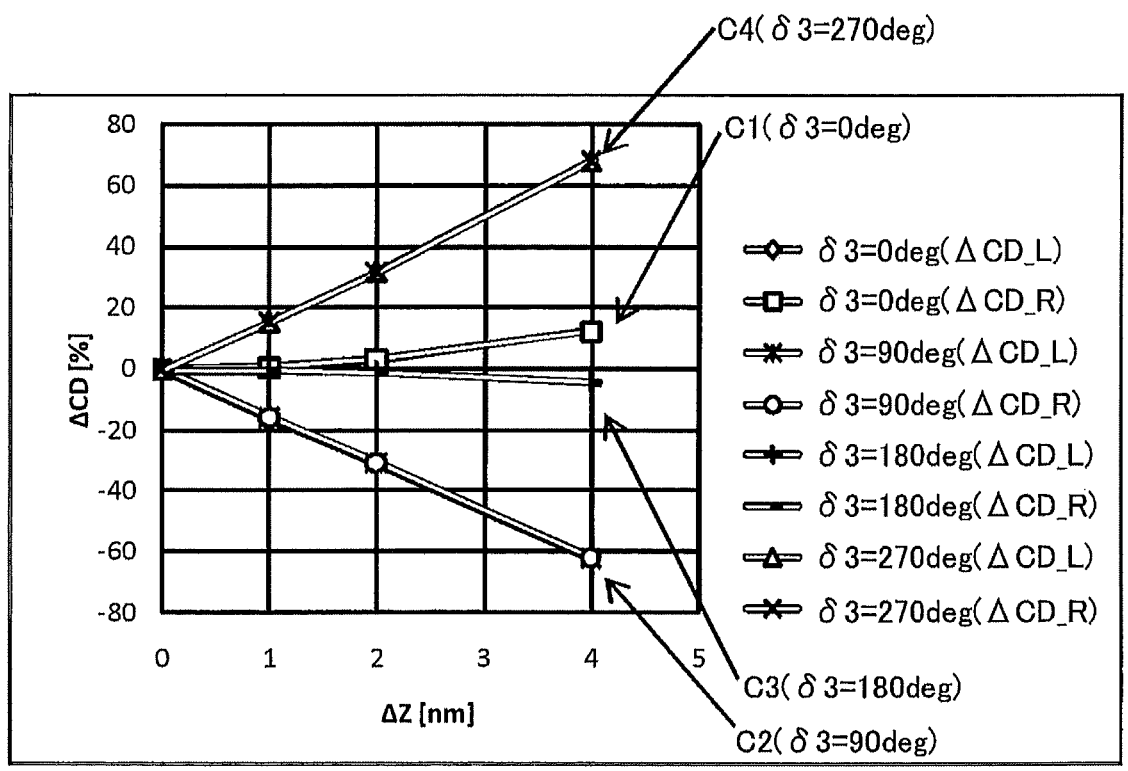
FIG. 21 is a drawing showing an example of relations between systematic errors ΔZ and errors of line widths of resist patterns with different gap phases.

Data sequences C1, C2, C3, and C4 in FIG. 21 are plots of change amounts ΔCD (%) of the line width of resist patterns from the line width (CD) of targets obtained by simulations with variations of the systematic error ΔZ (nm), in the cases where the phase of the reflected light from the gap regions 34a (gap phase δ3) is 0°, 90°, 180°, and 270°, respectively, as in the cases of FIGS. 19B to E. In each of the data sequences C1 to C4, the change amount ΔCD-L of the line width of the left pattern and the change amount ΔCD-R of the line width of the right pattern are superimposed on each other. It is seen from FIG. 21 that in the case of the gap phase δ3 being 0° or 180°, the change amount ΔCD of the line width is small, independent of the systematic error ΔZ. The reason why there is the difference between the change amounts ΔCD of the line width in the cases of the gap phase δ3 being 0° and 180° is that the systematic error ΔZ is given to only the mirror elements 30 in the second state (phase π).

Figure 22:
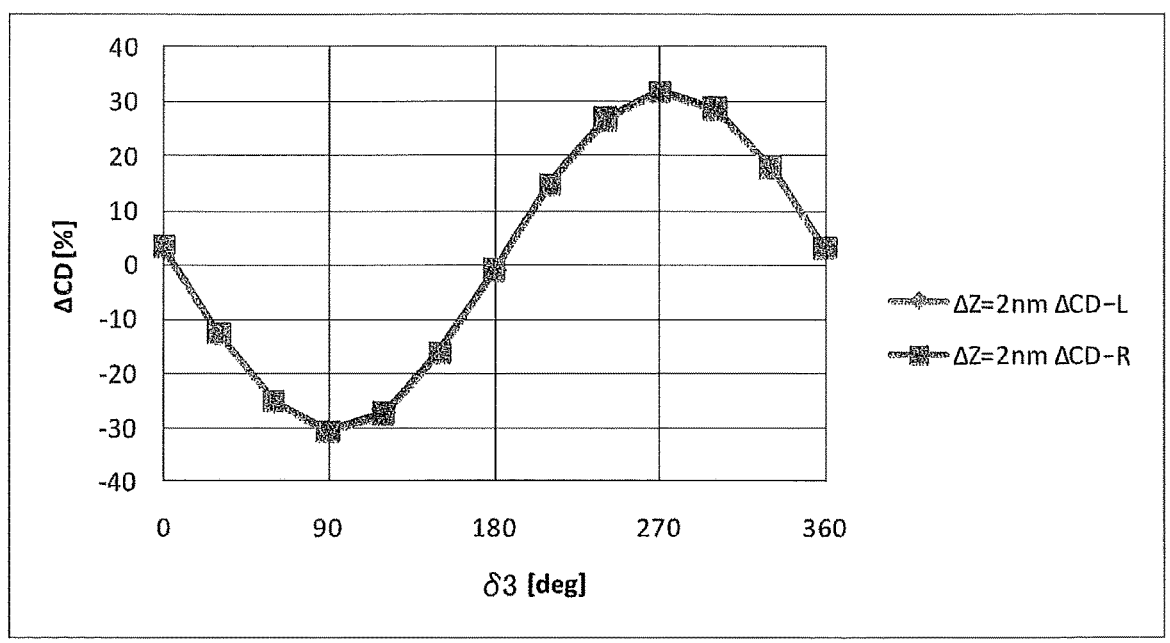
FIG. 22 is a drawing showing an example of change in errors of line widths of resist patterns with variations of the gap phase.

The data sequence in FIG. 22 is plots of change amounts ΔCD (%) of the line width of resist patterns obtained by the same simulations as in FIGS. 19B to E with variations of the gap phase δ3 at 30° intervals and with the systematic error ΔZ of 2 nm. It is also seen from FIG. 22 that ΔCD is close to 0 at the gap phase δ3 of 0° or 180°, so as to allow high-accuracy exposure of a pattern as an object.

Figure 23:
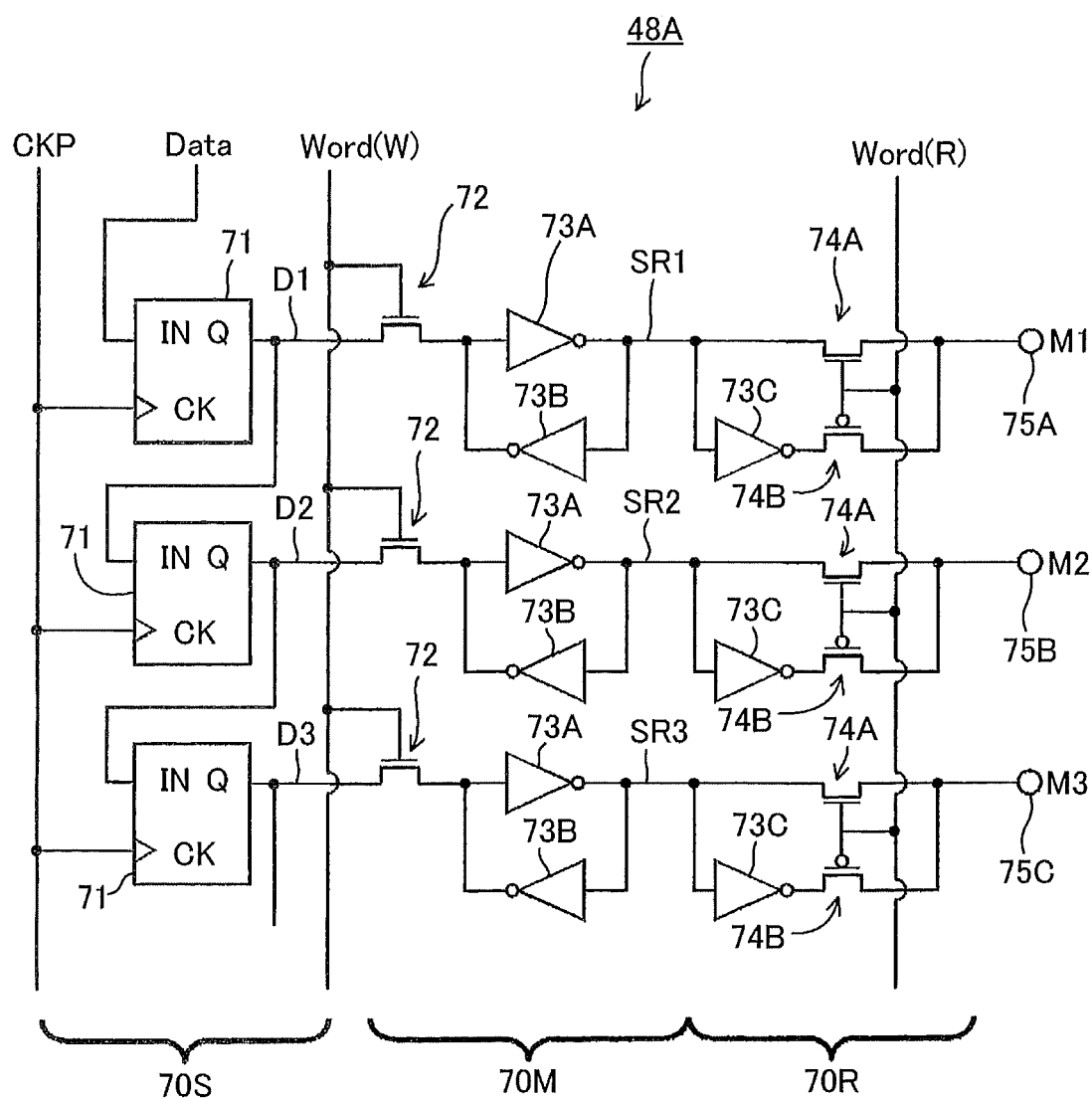
FIG. 23 is a block diagram showing a part of a modulation control unit in a modification example.

Next, modification examples of the modulation control unit 48 in FIG. 1 in the above embodiment will be described with reference to FIGS. 23 to 25. FIG. 23 shows a part of the modulation control unit 48A of the first modification example. In FIG. 23, the modulation control unit 48A has: a shift register section 70S composed of a large number of connected flip-flops 71 (three of which are shown in FIG. 23) to which the clock pulses CKP and phase data Data are supplied; a memory section 70M which holds data D1, D2, D3 output from the shift resister section 70S, in synchronism with a timing pulse Word(W); a 0-π inversion section 70R which outputs signals M1, M2, M3 obtained by inversion of the data SR1, SR2, SR3 held in the memory section 70M in synchronism with an inversion pulse Word(R), to terminals 75A, 75B, 75C; and the controller 64 and memory 65 in FIG. 15. The signals at the terminals 75A, 75B are supplied, for example, to the electrodes 36A for driving the mirror elements 30 in FIG. 2B. The signal at the other terminal 75C is also supplied to the electrode (not shown) for driving the other mirror element 30. The clock pulses CKP, write pulse Word(W), and inversion pulse Word(R) are output from the controller 64 in FIG. 15 and, the phase data Data from the memory 65 in FIG. 15.

The memory section 70M is provided with three FETs 72 to which the respective data D1 to D3 output from the shift register section 70S are supplied and to gates of which the write pulse, pulse Word(W), is supplied, and three sets of two ring-coupled inverters 73A, 73B, and each of respective outputs of the FETs 72 is supplied to an interconnection of inverters 73A, 73B. The 0-π inversion section 70R is provided with FETs 74A and inverters 73C to which the respective data SR1 to SR3 written in the memory section 70M in synchronism with the write pulse Word(W) are supplied, and is provided with FETs 74B which connect outputs of the inverters 73C to the terminals 75A to 75C. Outputs of the FETs 74A are also connected to the terminals 75A to 75C and the inversion pulse Word(R) is supplied to gates of the FETs 74A and to input-inverting gates of the FETs 74B.

Figure 24:
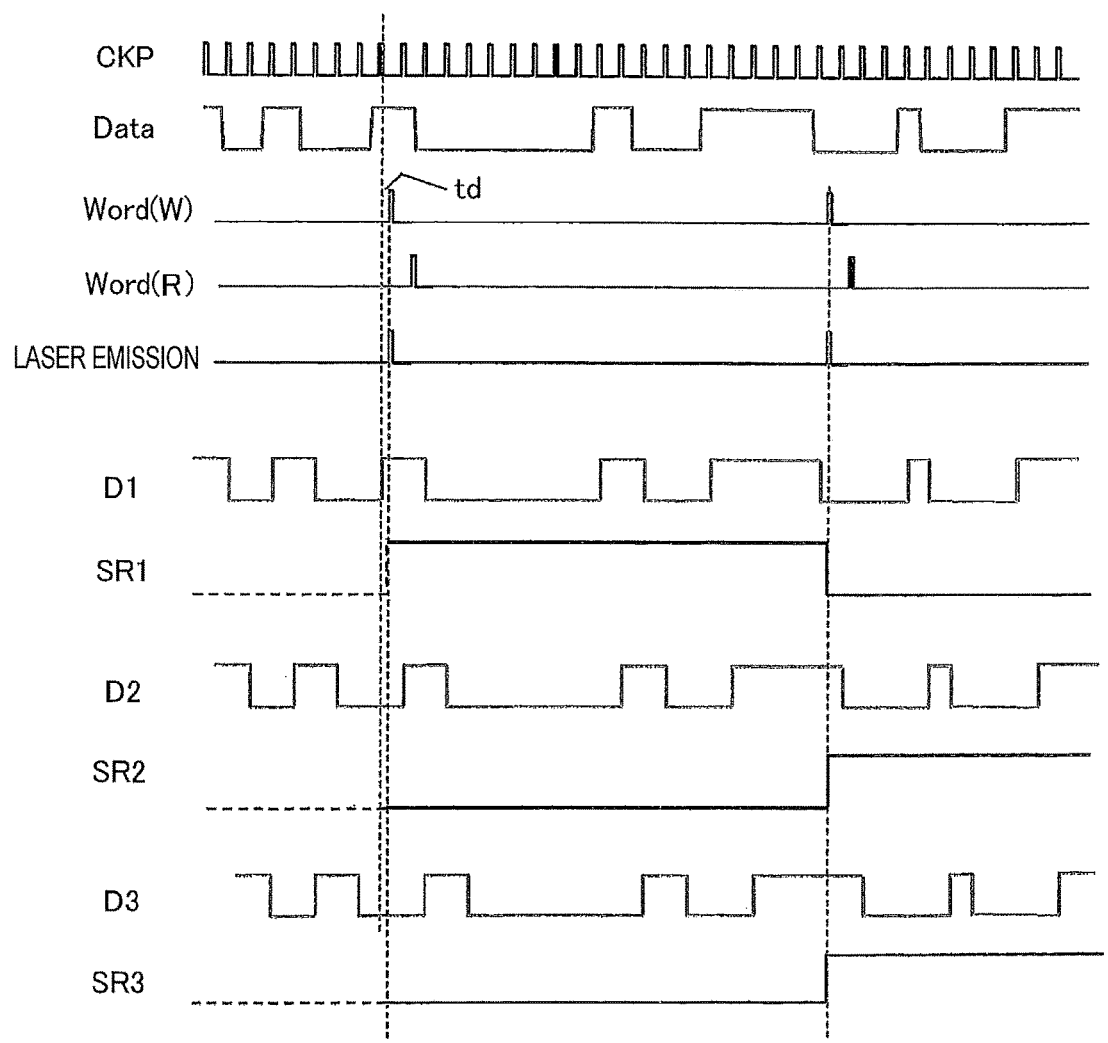
FIG. 24 is a drawing showing a relation of signals in FIG. 23.

FIG. 24 shows an example of timing from the clock pulses CKP to the data SR3 in FIG. 23. In FIG. 24, a predetermined time delay td is set for the write pulse Word(W) for holding the phase data and for the emission of illumination light IL (laser light) with respect to a clock pulse CKP. In the modulation control unit 48A, the phase distribution of the array of mirror elements 30 in the spatial light modulator 28 can be readily inverted on a periodic basis by the aforementioned timing.

Figure 25:
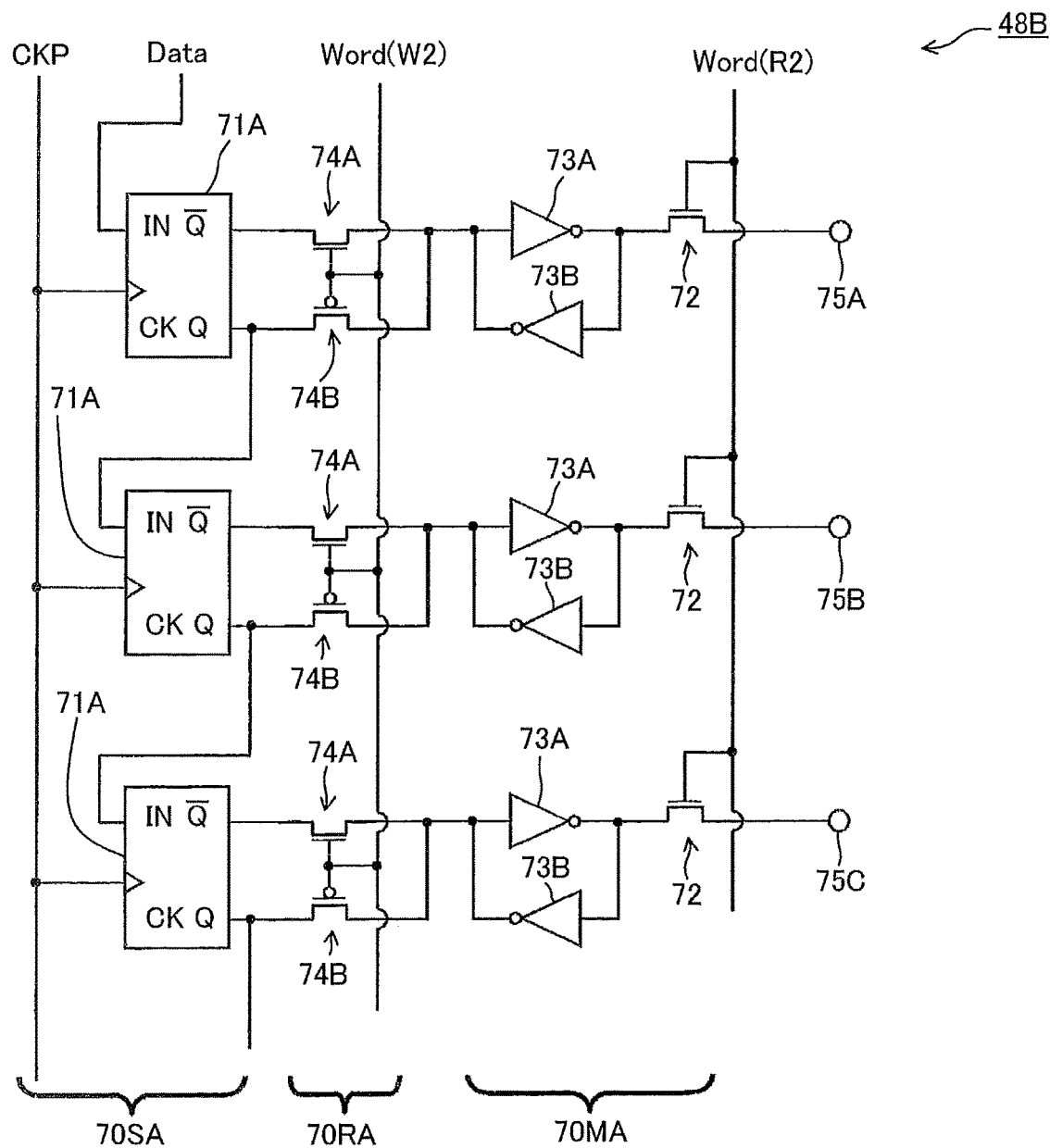
FIG. 25 is a block diagram showing a part of a modulation control unit in another modification example.

Next, FIG. 25 shows a part of the modulation control unit 48B of the second modification example. In FIG. 25, portions corresponding to those in FIG. 23 are denoted by the same reference signs, and the detailed description thereof is omitted herein. In FIG. 25, the modulation control unit 48B is provided with a shift register section 70SA composed of a large number of connected flip-flops 71A to which the clock pulses CKP and phase data Data are supplied; a 0-π inversion section 70RA to which data output from the shift register section 70SA and signal Word(W2) for writing of data into subsequent-stage memory section 70MA and for inversion of data are supplied; and the memory section 70MA which holds the phase data supplied from the 0-π inversion section 70RA. The phase data held in the memory section 70MA is output (or read out) to the terminals 75A to 75C in synchronism with a readout signal Word(W2). The signal Word(W2) is a signal having two states, e.g., a low level to maintain the phase and a high level to invert the phase.

The 0-π inversion section 70RA has FETs 74A and 74B to which the respective data and inverted data output from the flip-flops 71A are supplied, the signal Word(W2) is supplied to gates of the FETs 74A and to input-inverting gates of the FETs 74B, and data at connected output parts of the FETs 74A and 74B are supplied to the memory section 70MA. The memory section 70MA is provided with three sets of two ring-coupled inverters 73A, 73B to which the data from the 0-π inversion section 70RA are supplied, and is provided with FETs 72, and the FETs 72 output (read out) data at interconnections of the inverters 73A, 73B to the terminals 75A to 75C in synchronism with the readout signal Word(R2). The other configuration is the same as in the first modification example. This modulation control unit 48B can readily achieve the periodic inversion of the phase distributions in the array of mirror elements 30 in the spatial light modulator 28 as the modulation control unit 48A can, though the 0-π inversion section 70RA and the memory section 70MA are interchanged.

Figure 3B:
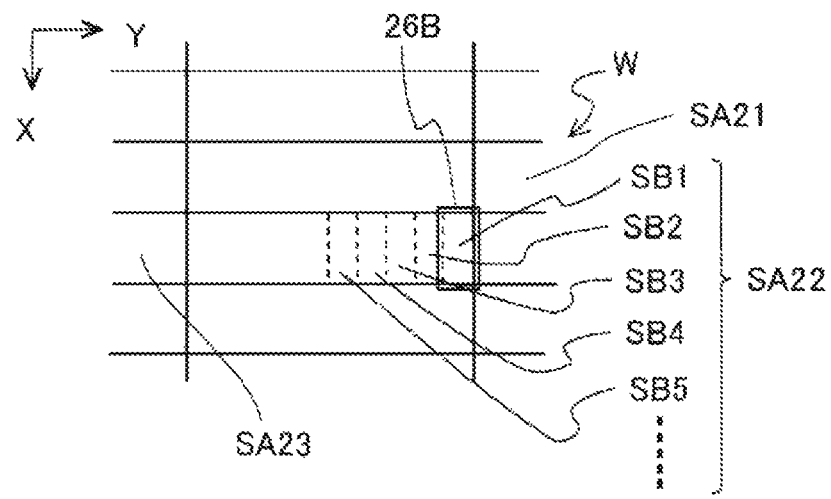

Next, the foregoing embodiment involves the scanning exposure of the wafer W with continuous movement of the wafer W. Besides it, the exposure may be carried out as follows: as shown in FIG. 3B, each of partial regions constituting each shot area (e.g., SA22) on the wafer W is divided into a plurality of sub-regions SB1 to SB5 or the like in the Y-direction; when the sub-region SB1 or the like comes in the exposure region 26B of the projection optical system PL, the array of mirror elements 30 in the spatial light modulator 28 is set in the first phase distribution (the phase distribution 50A or the like) and exposures are executed as many as a predetermined number of pulses; then the array of mirror elements 30 is set in the second phase distribution (the phase distribution 50B or the like) and exposures are executed as many as the predetermined number of pulses, so as to expose the sub-region SB1 or the like. In this case, the exposure region (first region) of the first phase distribution is the same as the exposure region (second region) of the second phase distribution.

After this, the wafer W is stepwise moved in the Y-direction and when the next sub-region SB2 or the like reaches the exposure region 26B, the exposure is carried out in the same manner in the sub-region SB2 or the like. This method is substantially the step-and-repeat method, but the sub-regions SB1 to SB5 or the like are exposed with mutually different patterns. In this case, overlay exposure is implemented in joint portions between the sub-regions.

Figure 26:
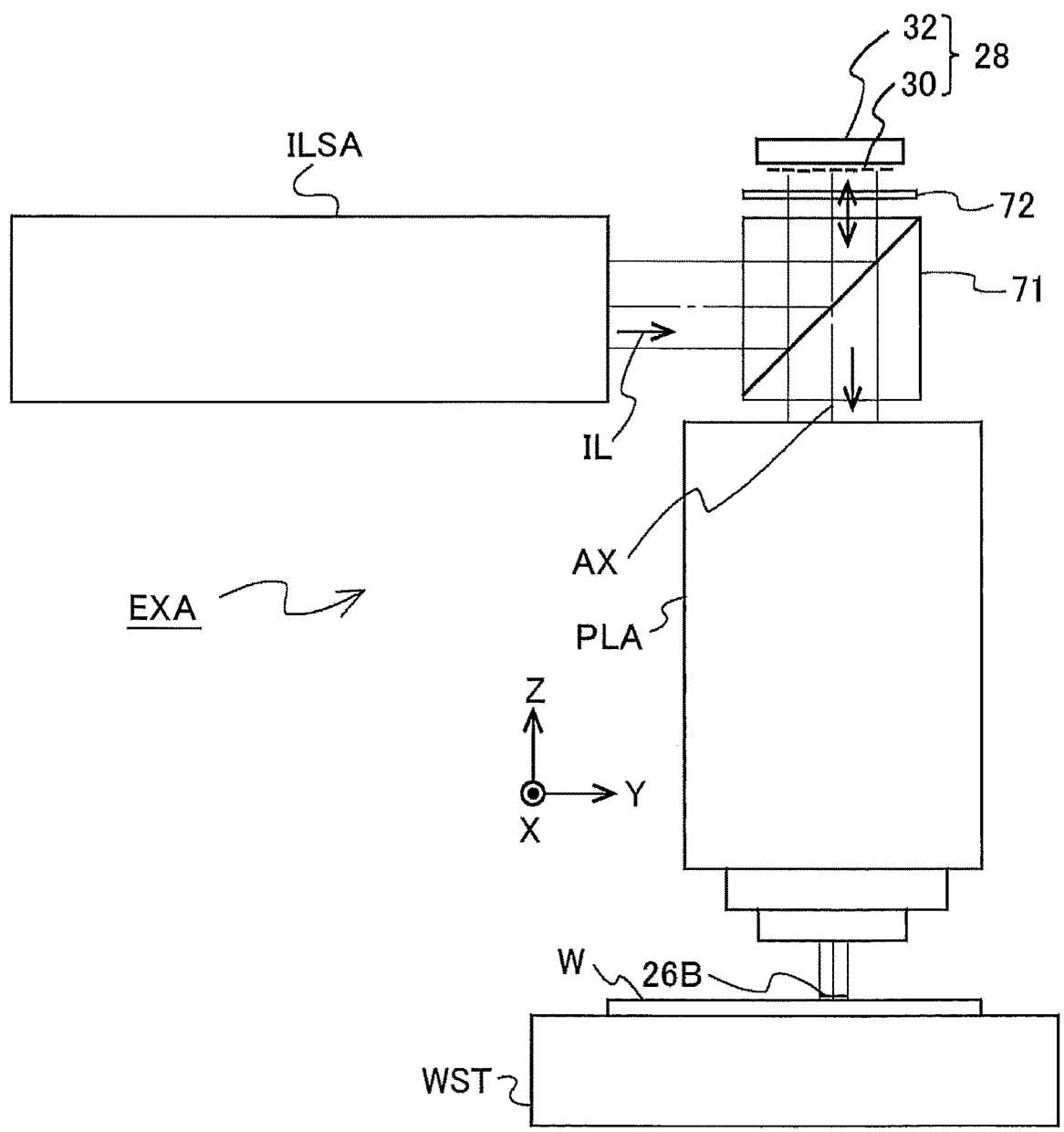
FIG. 26 is a drawing showing a schematic configuration of an exposure apparatus of a modification example.

Next, the above embodiment uses the projection optical system PL non-telecentric on the object side. Besides it, it is also possible to use a projection optical system PLA bi-telecentric on the object side and on the image side, as in an exposure apparatus EXA in a modification example in FIG. 26. In FIG. 26, the exposure apparatus EXA is provided with an illumination optical system ILSA which emits s-polarized illumination light IL approximately in the +Y-direction, a polarization beam splitter 71 which reflects the illumination light IL into the +Z-direction, a quarter wave plate 72 which converts the illumination light IL from the polarization beam splitter 71 into circularly polarized light, the spatial light modulator 28 with the two-dimensional array of many mirror elements 30 for reflecting the circularly polarized illumination light IL into the −Z-direction, and the projection optical system PLA which receives the illumination light IL transmitted by the quarter wave plate 72 and the polarization beam splitter 71 after reflected by the mirror elements 30 and which projects a spatial image (pattern) onto the exposure region 26B on the surface of the wafer W. The illumination optical system ILSA is an optical system obtained by excluding the mirrors 8B, 8C from the illumination optical system ILS in FIG. 1. The configuration and action of the spatial light modulator 28 are the same as those in the embodiment in FIG. 1 and the modification examples thereof.

In this modification example, however, the illumination light IL is incident approximately at the angle of incidence of 0 to the mirror elements 30 in the spatial light modulator 28. For this reason, in the case of small σ illumination, the reflected light from the mirror elements 30 is incident into the projection optical system PLA nearly in parallel with the optical axis AX of the projection optical system PLA. Since this exposure apparatus EXA of the second modification example can use the bi-telecentric projection optical system PLA, the configuration of the exposure apparatus can be simplified.

If the efficiency of utilization of the illumination light IL is allowed to decrease to half, an ordinary beam splitter may be used instead of the polarization beam splitter 71, without use of the quarter wave plate 72. In this case, polarized illumination is available.

It is also possible to use a rod type integrator as an internal reflection type optical integrator, in place of the microlens array 16 which is the wavefront division type integrator in FIG. 1.

The aforementioned embodiment and modification examples used the spatial light modulator to dynamically change the phase of light passing the optical elements, but it is also possible to use the spatial light modulator to provide a fixed phase difference to the light passing the optical elements. The spatial light modulator of this kind is, for example, disclosed in U.S. Pat. No. 7,512,926. The spatial light modulator disclosed therein is of the transmission type, but it may be modified into the reflection type.

In this case, two spatial light modulators are prepared, a first spatial light modulator (first mask) in which the phases of optical elements in the spatial light modulator are in the first phase distribution and a second spatial light modulator (second mask) in which the phases of optical elements in the spatial light modulator are in the second phase distribution as an inversion of the first phase distribution, and the wafer (substrate) is doubly exposed with the first mask and the second mask.

In other words, this exposure method is to expose at least a partial region on a substrate with the exposure light via the first spatial light modulator with the array of optical elements and via the projection optical system and to expose at least the partial region on the substrate with the exposure light via the second spatial light modulator with the array of optical elements and via the projection optical system. In this method, the arrangement of the optical elements in the first state for letting incident light pass as light with the same phase as that of the incident light or with a phase different by the first phase from that of the incident light and the optical elements in the second state for letting incident light pass as light with a phase different by the second phase different about 180° from the first phase is set to the first arrangement in the first region which is at least a part of the array of optical elements in the first spatial light modulator. In the second region which is at least a part of the array of optical elements in the second spatial light modulator, corresponding to the first region, the arrangement of the optical elements in the first state for letting incident light pass as light with the same phase as that of the incident light or with a phase different by the first phase from that of the incident light and the optical elements in the second state for letting incident light pass as light with a phase different by the second phase different about 180° from the first phase is set to the second arrangement. At this time, the arrangement of the optical elements in the first state in the first arrangement corresponds to the arrangement of the optical elements in the second state in the second arrangement, and the arrangement of the optical elements in the second state in the first arrangement corresponds to the arrangement of the optical elements in the first state in the second arrangement.

This exposure method can alleviate adverse influence caused by systematic phase error, if present, which is, for example, due to errors of etching amounts of mask substrate glass in manufacture of the first mask and the second mask. If there is light passing between the optical elements, adverse influence thereof can also be alleviated.

Figure 27:
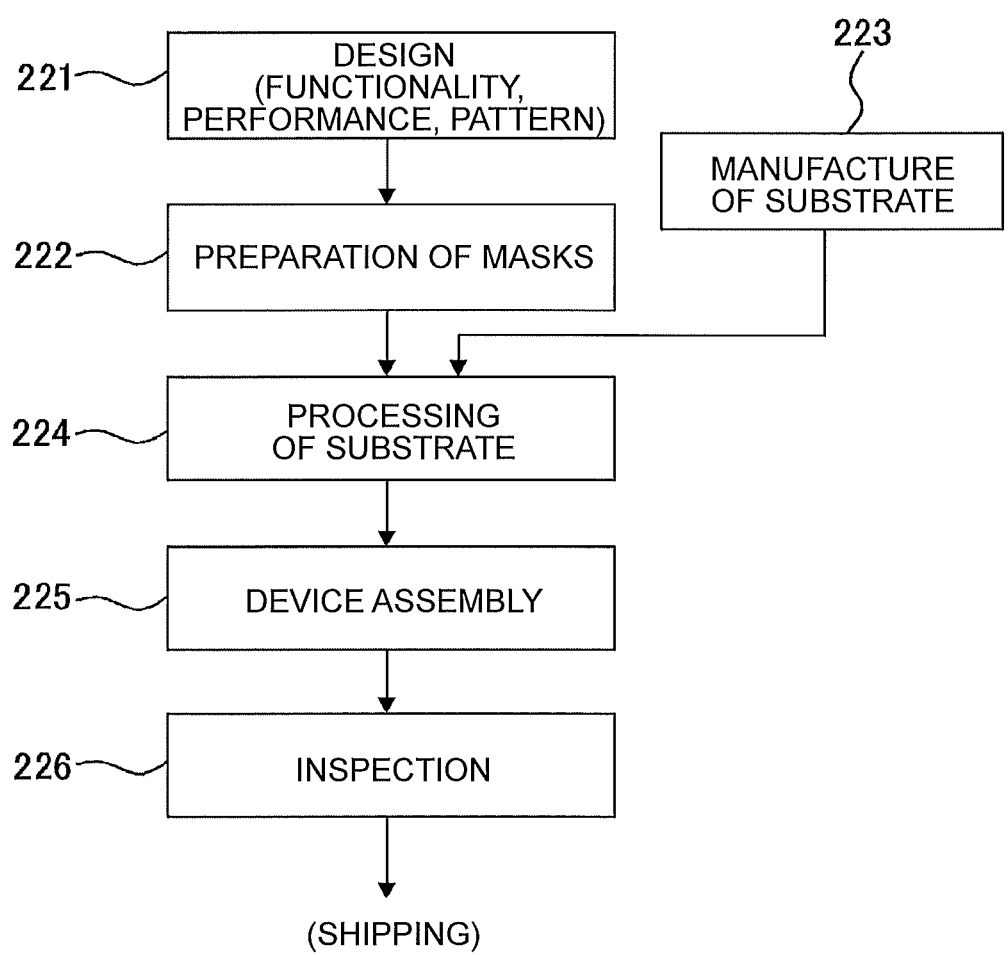
FIG. 27 is a flowchart showing an example of steps of manufacturing electronic devices.

In manufacture of electronic devices (or microdevices), the electronic devices are manufactured, as shown in FIG. 27, through a step 221 of performing design of functionality and performance of the electronic devices, a step 222 of storing pattern data of masks based on this design step, into the main control system of the exposure apparatus EX in the embodiment, a step 223 of producing a substrate (wafer) as a base material of the devices and coat the substrate with a resist, a substrate processing step 224 including a step of exposing the substrate (photosensitive substrate) with the spatial images of the phase distributions generated in the spatial light modulator 28 by the aforementioned exposure apparatus EX (or the exposure method), a step of developing the exposed substrate, and heating (curing) and etching steps of the developed substrate, a device assembly step (including processing steps such as a dicing step, a bonding step, a packaging step, and so on) 225, an inspection step 226, and so on.

This device manufacturing method includes the step of exposing the wafer W with the use of the exposure apparatus (or the exposure method) of the above embodiment, and the step of processing the exposed wafer W (step 224). Therefore, the electronic devices can be manufactured with high accuracy.

The present invention is not limited to the application to semiconductor device manufacturing processes, but the present invention is also widely applicable, for example, to manufacturing processes of liquid crystal display devices, plasma displays, and so on and to manufacturing processes of various devices (electronic devices) such as imaging devices (CMOS type, CCD, etc.), micromachines, MEMS (Microelectromechanical Systems), thin film magnetic heads, and DNA chips.

The present invention is not limited to the above embodiments, but can be realized in various configurations within the scope not departing from the spirit and scope of the present invention. The disclosures in the foregoing Publications, International Publication, U.S. Patent, or U.S. Pat. Published Application cited in the present specification are incorporated as part of the description of the present specification. The entire disclosure of Japanese Patent Application No. 2010-277530 filed on Dec. 13, 2010, including the specification, the scope of claims, the drawings, and the abstract, is incorporated herein by reference in its entirety.

REFERENCE SIGNS LIST

EX exposure apparatus; ILS illumination optical system; PL projection optical system; W wafer; 28 spatial light modulator; 30 mirror elements; 40 main control system; 48 modulation control unit; 50A, 53A phase distribution; 50B, 53B inverted phase distribution; 60A, 60B flip-flops; 62A, 62B selection circuits.

What is claimed is:

1. A mirror array device comprising:
   a plurality of mirrors, each of which is displaceable;
   a first driver configured to apply a first driving force or a second driving force on a first support portion supporting a first mirror among the plurality of mirrors, the first driving force being a force which displaces the first mirror in a first direction, the second driving force being a force which displaces the first mirror in a second direction which is different from the first direction;
   a second driver configured to apply a third driving force or a fourth driving force on a second support portion supporting a second mirror among the plurality of mirrors which is different from the first mirror, the third driving force being a force which displaces the second mirror in the first direction, the fourth driving force being a force which displaces the second mirror in the second direction;
   a first transmitter configured to transmit a first drive signal to cause the first driver to generate the first driving force;
   a signal changer configured to change the first drive signal into a second drive signal; and
   a second transmitter configured to transmit the second drive signal from the signal changer to the second driver.

2. The mirror array device according to claim 1, further comprising a base member; wherein
   the first driver comprises a first electrode provided in the first support portion or the base member, and
   the second driver comprises a second electrode provided in the second support portion or the base member.

3. The mirror array device according to claim 2, wherein
   a first voltage is applied to the first electrode in response to the first drive signal, and
   a second voltage is applied to the second electrode in response to the second drive signal.

4. The mirror array device according to claim 1, further comprising:
   a third driver configured to apply a fifth driving force or a sixth driving force on a third support portion supporting a third mirror among the plurality of mirrors which is different from the first mirror and the second mirror, the fifth driving force being a force which displaces the third mirror in the first direction, the sixth driving force being a force which displaces the third mirror in the second direction;
   a second signal changer configured to change the second drive signal from the second driver into the first drive signal; and
   a third transmitter configured to transmit the first drive signal from the second signal changer to the third driver.

5. The mirror array device according to claim 4, further comprising a base member; wherein
   the first driver comprises a first electrode provided in the first support portion or the base member,
   the second driver comprises a second electrode provided in the second support portion or the base member, and
   the third driver comprises a third electrode provided in the third support portion or the base member.

6. The mirror array device according to claim 5, wherein
   a first voltage is applied to the first electrode in response to the first drive signal,
   a second voltage is applied to the second electrode in response to the second drive signal, and
   a third voltage is applied to the third electrode in response to the third drive signal.

7. The mirror array device according to claim 4, wherein the first mirror and the second mirror are adjacent to each other.

8. The mirror array device according to claim 7, wherein the second mirror is arranged between the first mirror and the third mirror.

9. The mirror array device according to claim 1, wherein the first mirror and the second mirror are adjacent to each other.

10. An exposure apparatus for exposing a workpiece with exposure light, comprising:
    the mirror array device according to claim 1;
    an illumination system for illuminating the mirror array device with the exposure light; and
    a projection system for projecting the illumination light travelling via the mirror array device onto the workpiece.

11. The exposure apparatus according to claim 10, further comprising a stage configured to move the workpiece along a scan direction, wherein the second mirror of the mirror array device is arranged on a side in the scan direction with respect to the first mirror.

12. A device manufacturing method comprising:
exposing a workpiece using the exposure apparatus according to claim 10; and
processing the exposed workpiece.

\* \* \* \* \*